US012615781B2

(12) United States Patent
Lee et al.

(10) Patent No.: US 12,615,781 B2
(45) Date of Patent: Apr. 28, 2026

(54) SEMICONDUCTOR DEVICE AND ELECTRONIC SYSTEM THE SAME

(71) Applicant: Samsung Electronics Co., Ltd., Suwon-si (KR)

(72) Inventors: Dongjin Lee, Daejeon (KR); Junhee Lim, Seoul (KR); Hakseon Kim, Seoul (KR); Nakjin Son, Suwon-si (KR); Jeongeun Kim, Hwaseong-si (KR); Juseong Min, Seoul (KR); Changheon Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 629 days.

(21) Appl. No.: 17/724,002

(22) Filed: Apr. 19, 2022

(65) Prior Publication Data

US 2022/0406808 A1 Dec. 22, 2022

(30) Foreign Application Priority Data

Jun. 18, 2021 (KR) ........................ 10-2021-0079251

(51) Int. Cl.
| | |
|---|---|
| *H10B 43/40* | (2023.01) |
| *H10B 41/27* | (2023.01) |
| *H10B 41/41* | (2023.01) |
| *H10B 43/27* | (2023.01) |

(52) U.S. Cl.
CPC ............. *H10B 43/40* (2023.02); *H10B 41/27* (2023.02); *H10B 41/41* (2023.02); *H10B 43/27* (2023.02)

(58) Field of Classification Search
CPC ........ H10B 43/20; H10B 43/27; H10B 43/40;

H10B 43/50; H10B 41/20; H10B 41/27; H10B 41/40; H10B 41/41; H10B 41/50; H01L 25/065; H01L 25/0657
USPC ........................................................ 257/314
See application file for complete search history.

(56) References Cited

U.S. PATENT DOCUMENTS

| | | | |
|---|---|---|---|
| 6,693,325 | B1 | 2/2004 | Ko et al. |
| 6,884,682 | B2 | 4/2005 | Lee |
| 7,118,963 | B2 | 10/2006 | Mori |
| 7,148,117 | B2 | 12/2006 | Seo |

(Continued)

FOREIGN PATENT DOCUMENTS

| | | |
|---|---|---|
| KR | 10-0235971 B1 | 12/1999 |
| KR | 10-2005-0002046 A | 1/2005 |

(Continued)

*Primary Examiner* — Ajay Ojha
(74) *Attorney, Agent, or Firm* — Harness, Dickey & Pierce, P.L.C.

(57) ABSTRACT

A semiconductor device includes a lower level layer including a peripheral circuit; and an upper level layer provided on the lower level layer, the upper level layer including a vertically-extended memory cell string, wherein the lower level layer includes a first substrate; a device isolation layer defining a first active region of the first substrate; and a first gate structure including a first gate insulating pattern, a first conductive pattern, a first metal pattern, and a first capping pattern, which are sequentially stacked on the first active region, wherein the first conductive pattern comprises a doped semiconductor material, and the device isolation layer covers a first side surface of the first conductive pattern, and the first metal pattern includes a first body portion on the first conductive pattern.

20 Claims, 42 Drawing Sheets

(56)                    References Cited

U.S. PATENT DOCUMENTS

| | | | |
|---|---|---|---|
| 7,211,484 B2 | 5/2007 | Lee et al. | |
| 7,482,223 B2 | 1/2009 | Higashitani et al. | |
| 7,598,572 B2 | 10/2009 | Dyer et al. | |
| 2004/0004265 A1 | 1/2004 | Lee et al. | |
| 2008/0081415 A1 | 4/2008 | Lee | |
| 2020/0144277 A1* | 5/2020 | Lee ....................... | H10B 41/27 |
| 2022/0149060 A1 | 5/2022 | Sim et al. | |

FOREIGN PATENT DOCUMENTS

| | | |
|---|---|---|
| KR | 10-0467019 B1 | 1/2005 |
| KR | 10-2020-0072638 A | 6/2020 |

\* cited by examiner

MASP
MOL
MAL
CPL
GIL
SUB

II                                                                    II'

LVR

SEMICONDUCTOR DEVICE AND ELECTRONIC SYSTEM THE SAME

CROSS-REFERENCE TO RELATED APPLICATIONS

This U.S. non-provisional patent application claims priority under 35 U.S.C. § 119 to Korean Patent Application No. 10-2021-0079251, filed on Jun. 18, 2021, in the Korean Intellectual Property Office, the entire contents of which are hereby incorporated by reference.

BACKGROUND

1. Field

The present disclosure relates to a three-dimensional semiconductor memory device and an electronic system including the same.

2. Related Art

A semiconductor device capable of storing a large amount of data is desirable as a part of an electronic system. Accordingly, research is being conducted to increase a data storing capacity of the semiconductor device. For example, semiconductor devices having three-dimensionally arranged memory cells, instead of two-dimensionally arranged memory cells, are being suggested.

SUMMARY

At least one example embodiment of the inventive concepts provides a three-dimensional semiconductor memory device with improved electric and reliability characteristics.

At least one example embodiment of the inventive concepts provides a method of fabricating a three-dimensional semiconductor memory device with improved electric and reliability characteristics.

According to at least some example embodiments, a semiconductor device includes a lower level layer including a peripheral circuit; and an upper level layer provided on the lower level layer, the upper level layer including a vertically-extended memory cell string, wherein the lower level layer includes a first substrate; a device isolation layer defining a first active region of the first substrate; and a first gate structure including a first gate insulating pattern, a first conductive pattern, a first metal pattern, and a first capping pattern, which are sequentially stacked on the first active region, wherein the first conductive pattern comprises a doped semiconductor material, wherein the device isolation layer covers a first side surface of the first conductive pattern, wherein the first metal pattern includes a first body portion on the first conductive pattern; and a first side portion on the device isolation layer covering the first side surface, and wherein the first side portion is spaced apart from the first side surface of the first conductive pattern with the device isolation layer interposed therebetween.

According to at least some example embodiments, a semiconductor device includes a lower level layer including a peripheral circuit; and an upper level layer provided on the lower level layer, the upper level layer including a three-dimensional NAND flash memory cell structure, wherein the lower level layer includes a substrate including an active region; a gate insulating pattern on the active region; a semiconductor pattern on the gate insulating pattern; a metal pattern on the semiconductor pattern; and a device isolation layer covering a first side surface of the semiconductor pattern, a second side surface of the gate insulating pattern, and a third side surface of the active region and aligning the first to third side surfaces to each other, wherein a level of the highest point of a top surface of the device isolation layer is equal to or higher than a level of a top surface of the semiconductor pattern, and wherein the metal pattern includes a side portion which is provided on and vertically overlapped with the device isolation layer.

According to at least some example embodiments, an electronic system includes a semiconductor device including an input/output pad electrically connected to peripheral circuits; and a controller electrically connected to the semiconductor device through the input/output pad and configured to control the semiconductor device, wherein the semiconductor device includes a lower level layer including the peripheral circuits; and an upper level layer provided on the lower level layer, the upper level layer including a three-dimensional NAND flash memory cell structure, wherein the lower level layer includes a substrate; a device isolation layer defining a first active region and a second active region of the substrate; a first peripheral transistor and a second peripheral transistor provided on the first active region and the second active region, respectively; and interconnection lines provided on and electrically connected to the first and second peripheral transistors, wherein the first peripheral transistor includes a first gate insulating pattern, a first semiconductor pattern, and a first metal pattern, which are sequentially stacked on the first active region, wherein the second peripheral transistor includes a second gate insulating pattern, a second semiconductor pattern, and a second metal pattern, which are sequentially stacked on the second active region, wherein a thickness of the second gate insulating pattern is larger than a thickness of the first gate insulating pattern, wherein the first metal pattern is spaced apart from the device isolation layer, wherein the second metal pattern comprises a side portion that is in contact with a top surface of the device isolation layer, and wherein the side portion is spaced apart from the second semiconductor pattern with the device isolation layer interposed therebetween.

According to at least some example embodiments, a method of fabricating a semiconductor device includes sequentially forming a gate insulating layer, a semiconductor layer, and a mask layer on a substrate; patterning the mask layer, the semiconductor layer, the gate insulating layer, and the substrate to form a trench defining an active region of the substrate; forming an insulating layer on the substrate to fill the trench; performing a planarization process on the insulating layer to expose the mask layer and to form a device isolation layer filling the trench, a top surface of the device isolation layer being located at a level that is equal to or higher than a top surface of the semiconductor layer; selectively removing the mask layer; sequentially forming a metal layer and a capping layer on the semiconductor layer; and patterning the capping layer, the metal layer, the semiconductor layer, and the gate insulating layer to form a gate structure on the active region.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

FIGS. 3 and 4 are cross-sectional views schematically illustrating semiconductor packages according to at least one example embodiment of the inventive concepts.

FIG. 5 is a plan view illustrating a semiconductor device according to at least one example embodiment of the inventive concepts.

FIG. 7B is an enlarged cross-sectional view illustrating a portion 'M' of FIG. 6A and illustrating a second gate structure according to at least one example embodiment of the inventive concepts.

FIG. 8 is an enlarged cross-sectional view illustrating the portion 'M' of FIG. 6A and illustrating a second gate structure according to a comparative example.

FIGS. 23 to 25 are enlarged cross-sectional views, each of which illustrates the portion 'M' of FIG. 6A and illustrates a semiconductor device according to at least one example embodiment of the inventive concepts.

DETAILED DESCRIPTION

Figure 1:
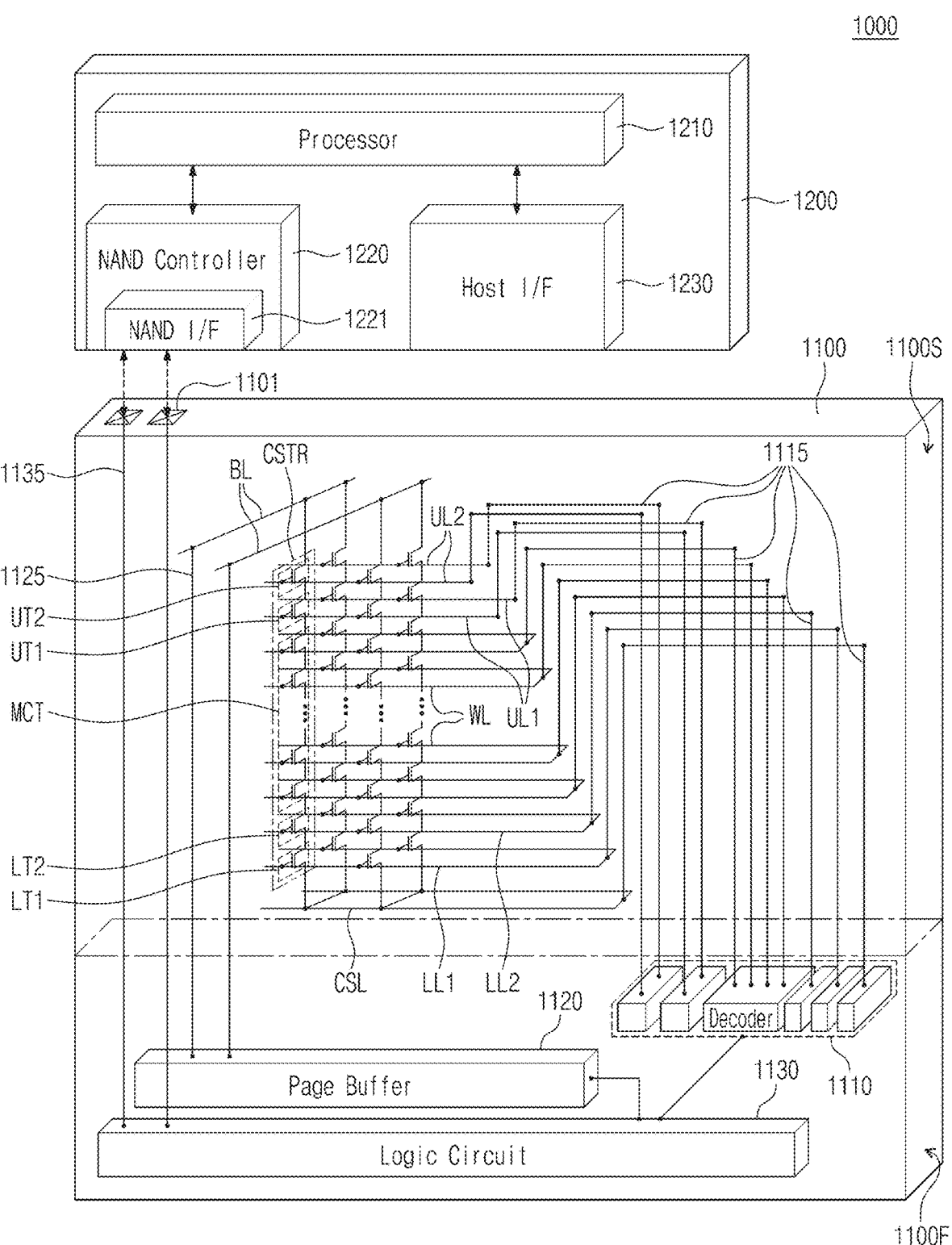
FIG. 1 is a diagram schematically illustrating an electronic system including a semiconductor device, according to at least one example embodiment of the inventive concepts.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software.

Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

FIG. 1 is a diagram schematically illustrating an electronic system including a semiconductor device, according to at least one example embodiment of the inventive concepts.

Referring to FIG. 1, an first electronic system 1000 according to at least one example embodiment of the inventive concepts may include a semiconductor device 1100 and a controller 1200 electrically connected to the semiconductor device 1100. The first electronic system 1000 may be a storage device including one or more semiconductor devices 1100 or an electronic device including the storage device. For example, the first electronic system 1000 may be a solid state drive (SSD) device, a universal serial bus (USB), a computing system, a medical system, and/or a communication system, in which at least one semiconductor device 1100 is provided.

The semiconductor device 1100 may be a nonvolatile memory device (e.g., a NAND flash memory device). The semiconductor device 1100 may include a first structure 1100F and a second structure 1100S on the first structure 1100F. In an embodiment, the first structure 1100F may be disposed beside the second structure 1100S. The first structure 1100F may be a peripheral circuit structure including a decoder circuit 1110, a page buffer 1120, and a logic circuit 1130. The second structure 1100S may be a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, the memory cell strings CSTR may be provided to form a three-dimensional memory cell structure. Each of the memory cell strings CSTR may be vertically extended. Each of the memory cell strings CSTR may include lower transistors LT1 and LT2, which are adjacent to the common source line CSL, upper transistors UT1 and UT2, which are adjacent to the bit line BL, and a plurality of memory cell transistors MCT, which are disposed between the lower transistors LT1 and LT2 and the upper transistors UT1 and UT2. The number of the lower transistors LT1 and LT2 and the number of the upper transistors UT1 and UT2 may be variously changed, according to embodiments.

In an embodiment, the upper transistors UT1 and UT2 may include at least one string selection transistor, and the lower transistors LT1 and LT2 may include at least one ground selection transistor. The gate lower lines LL1 and LL2 may be respectively used as gate electrodes of the lower transistors LT1 and LT2. The word lines WL may be respectively used as gate electrodes of the memory cell transistors MCT, and the gate upper lines UL1 and UL2 may be respectively used as gate electrodes of the upper transistors UT1 and UT2.

In an embodiment, the lower transistors LT1 and LT2 may include a lower erase control transistor LT1 and a ground selection transistor LT2, which are connected in series. The upper transistors UT1 and UT2 may include a string selection transistor UT1 and an upper erase control transistor UT2, which are connected in series. At least one of the lower and upper erase control transistors LT1 and UT2 may be used for an erase operation of erasing data, which are stored in the memory cell transistors MCT, using a gate-induced drain leakage (GIDL) phenomenon.

The common source line CSL, the first and second gate lower lines LL1 and LL2, the word lines WL, and the first and second gate upper lines UL1 and UL2 may be electrically connected to the decoder circuit 1110 through first connection lines 1115, which are extended from the first structure 1100F into the second structure 1100S. The bit lines BL may be electrically connected to the page buffer 1120 through second connection lines 1125, which are extended from the first structure 1100F into the second structure 1100S.

In the first structure 1100F, the decoder circuit 1110 and the page buffer 1120 may be configured to perform a control operation on at least selected one of the memory cell transistors MCT. The decoder circuit 1110 and the page buffer 1120 may be controlled by the logic circuit 1130. The semiconductor device 1100 may communicate with the controller 1200 through an input/output pad 1101, which is electrically connected to the logic circuit 1130. The input/output pad 1101 may be electrically connected to the logic circuit 1130 through an input/output connection line 1135, which is extended from the first structure 1100F to the second structure 1100S.

The controller 1200 may include a processor 1210, a NAND controller 1220, and a host interface 1230. In an embodiment, the first electronic system 1000 may include a plurality of the semiconductor devices 1100, and in this case, the controller 1200 may be used to control the semiconductor devices 1100.

The processor 1210 may control overall operations of the first electronic system 1000 including the controller 1200. The processor 1210 may be operated based on a specific firmware and may control the NAND controller 1220 to access the semiconductor device 1100. The NAND controller 1220 may include a NAND interface 1221, which is used to communicate with the semiconductor device 1100. The NAND interface 1221 may be configured to transmit and receive control commands, which are used to control the semiconductor device 1100, and to transmit and receive data, which are written in or read from the memory cell transistors MCT of the semiconductor device 1100. The host interface 1230 may be configured to allow for communication between the first electronic system 1000 and an external host. When a control command is transmitted from the external host through the host interface 1230, the processor 1210 may control the semiconductor device 1100 in response to the control command.

Figure 2:
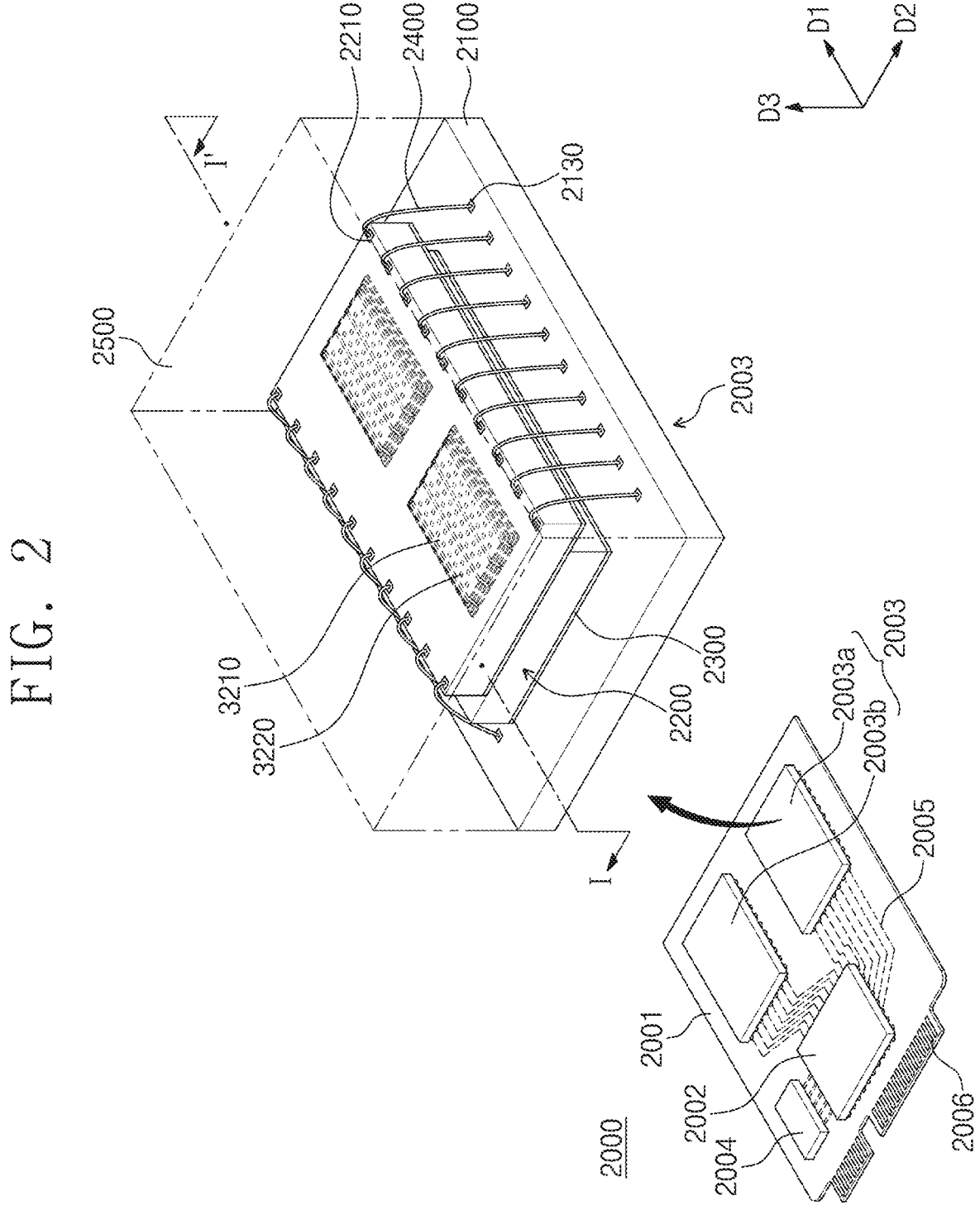
FIG. 2 is a perspective view schematically illustrating an electronic system including a semiconductor device, according to at least one example embodiment of the inventive concepts.

FIG. 2 is a perspective view schematically illustrating an electronic system including a semiconductor device, according to at least one example embodiment of the inventive concepts.

Referring to FIG. 2, an second electronic system 2000 according to at least one example embodiment of the inventive concepts may include a main substrate 2001 and a controller 2002, at least one semiconductor package 2003, and a DRAM 2004, which are mounted on the main substrate 2001. The semiconductor package 2003 and the DRAM 2004 may be connected to the controller 2002 by interconnection patterns 2005, which are formed in the main substrate 2001.

The main substrate 2001 may include a connector 2006, which includes a plurality of pins coupled to an external host. In the connector 2006, the number and arrangement of the pins may depend on a communication interface between the second electronic system 2000 and the external host. In an embodiment, the second electronic system 2000 may communicate with the external host, in accordance with one of interfaces, such as universal serial bus (USB), peripheral component interconnect express (PCI-Express), serial advanced technology attachment (SATA), universal flash storage (UFS) M-Phy, and/or the like. In an embodiment, the second electronic system 2000 may be driven by a power, which is supplied from the external host through the connector 2006. The second electronic system 2000 may further include a power management integrated circuit (PMIC), which is used to distribute a power supplied from the external host to the controller 2002 and the semiconductor package 2003.

The controller 2002 may be configured to control a writing or reading operation on the semiconductor package 2003 and to improve an operation speed of the second electronic system 2000.

The DRAM 2004 may be a buffer memory, which relieves technical difficulties caused by a difference in speed between the semiconductor package 2003, which serves as a data storage device, and an external host. In an embodiment, the DRAM 2004 in the second electronic system 2000 may serve as a cache memory and may provide a storage space to temporarily store data during a control operation on the semiconductor package 2003. In the case where the second electronic system 2000 includes the DRAM 2004, the controller 2002 may further include a DRAM controller for controlling the DRAM 2004, in addition to a NAND controller for controlling the semiconductor package 2003.

The semiconductor package 2003 may include first and second semiconductor packages 2003a and 2003b, which are spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the semiconductor chips 2200 on the package substrate 2100, adhesive layers 2300 disposed on respective bottom surfaces of the semiconductor chips 2200, a connection structure 2400 electrically connecting the semiconductor chips 2200 to the package substrate 2100, and a molding layer 2500 disposed on the package substrate 2100 to cover the semiconductor chips 2200 and the connection structure 2400.

The package substrate 2100 may be a printed circuit board including package upper pads 2130. Each of the semiconductor chips 2200 may include an input/output pad 2210. The input/output pad 2210 may correspond to the input/output pad 1101 of FIG. 1. Each of the semiconductor chips 2200 may include gate stacks 3210 and vertical channel structures 3220. Each of the semiconductor chips 2200 may include a semiconductor device, which will be described below, according to at least one example embodiment of the inventive concepts.

In an embodiment, the connection structure 2400 may be a bonding wire, which is provided to electrically connect the input/output pad 2210 to the package upper pads 2130. Thus, in each of the first and second semiconductor packages 2003a and 2003b, the semiconductor chips 2200 may be electrically connected to each other in a bonding wire manner and may be electrically connected to the package upper pads 2130 of the package substrate 2100. In other embodiments, the semiconductor chips 2200 in each of the first and second semiconductor packages 2003a and 2003b may be electrically connected to each other by a connection structure including through silicon vias (TSVs), not by the connection structure 2400 provided in the form of bonding wires.

In an embodiment, the controller 2002 and the semiconductor chips 2200 may be included in a single package. In an embodiment, the controller 2002 and the semiconductor chips 2200 may be mounted on a separate interposer substrate, which is prepared regardless of the main substrate 2001, and may be connected to each other through interconnection lines, which are provided in the interposer substrate.

The first electronic system 1000 of FIG. 1, the second electronic system 2000, and/or elements thereof (e.g., the controller 1200, the semiconductor device 1100, the controller 2002, the DRAM 2004, etc.), may be, or include, processing circuitry such as hardware including logic circuits; a hardware/software combination executing software; or a combination thereof. For example, the processing circuitry more specifically may include, but is not limited to, one or more of a central processing unit (CPU), a processor core, an arithmetic logic unit (ALU), a digital signal processor, a microcomputer, a field programmable gate array (FPGA), a programmable logic unit, a microprocessor, an application-specific integrated circuit (ASIC), etc.

Figure 3:
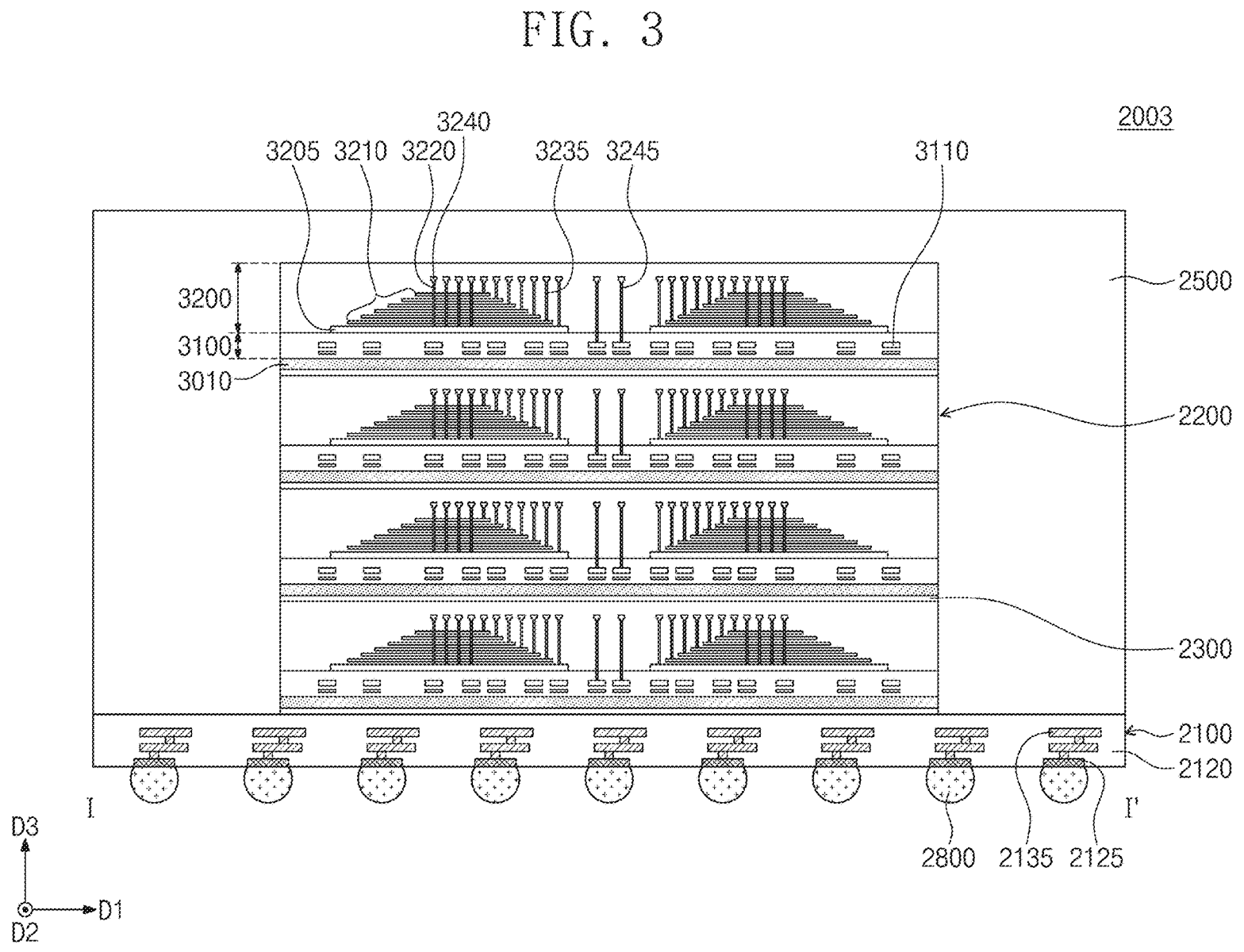
Figure 4:
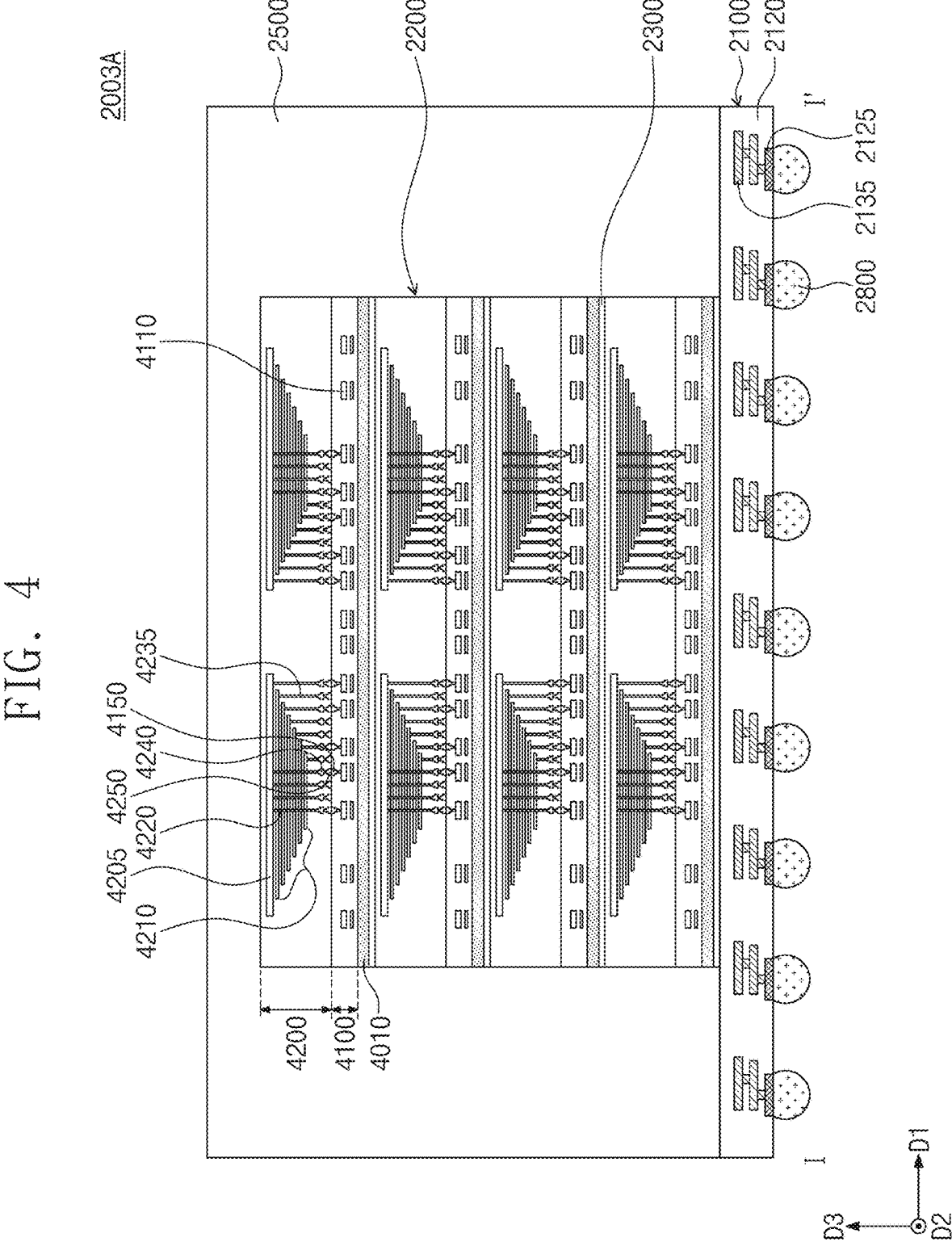

FIGS. 3 and 4 are cross-sectional views schematically illustrating semiconductor packages according to at least one example embodiment of the inventive concepts. FIGS. 3 and 4 are cross-sectional views, which are taken along a line I-I' of FIG. 2, and illustrate two different examples of the semiconductor package of FIG. 2.

Referring to FIG. 3, in the semiconductor package 2003, the package substrate 2100 may be a printed circuit board. The package substrate 2100 may include a package substrate body portion 2120, the package upper pads 2130 (e.g., of FIG. 2), which are disposed on a top surface of the package substrate body portion 2120, lower pads 2125, which are disposed on or exposed through a bottom surface of the package substrate body portion 2120, and internal lines 2135, which are provided in the package substrate body portion 2120 to electrically connect the package upper pads 2130 to the lower pads 2125. The package upper pads 2130 may be electrically connected to the connection structures 2400. As shown in FIG. 2, the lower pads 2125 may be connected to the interconnection patterns 2005, which are provided in the main substrate 2001 of the second electronic system 2000, through conductive connecting portions 2800.

Each of the semiconductor chips 2200 may include a semiconductor substrate 3010 and a first structure 3100 and a second structure 3200, which are sequentially stacked on the semiconductor substrate 3010. The first structure 3100 may include a peripheral circuit region, in which peripheral lines 3110 are provided. The second structure 3200 may include a source structure 3205, a stack 3210 on the source structure 3205, the vertical channel structures 3220 penetrating the stack 3210, bit lines 3240 electrically connected to the vertical channel structures 3220, and cell contact plugs 3235 electrically connected to the word lines WL (e.g., see FIG. 1) of the stack 3210.

Each of the semiconductor chips 2200 may include penetration lines 3245, which are electrically connected to the peripheral lines 3110 of the first structure 3100 and are extended into the second structure 3200. The penetration line 3245 may be disposed outside the stack 3210, and in an embodiment, the penetration line 3245 may be provided to further penetrate the stack 3210. Each of the semiconductor chips 2200 may further include the input/output pad 2210 (e.g., see FIG. 2), which are electrically connected to the peripheral lines 3110 of the first structure 3100.

Referring to FIG. 4, in the semiconductor package 2003A, each of the semiconductor chips 2200a may include a semiconductor substrate 4010, a first structure 4100 on the semiconductor substrate 4010, and a second structure 4200, which is provided on the first structure 4100 and is bonded with the first structure 4100 in a wafer bonding manner.

The first structure 4100 may include a peripheral circuit region, in which a peripheral line 4110 and first junction structures 4150 are provided. The second structure 4200 may include a source structure 4205, a stack 4210 between the source structure 4205 and the first structure 4100, vertical channel structures 4220 penetrating the stack 4210, bit lines 4240 electrically connected to the vertical channel structures 4220, and cell contact plugs 4235 electrically connected to the word lines WL (e.g., see FIG. 1) of the stack 4210.

The bit lines 4240 and the cell contact plugs 4235 may be electrically connected to the first junction structures 4150 of the first structure 4100 through second junction structures 4250. The second junction structures 4250 may be provided to be in contact with the first junction structures 4150, respectively, or may be bonded to the first junction structures 4150, respectively. The first and second junction structures 4150 and 4250 may be formed of or include copper (Cu).

Each of the semiconductor chips 2200a may further include the input/output pads 2210 (e.g., of FIG. 2), which are electrically connected to the peripheral lines 4110 of the first structure 4100.

The semiconductor chips 2200 of FIG. 3 may be electrically connected to each other through the connection structures 2400, which are provided in the form of bonding wires. The semiconductor chips 2200a of FIG. 4 may be electrically connected to each other through the connection structures 2400, which are provided in the form of bonding wires. However, in an embodiment, semiconductor chips, which are stacked in a single semiconductor package, such as the semiconductor chips 2200 of FIG. 3 or the semiconductor chips 2200a of FIG. 4, may be electrically connected to each other by through-silicon vias (TSVs).

The first structure 3100 of FIG. 3 and the first structure 4100 of FIG. 4 may correspond to a lower level layer in embodiments to be described below, and the second structure 3200 of FIG. 3 and the second structure 4200 of FIG. 4 may correspond to an upper level layer in the embodiments to be described below.

Figure 5:
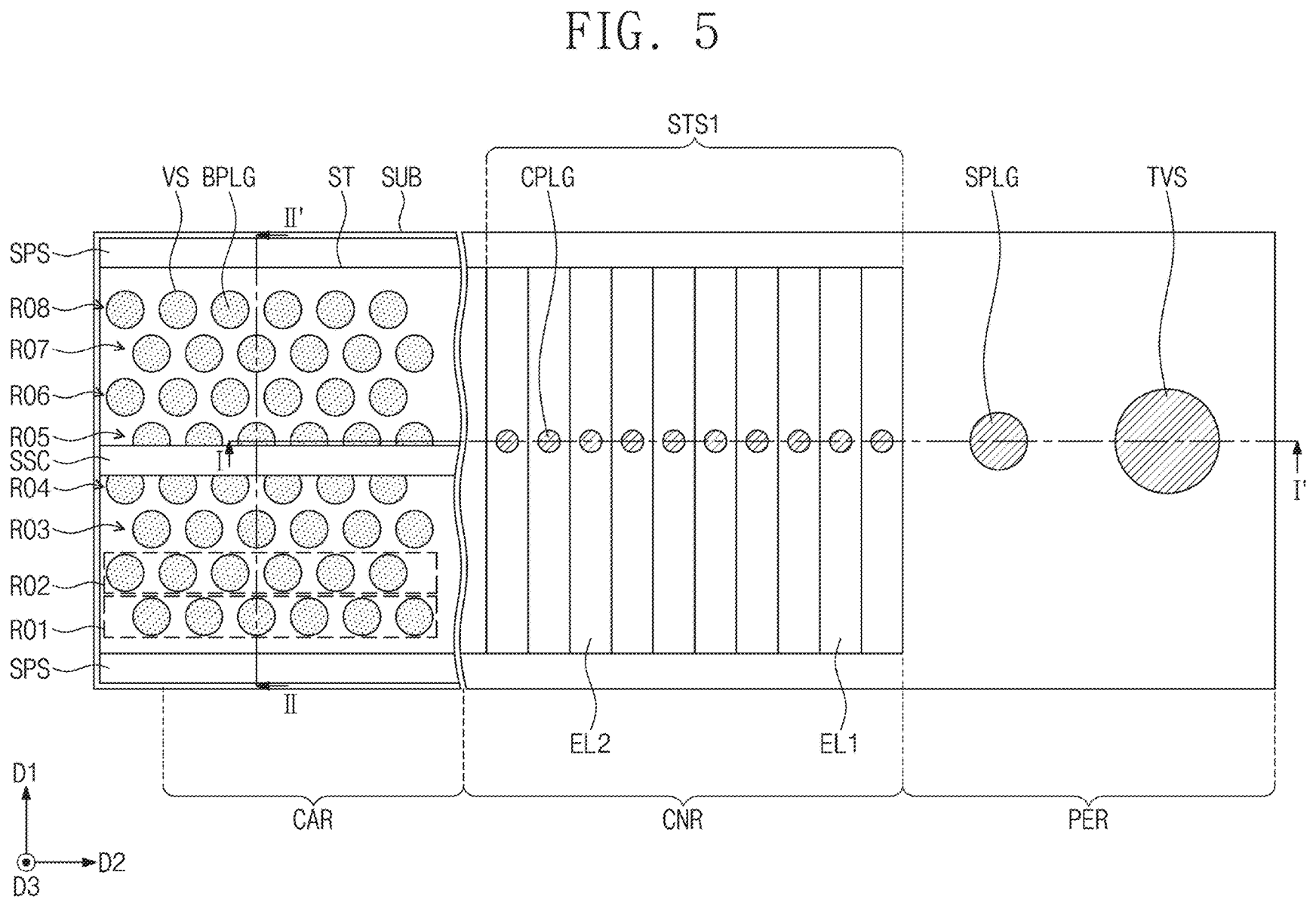
Figure 6A:
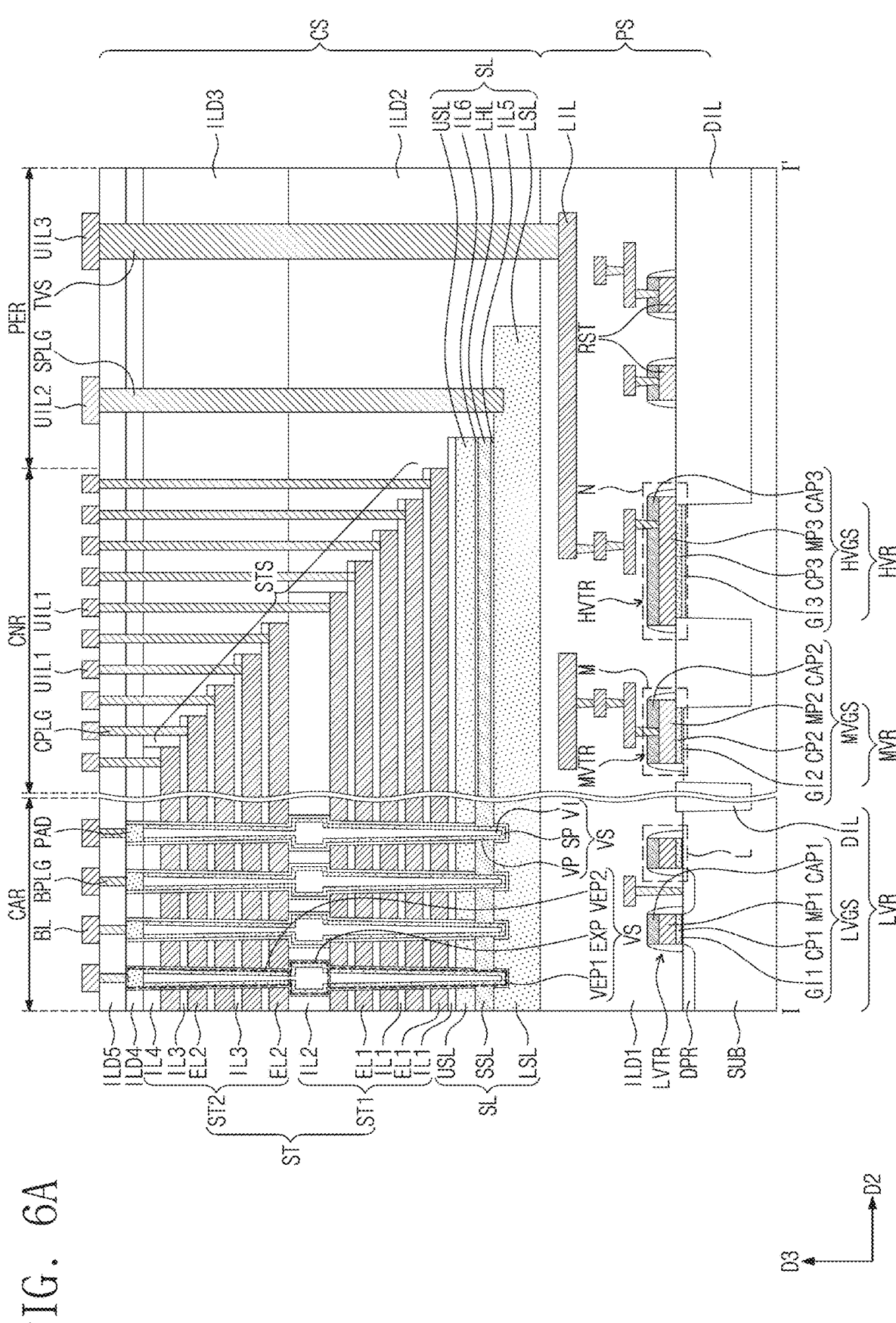
FIG. 6A is a cross-sectional view taken along a line I-I' of FIG. 5.
Figure 6B:
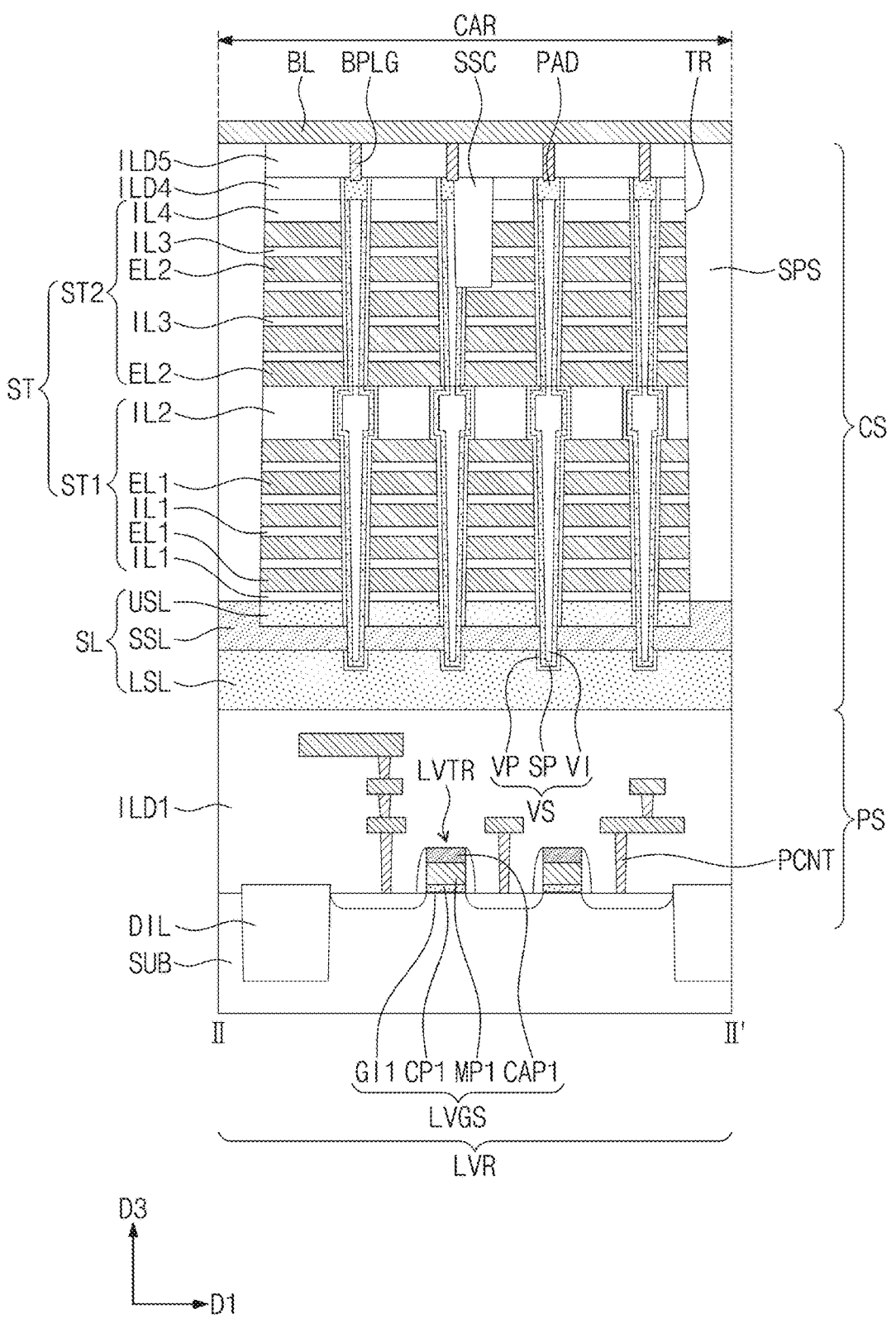
FIG. 6B is a cross-sectional view taken along a line II-II' of FIG. 5.

FIG. 5 is a plan view illustrating a semiconductor device according to at least one example embodiment of the inventive concepts. FIG. 6A is a cross-sectional view taken along a line I-I' of FIG. 5. FIG. 6B is a cross-sectional view taken along a line II-II' of FIG. 5.

Referring to FIGS. 5, 6A, and 6B, a lower level layer PS including peripheral transistors LVTR, MVTR, and HVTR may be disposed on a first substrate SUB. An upper level layer CS including a cell array structure ST may be disposed on the lower level layer PS. The first substrate SUB may be a silicon substrate, a silicon germanium substrate, a germanium substrate, and/or a single crystalline epitaxial layer grown on a single crystalline silicon substrate. The first substrate SUB may include active regions LVR, MVR, and HVR, which are defined by a device isolation layer DIL.

The lower level layer PS may be a peripheral circuit region or a peripheral circuit layer, which includes a decoder circuit, a page buffer, and a logic circuit. The lower level layer PS may include a plurality of the peripheral transistors LVTR, MVTR, and HVTR, which are disposed on the active regions LVR, MVR, and HVR of the first substrate SUB. As described above, the peripheral transistors LVTR, MVTR, and HVTR may constitute row and column decoders, a page buffer, a control circuit, and a peripheral logic circuit.

More specifically, the first substrate SUB may include a first active region LVR, a second active region MVR, and a third active region HVR. The first to third active regions LVR, MVR, and HVR may be defined by the device isolation layer DIL. According to at least one example embodiment of the inventive concepts, a top surface of the device isolation layer DIL may be higher than a top surface of the first substrate SUB. That is, the top surface of the device isolation layer DIL may be higher than a top surface of the active region LVR, MVR, and/or HVR adjacent thereto.

At least one first peripheral transistor LVTR may be provided on the first active region LVR, at least one second peripheral transistor MVTR may be provided on the second active region MVR, and at least one third peripheral transistor HVTR may be provided on the third active region HVR.

The first peripheral transistor LVTR may include a first gate structure LVGS. The first gate structure LVGS may include a first gate insulating pattern GI1, a first conductive pattern CP1, a first metal pattern MP1, and a first capping pattern CAP1, which are sequentially stacked on the first active region LVR. As an example, the first gate insulating pattern GI1 may include a silicon oxide layer. As another example, the first gate insulating pattern GI1 may include a first insulating layer (e.g., a silicon oxide layer) and a second insulating layer (e.g., a silicon oxynitride layer), which are sequentially stacked. The first conductive pattern CP1 may be formed of or include at least one of doped semiconductor materials (e.g., doped polysilicon, doped poly-germanium, and so forth). The first metal pattern MP1 may be formed of or include at least one of metallic materials (e.g., titanium, tantalum, tungsten, copper, and/or aluminum). The first capping pattern CAP1 may be formed of or include at least one of silicon oxide, silicon nitride, and/or silicon oxynitride.

The second peripheral transistor MVTR may include a second gate structure MVGS. The second gate structure MVGS may include a second gate insulating pattern GI2, a second conductive pattern CP2, a second metal pattern MP2, and a second capping pattern CAP2, which are sequentially stacked on the second active region MVR. The third peripheral transistor HVTR may include a third gate structure HVGS. The third gate structure HVGS may include a third gate insulating pattern GI3, a third conductive pattern CP3, a third metal pattern MP3, and a third capping pattern CAP3, which are sequentially stacked on the third active region HVR.

The second gate insulating pattern GI2 may be thicker than the first gate insulating pattern GI1. The third gate insulating pattern GI3 may be thicker than the second gate insulating pattern GI2. The second and third gate insulating patterns GI2 and GI3 may be formed of or include the same material as the first gate insulating pattern GI1.

A top surface of each of the second and third conductive patterns CP2 and CP3 may be located at the same or substantially the same level as a top surface of the first conductive pattern CP1. The second and third conductive patterns CP2 and CP3 may be formed of or include the same material as the first conductive pattern CP1. A top surface of each of the second and third metal patterns MP2 and MP3 may be located at the same or substantially the same level as a top surface of the first metal pattern MP1. The second and third metal patterns MP2 and MP3 may be formed of or include the same material as the first metal pattern MP1. A top surface of each of the second and third capping patterns CAP2 and CAP3 may be located at the same or substantially the same level as a top surface of the first capping pattern CAP1. The second and third capping patterns CAP2 and CAP3 may be formed of or include the same material as the first capping pattern CAP1.

The first peripheral transistor LVTR may be operated with a relatively low voltage. The second peripheral transistor MVTR may be operated with an intermediate voltage. The third gate structure HVGS may be operated with a relatively high voltage. In other words, a voltage, which is applied to the second gate structure MVGS of the second peripheral transistor MVTR, may be higher than a voltage, which is applied to the first gate structure LVGS of the first peripheral transistor LVTR. A voltage, which is applied to the third gate structure HVGS of the third peripheral transistor HVTR, may be higher than the voltage, which is applied to the second gate structure MVGS of the second peripheral transistor MVTR.

A width of the second gate structure MVGS in a second direction D2 may be larger than a width of the first gate structure LVGS in the second direction D2. A width of the third gate structure HVGS in the second direction D2 may be larger than a width of the second gate structure MVGS in the second direction D2.

At least a portion of the second gate structure MVGS may be vertically overlapped with the device isolation layer DIL. At least a portion of the third gate structure HVGS may be vertically overlapped with the device isolation layer DIL. The first to third gate structures LVGS, MVGS, and HVGS will be described in more detail below.

A resistor structure RST may be provided on the device isolation layer DIL. The resistor structure RST may be provided at the same level as the metal pattern MP1, MP2, and/or MP3 of the gate structure LVGS, MVGS, and/or HVGS. That is, the resistor structure RST and the metal pattern MP1, MP2, and/or MP3 may be formed at the same time.

The lower level layer PS may further include lower interconnection lines LIL, which are provided on the first to third peripheral transistors LVTR, MVTR, and HVTR, and a first interlayer insulating layer ILD1, which is provided to cover the first to third peripheral transistors LVTR, MVTR, and HVTR and the lower interconnection lines LIL. A peripheral contact PCNT may be provided between the lower interconnection line LIL and the peripheral transistor LVTR, MVTR, and/or HVTR to electrically connect the lower interconnection line LIL to the peripheral transistor LVTR, MVTR, and/or HVTR.

As an example, the peripheral contact PCNT may be provided to penetrate the capping pattern CAP1, CAP2, and/or CAP3 and may be coupled to the gate structure LVTR, MVTR, and/or HVTR. As another example, the peripheral contact PCNT may be coupled to an impurity region DPR, which is adjacent to the gate structure LVTR, MVTR, and/or HVTR.

The first interlayer insulating layer ILD1 may include a plurality of stacked insulating layers. For example, the first interlayer insulating layer ILD1 may include a silicon oxide layer, a silicon nitride layer, a silicon oxynitride layer, and/or a low-k dielectric layer. The upper level layer CS may be provided on the first interlayer insulating layer ILD1 of the lower level layer PS. The upper level layer CS will be described in more detail below.

The upper level layer CS may include a cell array region CAR, a cell contact region CNR, and a peripheral region PER. The cell contact region CNR may be located between the cell array region CAR and the peripheral region PER. The peripheral region PER may be an outer region of a semiconductor chip.

A second substrate SL may be provided on the first interlayer insulating layer ILD1. The second substrate SL may support the cell array structure ST, which is provided on the cell array region CAR. The second substrate SL of the cell array region CAR may include a lower semiconductor layer LSL, a source semiconductor layer SSL, and an upper semiconductor layer USL, which are sequentially stacked. Each of the lower semiconductor layer LSL, the source semiconductor layer SSL, and the upper semiconductor layer USL may be formed of or include at least one of semiconductor materials (e.g., silicon (Si), germanium (Ge), silicon germanium (SiGe), gallium arsenic (GaAs), indium gallium arsenic (InGaAs), and aluminum gallium arsenic (AlGaAs)). Each of the lower semiconductor layer LSL, the source semiconductor layer SSL, and the upper semiconductor layer USL may have a single-crystalline, amorphous, and/or poly-crystalline structure. As an example, each of the lower semiconductor layer LSL, the source semiconductor layer SSL, and the upper semiconductor layer USL may include an n-type poly-silicon layer doped with impurities. The lower semiconductor layer LSL, the source semiconductor layer SSL, and the upper semiconductor layer USL may have different impurity concentrations from each other.

The source semiconductor layer SSL may be interposed between the lower semiconductor layer LSL and the upper semiconductor layer USL. The lower semiconductor layer LSL and the upper semiconductor layer USL may be electrically connected to each other by the source semiconductor layer SSL.

The second substrate SL of the cell contact region CNR may include the lower semiconductor layer LSL, a fifth insulating layer IL5, a lower sacrificial layer LHL, a sixth insulating layer IL6, and the upper semiconductor layer USL, which are sequentially stacked. Each of the fifth and sixth insulating layers IL5 and IL6 may be formed of or include a silicon oxide layer, and the lower sacrificial layer LHL may include a silicon nitride layer or a silicon oxynitride layer.

The lower semiconductor layer LSL of the second substrate SL may be extended from the cell array region CAR to the peripheral region PER. The lower semiconductor layer LSL may be extended to a portion of the peripheral region PER but may not be extended to another portion of the peripheral region PER. That is, the lower semiconductor layer LSL may not be provided in another portion of the peripheral region PER.

The cell array structure ST may be provided on the cell array region CAR and the cell contact region CNR of the second substrate SL. The cell array structure ST may include a first stack ST1 and a second stack ST2 on the first stack ST1. A second interlayer insulating layer ILD2 and a third interlayer insulating layer ILD3 may be provided on the second substrate SL. A top surface of the second interlayer insulating layer ILD2 may be coplanar with a top surface of the first stack ST1. A top surface of the third interlayer insulating layer ILD3 may be coplanar with a top surface of the second stack ST2. The second and third interlayer insulating layers ILD2 and ILD3 may cover a staircase structure STS of the cell array structure ST.

The first stack ST1 may include first electrodes EL1, which are stacked in a direction (i.e., a third direction D3) perpendicular to the second substrate SL. The first stack ST1 may further include first insulating layers IL1, which separate the stacked first electrodes EL1 from each other. The first insulating layers IL1 and the first electrodes EL1 may be alternately stacked in the first stack ST1. A second insulating layer IL2 may be provided as the uppermost layer of the first stack ST1. The second insulating layer IL2 may be thicker than each of the first insulating layers IL1.

The second stack ST2 may include second electrodes EL2, which are stacked on the first stack ST1 and in the third direction D3. The second stack ST2 may further include third insulating layers IL3, which separate the stacked second electrodes EL2 from each other. The third insulating layers IL3 and the second electrodes EL2 of the second stack ST2 may be alternately stacked. A fourth insulating layer IL4 may be provided as the uppermost layer of the second stack ST2. The fourth insulating layer IL4 may be thicker than each of the third insulating layers IL3.

The cell array structure ST may include the staircase structure STS on the cell contact region CNR. The staircase structure STS may be a portion of the cell array structure ST, which is extended from the cell array region CAR to the cell contact region CNR in a second direction D2. In other words, the first and second electrodes EL1 and EL2 of the cell array structure ST may constitute the staircase structure STS that is extended from the cell array region CAR to the cell contact region CNR. The staircase structure STS on the cell contact region CNR may be connected to the cell array structure ST on the cell array region CAR. A height of the staircase structure STS may decrease with decreasing distance to the peripheral region PER. In other words, the height of the staircase structure STS may decrease with decreasing distance in the second direction D2.

The lowermost one of the first electrodes EL1 of the cell array structure ST may serve as the first lower selection line LL1 (e.g., see FIG. 1), and the next lowermost one of the first electrodes EL1 on the lowermost first electrode EL1 may serve as the second lower selection line LL2 (e.g., see FIG. 1).

The uppermost one of the second electrodes EL2 of the cell array structure ST may serve as the first string selection line UL1 (e.g., see FIG. 1), and the next uppermost one of the second electrodes EL2 below the uppermost second electrode EL2 may serve as the second string selection line UL2 (e.g., see FIG. 1). The remaining ones of the first and second electrodes EL1 and EL2, except for the first and second lower selection lines and the first and second string selection lines, may serve as the word lines WL (e.g., see FIG. 1).

End portions of the first and second electrodes EL1 and EL2 may constitute the staircase structure STS. The end portions of the first and second electrodes EL1 and EL2 may be sequentially exposed to the outside of the staircase structure STS.

The first and second electrodes EL1 and EL2 may be formed of or include at least one conductive material selected from the group consisting of doped semiconductor materials (e.g., doped silicon), metallic materials (e.g., tungsten, copper, and/or aluminum), conductive metal nitrides (e.g., titanium nitride or tantalum nitride), and transition metals (e.g., titanium or tantalum). At least one of first to fourth insulating layers IL1 to IL4 may include a silicon oxide layer.

A plurality of vertical channel structures VS may be provided on the cell array region CAR to penetrate the cell array structure ST. Each of the vertical channel structures VS may include a vertical insulating pattern VP, a vertical semiconductor pattern SP, and an insulating gapfill pattern VI. The vertical semiconductor pattern SP may be interposed between the vertical insulating pattern VP and the insulating gapfill pattern VI. A conductive pad PAD may be provided in an upper portion of each of the vertical channel structures VS.

The insulating gapfill pattern VI may have a circular pillar shape. The vertical semiconductor pattern SP may be extended from the lower semiconductor layer LSL to the conductive pad PAD in the third direction D3 to cover a surface of the insulating gapfill pattern VI. The vertical semiconductor pattern SP may be shaped like a pipe with an open top end. The vertical insulating pattern VP may cover an outer surface of the vertical semiconductor pattern SP and may be extended from the lower semiconductor layer LSL to a top surface of a fourth interlayer insulating layer ILD4 in the third direction D3. The vertical insulating pattern VP may be shaped like a pipe with an open top end. The vertical insulating pattern VP may be interposed between the cell array structure ST and the vertical semiconductor pattern SP.

The vertical insulating pattern VP may consist of a single thin film or a plurality of thin films. In an embodiment, the vertical insulating pattern VP may include a data storing layer. In an embodiment, the vertical insulating pattern VP may include a tunnel insulating layer, a charge storing layer, and a blocking insulating layer, which are used as a data storing layer of a NAND flash memory device.

For example, the charge storing layer may be a trap insulating layer, a floating gate electrode, and/or an insulating layer with conductive nano dots. In certain embodiments, the charge storing layer may include at least one of a silicon nitride layer, a silicon oxynitride layer, a silicon-rich nitride layer, a nanocrystalline silicon layer, and/or a laminated trap layer. The tunnel insulating layer may be formed of or include at least one of materials whose band gaps are greater than that of the charge storing layer. The tunnel insulating layer may be formed of or include at least one of high-k dielectric materials (e.g., aluminum oxide and hafnium oxide) or silicon oxide. The blocking insulating layer may be formed of or include silicon oxide.

The vertical semiconductor pattern SP may be formed of or include at least one of semiconductor materials (e.g., silicon (Si), germanium (Ge), and/or mixtures thereof). In addition, the vertical semiconductor pattern SP may be formed of or include at least one of doped semiconductor materials or undoped (i.e., intrinsic) semiconductor materials. The vertical semiconductor pattern SP including the semiconductor material may be used as channel regions of transistors constituting a memory cell string.

The conductive pad PAD may cover a top surface of the vertical semiconductor pattern SP and a top surface of the insulating gapfill pattern VI. The conductive pad PAD may be formed of or include at least one of doped semiconductor materials and/or conductive materials. A bit line contact plug BPLG may be electrically connected to the vertical semiconductor pattern SP through the conductive pad PAD.

The source semiconductor layer SSL may be in direct contact with a lower side surface of each of the vertical semiconductor patterns SP. The source semiconductor layer SSL may be provided to electrically connect the vertical semiconductor patterns SP to each other. In other words, the vertical semiconductor patterns SP may be electrically connected in common to the second substrate SL. The second substrate SL may serve as source electrodes of memory cells. A common source voltage may be applied to the second substrate SL through a source contact plug SPLG to be described below.

Each of the vertical channel structures VS may include a first vertical extended portion VEP1 penetrating the first stack ST1, a second vertical extended portion VEP2 penetrating the second stack ST2, and an expanded portion EXP between the first and second vertical extended portions VEP1 and VEP2. The expanded portion EXP may be provided in the second insulating layer IL2.

A diameter of the first vertical extended portion VEP1 may increase with increasing distance from the lower semiconductor layer LSL. A diameter of the second vertical extended portion VEP2 may increase with increasing distance from the lower semiconductor layer LSL. A diameter of the expanded portion EXP may be larger than the largest diameter of the first vertical extended portion VEP1 and the largest diameter of the second vertical extended portion VEP2.

A plurality of separation structures SPS may be provided to penetrate the cell array structure ST (e.g., see FIG. 6B). The cell array structure ST may be horizontally divided into a plurality of structures by the separation structures SPS. For example, one (e.g., EL1 or EL2) of the electrodes in the cell array structure ST may be horizontally divided into a plurality of electrodes by the separation structures SPS. The separation structures SPS may be formed of or include an insulating material (e.g., silicon oxide).

The fourth interlayer insulating layer ILD4 may be provided on the cell array structure ST and the third interlayer insulating layer ILD3. A fifth interlayer insulating layer ILD5 may be provided on the fourth interlayer insulating layer ILD4.

The bit line contact plugs BPLG may be provided to penetrate the fifth interlayer insulating layer ILD5 and may be coupled to the conductive pads PAD, respectively. The bit lines BL may be disposed on the fifth interlayer insulating layer ILD5. The bit lines BL may be extended in the first direction D1 and parallel to each other. The bit lines BL may be electrically connected to the vertical channel structures VS, respectively, through the bit line contact plugs BPLG.

A plurality of first upper interconnection lines UIL1 may be provided on the fifth interlayer insulating layer ILD5 of the cell contact region CNR. Cell contact plugs CPLG may be provided to vertically extend from the first upper interconnection lines UIL1 to the staircase structure STS.

The cell contact plugs CPLG may be respectively coupled to exposed portions of the first and second electrodes EL1 and EL2 of the staircase structure STS. The cell contact plugs CPLG may be sequentially coupled to end portions of the first and second electrodes EL1 and EL2, respectively. The first and second electrodes EL1 and EL2 may be electrically connected to the first upper interconnection lines UIL1, respectively, through the cell contact plugs CPLG.

A second upper interconnection line UIL2 may be provided on the fifth interlayer insulating layer ILD5 of the peripheral region PER. The source contact plug SPLG may be provided to vertically extend from the second upper interconnection line UIL2 to the lower semiconductor layer LSL. The second upper interconnection line UIL2 may be electrically connected to the second substrate SL through the source contact plug SPLG. A common source voltage may be applied to the second substrate SL through the second upper interconnection line UIL2 and the source contact plug SPLG.

A third upper interconnection line UIL3 may be provided on the fifth interlayer insulating layer ILD5 of the peripheral region PER. A through via TVS may be provided to vertically extend from the third upper interconnection line UIL3 to the lower interconnection line LIL of the lower level layer PS. The upper level layer CS may be electrically connected to the lower level layer PS through the through via TVS.

Referring back to FIGS. 5 and 6B, a cutting structure SSC may be provided on the cell array region CAR. The cutting structure SSC may be extended in the second direction D2 to cross an upper portion of the cell array structure ST. When viewed in a plan view, the cutting structure SSC may have a line shape.

The vertical channel structures VS may be two-dimensionally arranged to form first to eighth rows RO1-RO8. The first to eighth rows RO1-RO8 may be arranged in the first direction D1 to be spaced apart from each other by a constant distance. The vertical channel structures VS in each of the first to eighth rows RO1-RO8 may be arranged in the second direction D2 to be spaced apart from each other with the same pitch.

The vertical channel structures VS in adjacent rows may be offset from each other in the second direction D2. For example, the vertical channel structures VS of the first row RO1 may be offset from the vertical channel structures VS of the second row RO2 in the second direction D2.

The cutting structure SSC may be provided between the fourth row RO4 and the fifth row RO5 and may be extended in the second direction D2. The cutting structure SSC may be vertically overlapped with at least a portion of each of the vertical channel structures VS of the fourth and fifth rows RO4 and RO5. In other words, the cutting structure SSC may be extended to cross the vertical channel structures VS of the fourth and fifth rows RO4 and RO5.

The cutting structure SSC may be provided to penetrate the uppermost one of the second electrodes EL2 (i.e., the first string selection line UL1 of FIG. 1) and the second uppermost one of the second electrodes EL2 (i.e., the second string selection line UL2 of FIG. 1). The first string selection line UL1 of FIG. 1 may be divided into two lines by the cutting structure SSC. The second string selection line UL2 of FIG. 1 may be divided into two lines by the cutting structure SSC. The cutting structure SSC may be provided to penetrate a portion of the conductive pad PAD. The cutting structure SSC may also be provided to partially penetrate an upper portion of the vertical channel structure VS.

Figure 7A:
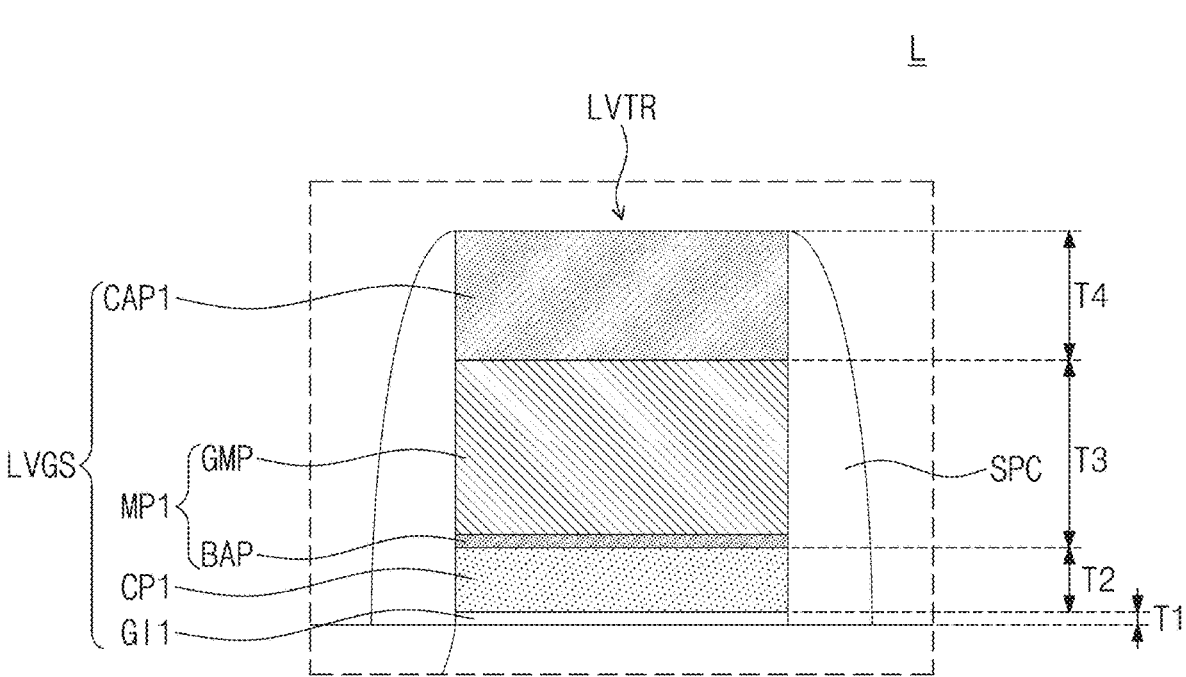
FIG. 7A is an enlarged cross-sectional view illustrating a portion 'L' of FIG. 6A and illustrating a first gate structure according to at least one example embodiment of the inventive concepts.
Figure 7A:
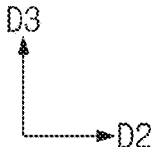
Figure 7B:
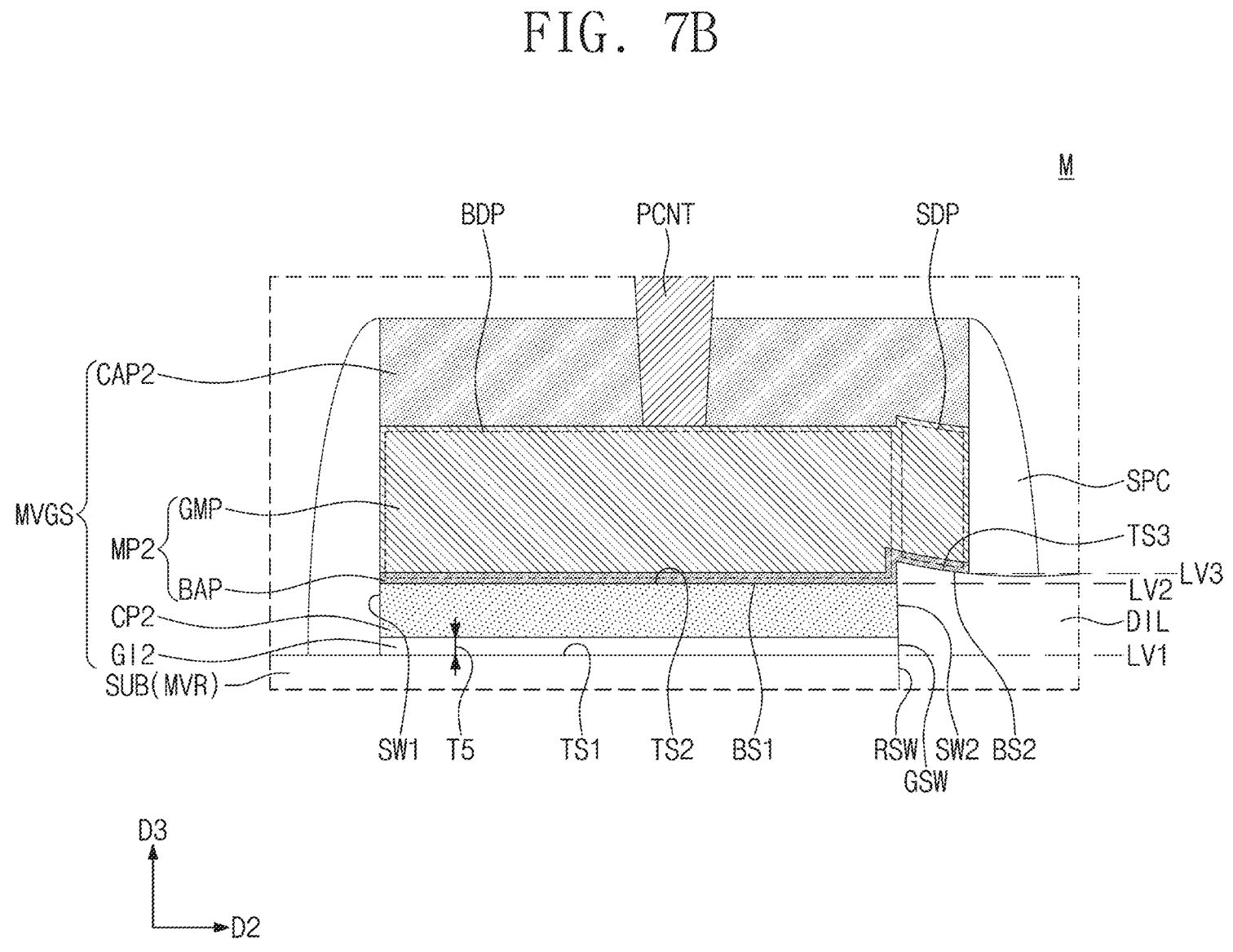
Figure 7C:
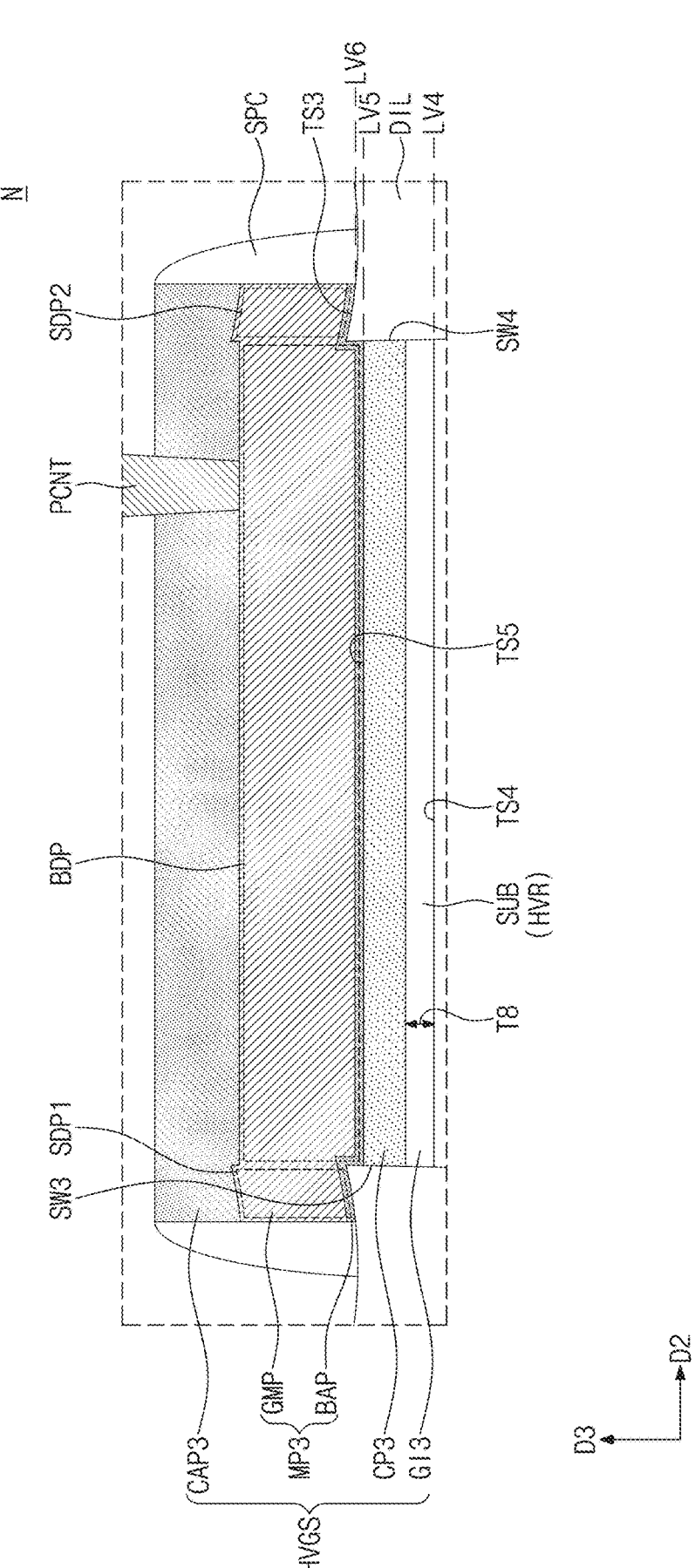
FIG. 7C is an enlarged cross-sectional view illustrating the portion 'M' of FIG. 6A and illustrating a third gate structure according to at least one example embodiment of the inventive concepts.

FIG. 7A is an enlarged cross-sectional view illustrating a portion 'L' of FIG. 6A and illustrating a first gate structure according to at least one example embodiment of the inventive concepts. FIG. 7B is an enlarged cross-sectional view illustrating a portion 'M' of FIG. 6A and illustrating a second gate structure according to at least one example embodiment of the inventive concepts. FIG. 7C is an enlarged cross-sectional view illustrating the portion 'M' of FIG. 6A and illustrating a third gate structure according to at least one example embodiment of the inventive concepts.

Referring to FIG. 7A, the first gate structure LVGS may be provided on the first active region LVR of the first substrate SUB. A pair of gate spacers GPC may be respectively provided on opposite side surfaces of the first gate structure LVGS. A width of the first gate structure LVGS in the second direction D2 may decrease with increasing distance from the first substrate SUB (i.e., in the third direction D3).

The first metal pattern MP1 of the first gate structure LVGS may include a barrier pattern BAP and a gate metal pattern GMP, which are sequentially stacked. The barrier pattern BAP may be interposed between the gate metal pattern GMP and the first conductive pattern CP1 to prevent a metallic element in the gate metal pattern GMP from being diffused into the first conductive pattern CP1. In addition, the barrier pattern BAP may be configured to form an ohmic junction between a metallic material of the gate metal pattern GMP and a semiconductor material of the first conductive pattern CP1.

The gate metal pattern GMP may be formed of or include at least one of metallic materials (e.g., titanium, tantalum, tungsten, copper, and aluminum). The barrier pattern BAP may be formed of or include at least one of titanium nitride (TiN), tantalum nitride (TaN), titanium oxynitride (TiON), titanium silicon nitride (TiSiN), titanium aluminum nitride (TiAlN), tungsten carbon nitride (WCN), and/or molybdenum nitride (MoN).

The first gate insulating pattern GI1 may cover a top surface of the first active region LVR. The first gate insulating pattern GI1 may have a first thickness T1. For example, the first thickness T1 may range from 1 nm to 4 nm.

The first conductive pattern CP1 may be provided on the first gate insulating pattern GI1. The first conductive pattern CP1 may be formed of or include a doped semiconductor material (e.g., doped polysilicon). The first conductive pattern CP1 may have a second thickness T2. For example, the second thickness T2 may range from 20 nm to 30 nm.

The first metal pattern MP1 on the first conductive pattern CP1 may have a third thickness T3. The third thickness T3 may be larger than the second thickness T2. For example, the third thickness T3 may range from 30 nm to 50 nm.

The first capping pattern CAP1 may be provided on the first metal pattern MP1. For example, the first capping pattern CAP1 may include a silicon nitride layer. The first capping pattern CAP1 may have a fourth thickness T4. For example, the fourth thickness T4 may range from 30 nm to 60 nm. Although not shown, the fourth thickness T4 may be larger than the third thickness T3.

Referring to FIG. 7B, the second gate structure MVGS may be provided on the second active region MVR of the first substrate SUB. A pair of the gate spacers GPC may be respectively provided on opposite side surfaces of the second gate structure MVGS.

The second gate insulating pattern GI2 may cover a top surface TS1 of the second active region MVR. The top surface TS1 of the second active region MVR may be located at a first level LV1. The first level LV1 may be substantially equal to or lower than a level of the top surface of the first active region LVR shown in FIG. 7A.

The second gate insulating pattern GI2 may have a fifth thickness T5. The fifth thickness T5 may be larger than the first thickness T1 of the first gate insulating pattern GI1 of FIG. 7A. For example, the fifth thickness T5 may range from 4 nm to 7 nm.

The second conductive pattern CP2 may be provided on the second gate insulating pattern GI2. A thickness of the second conductive pattern CP2 may be substantially equal to the second thickness T2 of the first conductive pattern CP1 of FIG. 7A. The second conductive pattern CP2 may include a first side surface SW1 and a second side surface SW2, which are opposite to each other. The first side surface SW1 may be covered with the gate spacer GPC. The second side surface SW2 may be covered with the device isolation layer DIL. A top surface TS2 of the second conductive pattern CP2 may be lower than a top surface TS3 of the device isolation layer DIL covering the second side surface SW2. In other words, the highest point of the top surface TS3 of the device isolation layer DIL may be higher than the top surface TS2 of the second conductive pattern CP2.

The second side surface SW2 of the second conductive pattern CP2, a side surface GSW of the second gate insulating pattern GI2, and a side surface RSW of the second active region MVR may be aligned to each other by the device isolation layer DIL. The aligned side surfaces SW2, GSW, and RSW may be evenly connected to each other without a difference in height therebetween. The aligned side surfaces SW2, GSW, and RSW may have the same or substantially the same slope. The device isolation layer DIL may cover the aligned side surfaces SW2, GSW, and RSW.

The second metal pattern MP2 of the second gate structure MVGS may include the barrier pattern BAP and the gate metal pattern GMP, which are sequentially stacked. The barrier pattern BAP and the gate metal pattern GMP of the second metal pattern MP2 may be configured to have the same features as the barrier pattern BAP and the gate metal pattern GMP, respectively, of the first metal pattern MP1 described above.

A thickness of the second metal pattern MP2 may be substantially equal to the third thickness T3 of the first metal pattern MP1 of FIG. 7A. The second metal pattern MP2 may include a body portion BDP and a side portion SDP. The body portion BDP may be provided on the second conductive pattern CP2. The body portion BDP may be vertically overlapped with the second conductive pattern CP2. The side portion SDP may be provided on the device isolation layer DIL. The side portion SDP may be vertically overlapped with the device isolation layer DIL.

A bottom surface BS1 of the body portion BDP may be in direct contact with the top surface TS2 of the second conductive pattern CP2. A bottom surface BS2 of the side portion SDP may be in direct contact with the top surface TS3 of the device isolation layer DIL. The barrier pattern BAP of the side portion SDP may directly cover a portion of the top surface TS3 of the device isolation layer DIL. The bottom surface BS2 of the side portion SDP may be higher than the bottom surface BS1 of the body portion BDP.

A height or level of the bottom surface BS2 of the side portion SDP may be lowered in the second direction D2. The lowest point of the bottom surface BS2 of the side portion SDP may be located at a third level LV3. The top surface TS2 of the second conductive pattern CP2 and the bottom surface BS1 of the body portion BDP may be located at a second level LV2. The third level LV3 may be higher than the second level LV2.

The side portion SDP of the second metal pattern MP2 may be adjacent to the second side surface SW2 of the second conductive pattern CP2. However, the side portion SDP of the second metal pattern MP2 may be spaced apart from the second side surface SW2 with the device isolation layer DIL interposed therebetween. This may be because the device isolation layer DIL fully covers the second side surface SW2 of the second conductive pattern CP2.

Figure 8:
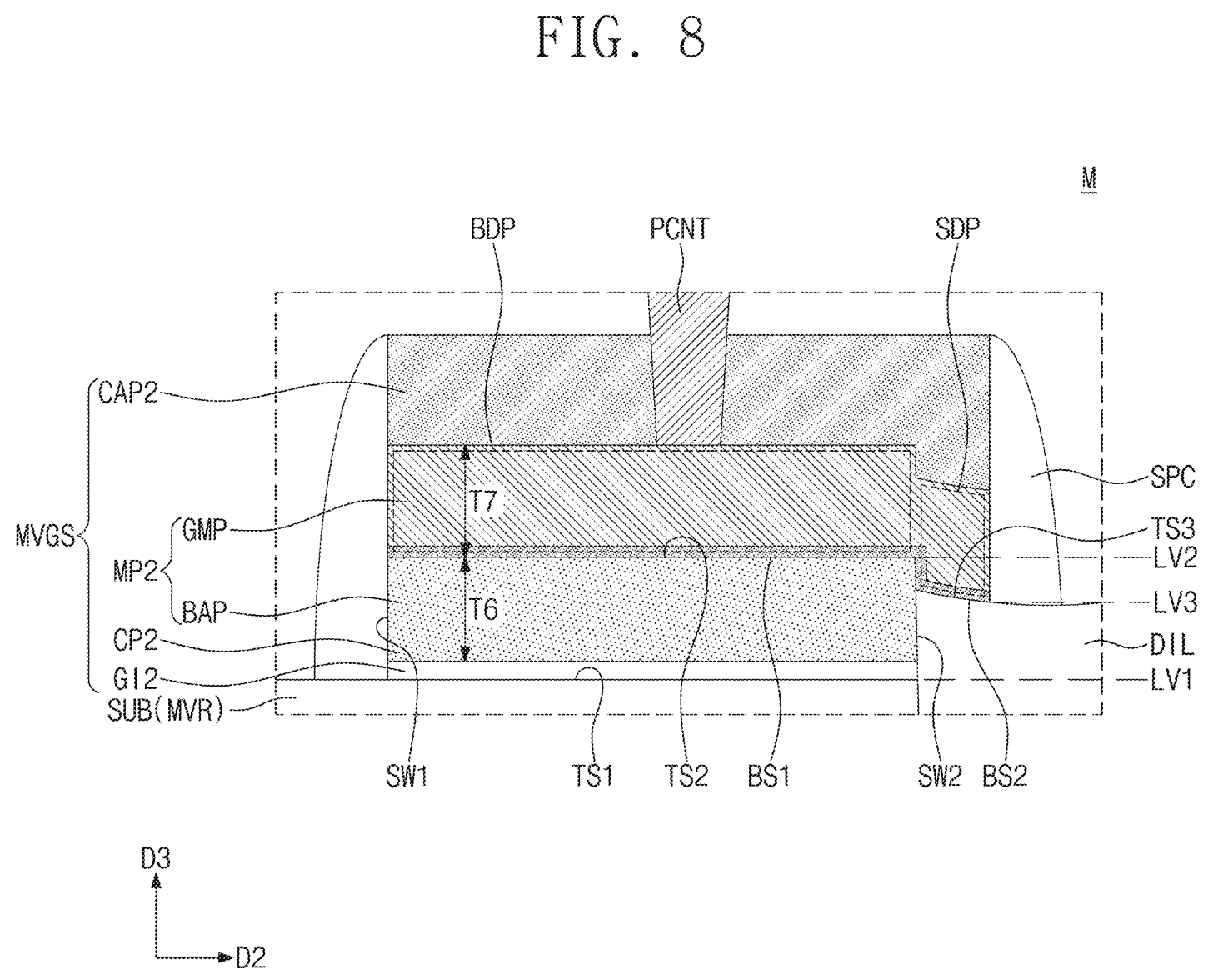

FIG. 8 is an enlarged cross-sectional view illustrating the portion 'M' of FIG. 6A and illustrating a second gate structure according to a comparative example. Referring to FIG. 8, a thickness T6 of the second conductive pattern CP2 may be larger than a thickness of the second conductive pattern CP2 of FIG. 7B. The thickness T6 of the second conductive pattern CP2 may be larger than a thickness T7 of the second metal pattern MP2.

The level LV2 of the top surface TS2 of the second conductive pattern CP2 may be higher than the top surface TS3 of the device isolation layer DIL. The level LV3 of the lowest point of the side portion SDP of the second metal pattern MP2 may be lower than the level LV2 of the top surface TS2 of the second conductive pattern CP2. Accordingly, the side portion SDP may be in direct contact with an upper portion of the second side surface SW2 of the second conductive pattern CP2.

According to the comparative example shown in FIG. 8, the second conductive pattern CP2 may have a relatively large thickness, and thus, a parasitic capacitance between the second conductive pattern CP2 and the peripheral contact PCNT adjacent thereto may be increased. In addition, due to the side portion SDP, the second conductive pattern CP2 may be damaged during the process of forming the second metal pattern MP2.

By contrast, in the embodiment of FIG. 7B, the second conductive pattern CP2 may have a relatively small thickness. Accordingly, the parasitic capacitance between the second conductive pattern CP2 and the peripheral contact PCNT adjacent thereto may be reduced. As a result, electric characteristics of a peripheral transistor may be improved.

Furthermore, in the embodiment of FIG. 7B, the second conductive pattern CP2 may be protected from the side portion SDP of the second metal pattern MP2 by the device isolation layer DIL. Accordingly, it may be possible to prevent a process defect from occurring in the second conductive pattern CP2, during the process of forming the second metal pattern MP2. Accordingly, the reliability of the peripheral transistor may be improved.

Referring to FIG. 7C, the third gate structure HVGS may be provided on the third active region HVR of the first substrate SUB. A pair of the gate spacers GPC may be respectively provided on opposite side surfaces of the third gate structure HVGS.

The third gate insulating pattern GI3 may cover a top surface of the third active region HVR. A top surface TS4 of the third active region HVR may be located at a fourth level LV4. The fourth level LV4 may be lower than the first level LV1 of the top surface TS1 of the second active region MVR of FIG. 7B.

An eighth thickness T8 of the third gate insulating pattern GI3 may be larger than the fifth thickness T5 of the second gate insulating pattern GI2 of FIG. 7B. For example, the eighth thickness T8 may range from 30 nm to 50 nm.

The third conductive pattern CP3 may be provided on the third gate insulating pattern GI3. A thickness of the third conductive pattern CP3 may be substantially equal to the second thickness T2 of the first conductive pattern CP1 of FIG. 7A. The third conductive pattern CP3 may include a third side surface SW3 and a fourth side surface SW4, which are opposite to each other. The third and fourth side surfaces SW3 and SW4 may be covered with the device isolation layer DIL. A top surface TS5 of the third conductive pattern CP3 may be lower than the top surface TS3 of the device isolation layer DIL covering the third and fourth side surfaces SW3 and SW4.

The third metal pattern MP3 of the third gate structure HVGS may include the barrier pattern BAP and the gate metal pattern GMP, which are sequentially stacked. The barrier pattern BAP and the gate metal pattern GMP of the third metal pattern MP3 may be configured to have the same features as the barrier pattern BAP and the gate metal pattern GMP, respectively, of the first metal pattern MP1 described above.

A thickness of the third metal pattern MP3 may be substantially equal to the third thickness T3 of the first metal pattern MP1 of FIG. 7A. The third metal pattern MP3 may include the body portion BDP, a first side portion SDP1, and a second side portion SDP2. The first and second side portions SDP1 and SDP2 may be respectively provided at both sides of the body portion BDP.

The body portion BDP may be provided on the third conductive pattern CP3. The body portion BDP may be vertically overlapped with the third conductive pattern CP3. Each of the first and second side portions SDP1 and SDP2 may be provided on the device isolation layer DIL. Each of the first and second side portions SDP1 and SDP2 may be vertically overlapped with the device isolation layer DIL. A bottom surface of each of the first and second side portions SDP1 and SDP2 may be higher than a bottom surface of the body portion BDP.

For example, the lowest point of the bottom surface of the second side portion SDP2 may be located at a sixth level LV6. The top surface TS5 of the third conductive pattern CP3 may be located at a fifth level LV5. The sixth level LV6 may be higher than the fifth level LV5.

The first and second side portions SDP1 and SDP2 of the third metal pattern MP3 may be adjacent to the third and fourth side surfaces SW3 and SW4, respectively, of the third conductive pattern CP3. However, the first and second side portions SDP1 and SDP2 may be respectively spaced apart from the third and fourth side surfaces SW3 and SW4 with the device isolation layer DIL interposed therebetween. This may be because the device isolation layer DIL fully covers the third and fourth side surfaces SW3 and SW4 of the third conductive pattern CP3.

FIGS. 9A, 10A, 11A, 12A, 13A, 14A, 15A, 16A, 17A, 18A, 19A, 20A, 21A, and 22A are cross-sectional views, which are taken along the line I-I' of FIG. 5 to illustrate a method of fabricating a semiconductor device, according to at least one example embodiment of the inventive concepts. FIGS. 9B, 10B, 11B, 12B, 13B, 14B, 15B, 16B, 17B, 18B, 19B, 20B, 21B, and 22B are cross-sectional views, which are taken along the line II-II' of FIG. 5 to illustrate a method of fabricating a semiconductor device, according to at least one example embodiment of the inventive concepts.

Figure 9A:
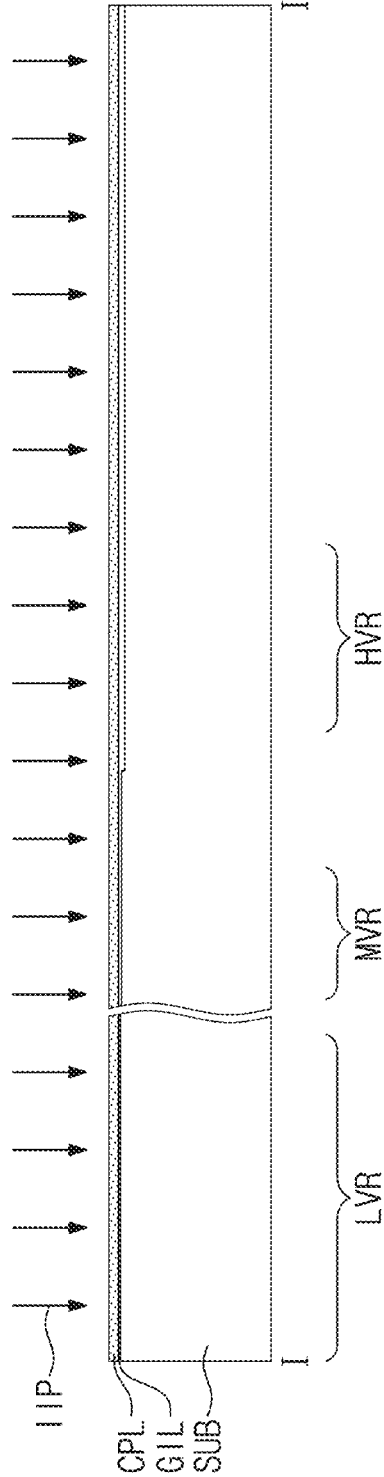
FIGS. 9A, 10A, 11A, 12A, 13A, 14A, 15A, 16A, 17A, 18A, 19A, 20A, 21A, and 22A are cross-sectional views, which are taken along the line I-I' of FIG. 5 to illustrate a method of fabricating a semiconductor device, according to at least one example embodiment of the inventive concepts.
Figure 9B:
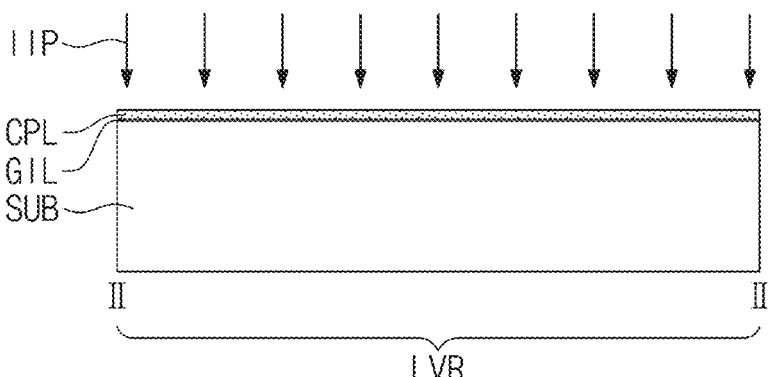
FIGS. 9B, 10B, 11B, 12B, 13B, 14B, 15B, 16B, 17B, 18B, 19B, 20B, 21B, and 22B are sectional views, which are taken along the line II-II' of FIG. 5 to illustrate a method of fabricating a semiconductor device, according to at least one example embodiment of the inventive concepts.
Figure 9B:
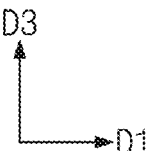

Referring to FIGS. 5, 9A, and 9B, a gate insulating layer GIL may be formed on the first substrate SUB. For example, the gate insulating layer GIL may include a silicon oxide layer. The gate insulating layer GIL may be formed to have at least two different thicknesses, depending on a position on the first substrate SUB. For example, a thickness of the gate insulating layer GIL on the second active region MVR of the first substrate SUB may be larger than a thickness of the gate insulating layer GIL on the first active region LVR of the first substrate SUB. A thickness of the gate insulating layer GIL on the third active region HVR of the first substrate SUB may be larger than the thickness of the gate insulating layer GIL on the second active region MVR of the first substrate SUB.

A top surface of the gate insulating layer GIL may be located at the same level, regardless of the position on the first substrate SUB. For example, the top surface of the gate insulating layer GIL on the first active region LVR, the top surface of the gate insulating layer GIL on the second active region MVR, and the top surface of the gate insulating layer GIL on the third active region HVR may be coplanar with each other.

A conductive layer CPL may be formed on the gate insulating layer GIL. The formation of the conductive layer CPL may include forming a semiconductor layer on the gate insulating layer GIL and performing an ion implantation process (IIP) on the semiconductor layer. As a result, the conductive layer CPL may be formed of or include a doped semiconductor materials (e.g., doped polysilicon). The conductive layer CPL may be formed to have a thickness ranging from 20 nm to 30 nm.

Figure 10A:
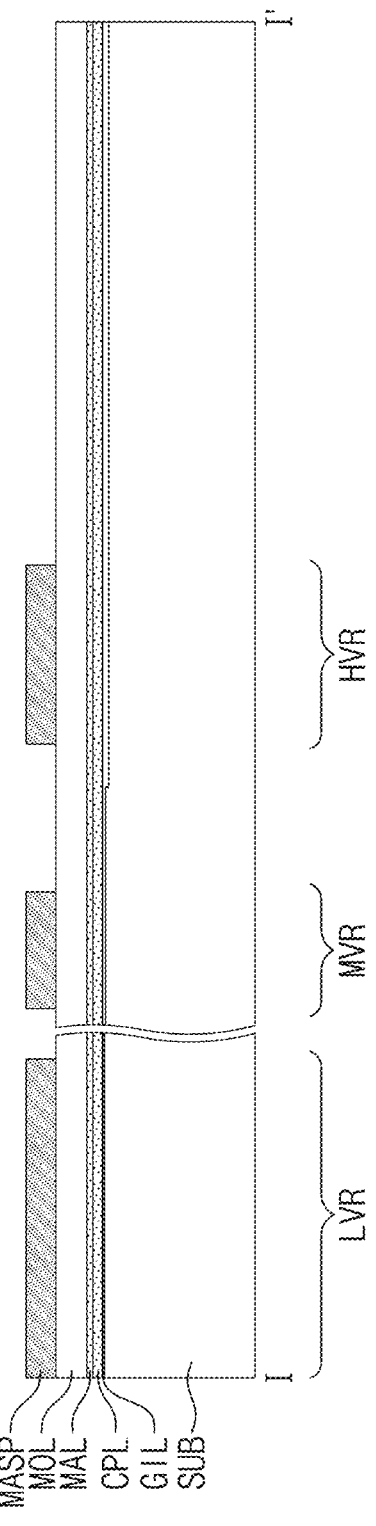
Figure 10B:
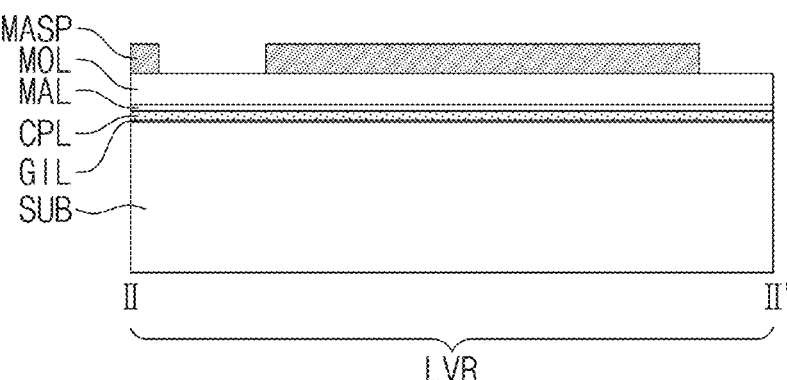
Figure 10B:
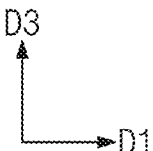

Referring to FIGS. 5, 10A, and 10B, a mask layer MAL may be formed on the conductive layer CPL. The mask layer MAL may be formed to be thinner than the conductive layer CPL. In an embodiment, the mask layer MAL may include a silicon oxide layer and a semiconductor layer (e.g., poly-silicon), which are stacked on the conductive layer CPL. In an embodiment, the mask layer MAL may include a silicon nitride layer. The mask layer MAL may be used to protect the conductive layer CPL, and thus, it may be possible to prevent the conductive layer CPL from being damaged in a subsequent process.

A mold layer MOL may be formed on the mask layer MAL. For example, the mold layer MOL may be formed of or include silicon oxide. The mold layer MOL may be formed to be thicker than the conductive layer CPL.

Mask patterns MASP may be formed on the mold layer MOL. The mask patterns MASP may define the first to third active regions LVR, MVR, and HVR of the first substrate SUB. The mask patterns MASP may be formed using a photolithography process.

Figure 11A:
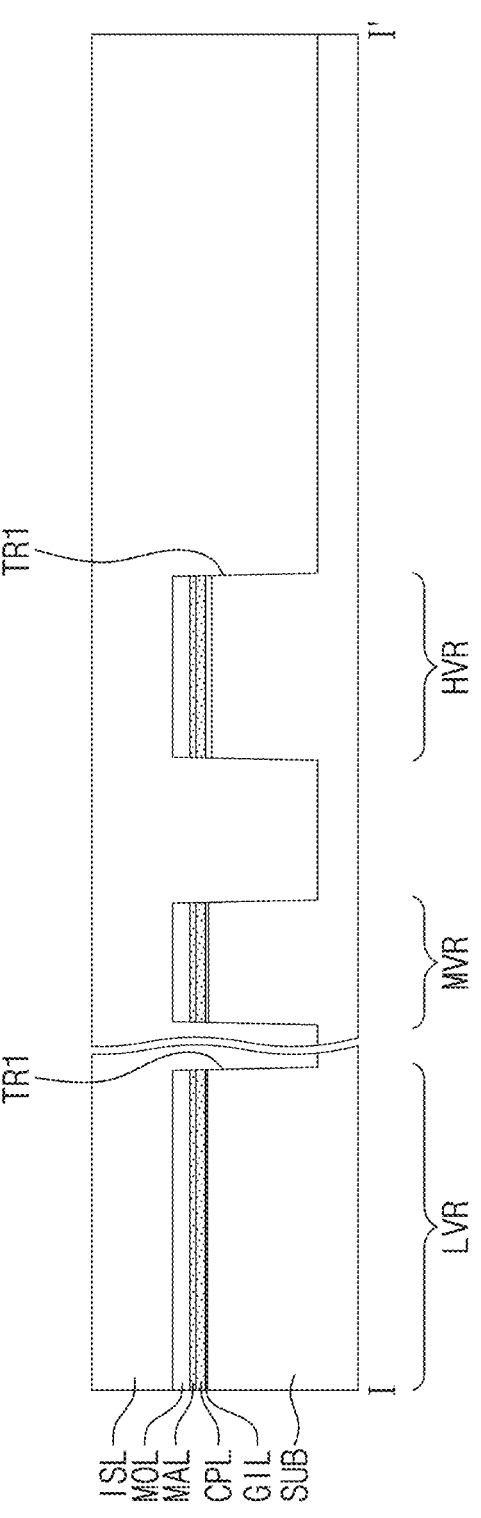
Figure 11B:
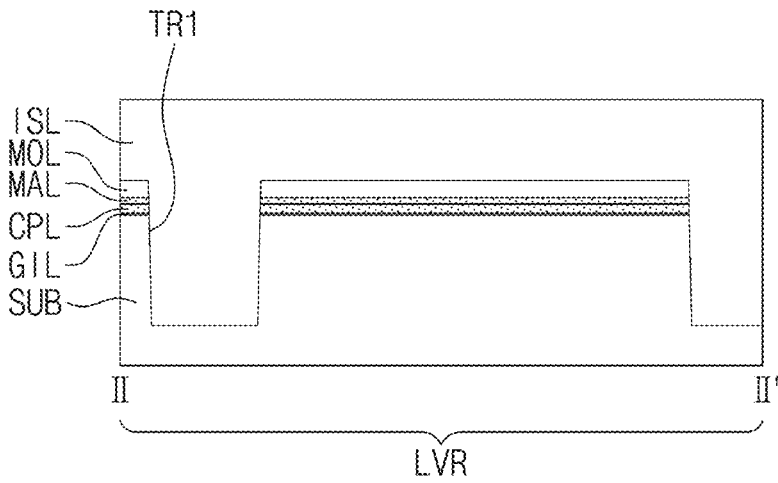
Figure 11B:
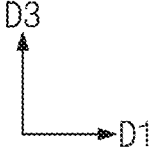

Referring to FIGS. 5, 11A, and 11B, the conductive layer CPL, the gate insulating layer GIL, and a first substrate SUB1 may be patterned by an anisotropic etching process using the mask patterns MASP as an etch mask. All of the mask patterns MASP may be removed, during an etching process on the conductive layer CPL, the gate insulating layer GIL, and the first substrate SUB.

First trenches TR1, which are patterned by the mask patterns MASP, may be formed in the first substrate SUB1. The first to third active regions LVR, MVR, and HVR may be defined in the first substrate SUB1 by the first trenches TR1.

Since all of the conductive layer CPL, the gate insulating layer GIL, and the first substrate SUB1 are patterned using the mask patterns MASP, they may have the same or substantially the same planar shape. According to at least one example embodiment of the inventive concepts, the first trenches TR1 may be formed in the first substrate SUB1 through a self-aligned STI process of patterning not only the first substrate SUB1 but also the conductive layer CPL.

An insulating layer ISL may be formed to fill the first trenches TR1 of the first substrate SUB1. The insulating layer ISL may be formed to be thick enough to completely cover the mold layer MOL.

Figure 12A:
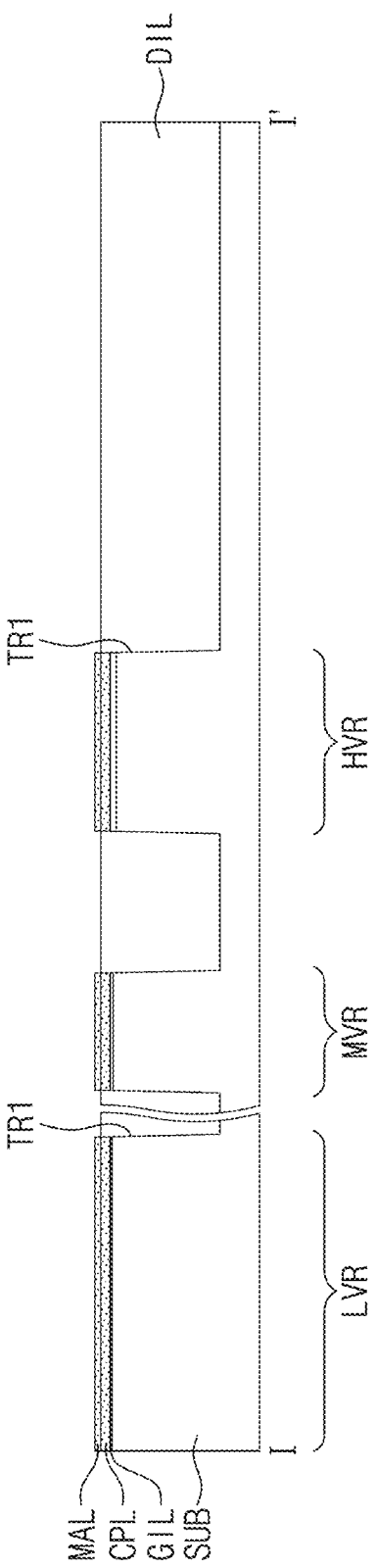
Figure 12B:
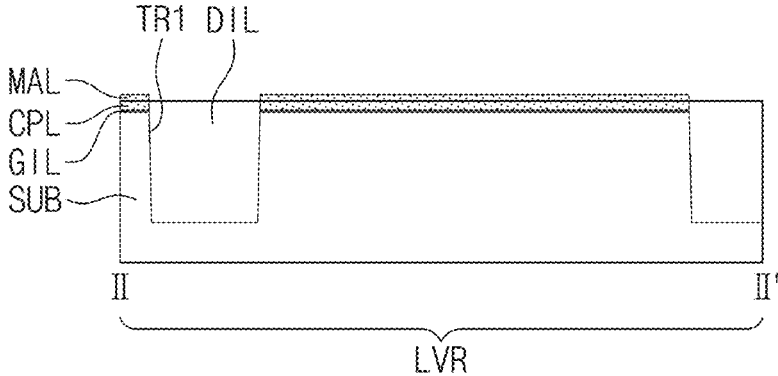
Figure 12B:
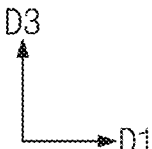

Referring to FIGS. 5, 12A, and 12B, a planarization process may be performed on the first substrate SUB1 to expose the mask layer MAL. During the planarization process, the mask layer MAL may serve as a stopping layer. The insulating layer ISL may be recessed by the planarization process, and as a result, the device isolation layers DIL may be formed to fill the first trenches TR1.

Since, when compared with other layers, the insulating layer ISL is more easily removed during the planarization process, the device isolation layer DIL may be formed to more-deeply recessed than other layers. For example, as shown in FIGS. 12A and 12B, the top surface of the device isolation layer DIL may be lower than a top surface of the mask layer MAL.

As a comparative example, if the mask layer MAL is omitted, the planarization process may be performed to expose the conductive layer CPL. In this case, the top surface of the device isolation layer DIL may be recessed at a level lower than a top surface of the conductive layer CPL. Furthermore, a surface of the conductive layer CPL exposed by the planarization process may be damaged, and dopants in the conductive layer CPL may also be contaminated.

According to at least one example embodiment of the inventive concepts, during the planarization process, the mask layer MAL may be used to protect the conductive layer CPL and to prevent the device isolation layer DIL from being excessively recessed. In detail, since the mask layer MAL serves as the stopping layer in the planarization process, the top surface of the device isolation layer DIL may be located at a level that is at least higher than or equal to the top surface of the conductive layer CPL. In addition, since the conductive layer CPL is not exposed during the planarization process, it may be possible to prevent a process defect (e.g., damage of the conductive layer CPL).

Figure 13A:
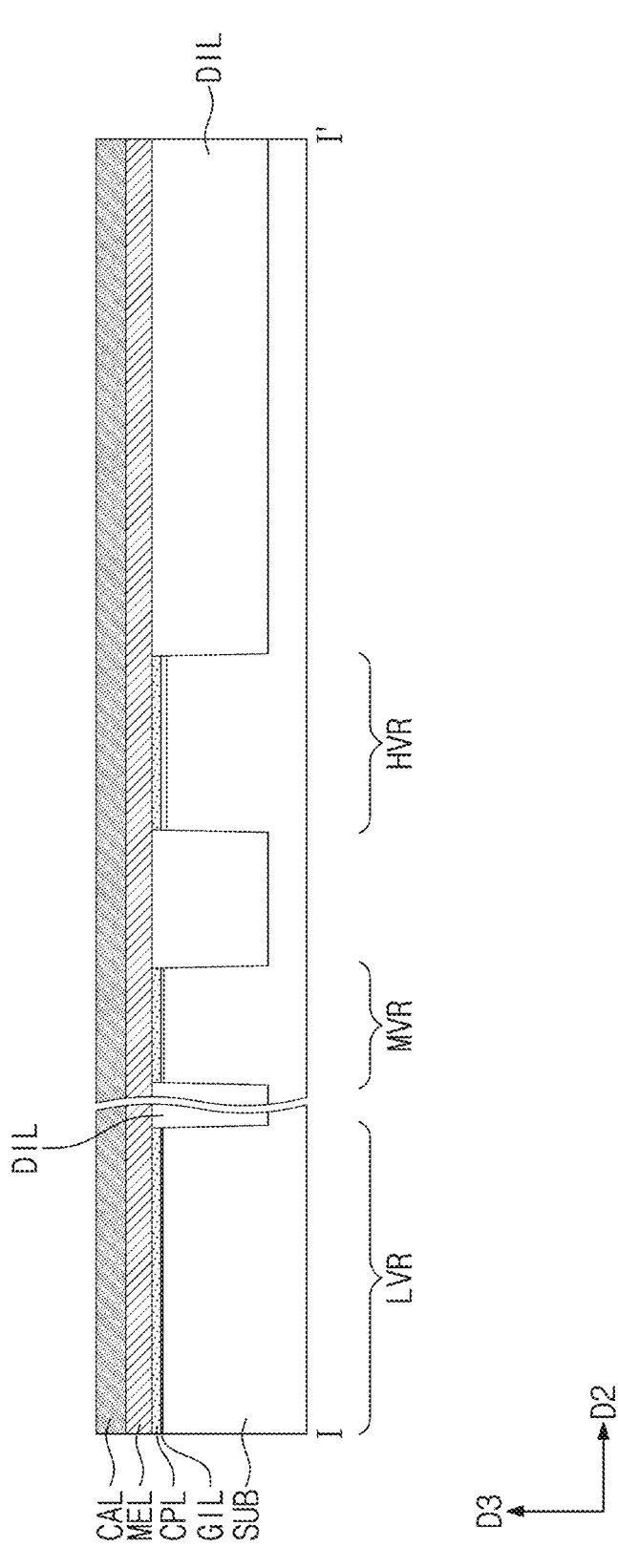
Figure 13B:
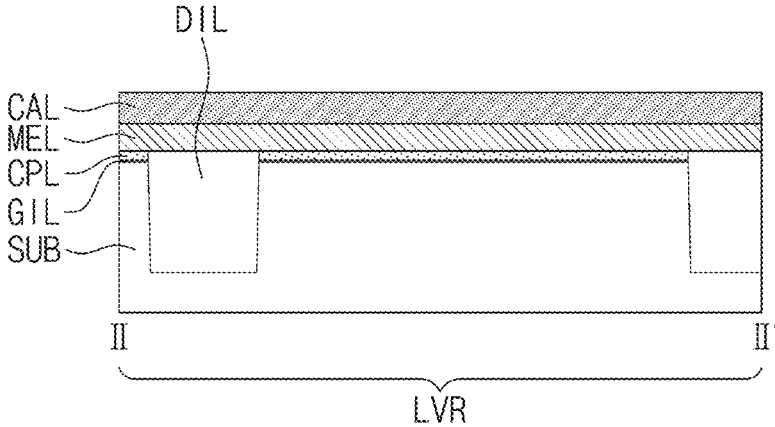
Figure 13B:
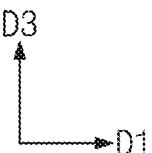

Referring to FIGS. 5, 13A, and 13B, the exposed mask layer MAL may be selectively removed. Thereafter, a metal layer MEL and a capping layer CAL may be sequentially formed on the first substrate SUB1.

Although not shown, the formation of the metal layer MEL may include forming a barrier layer on the conductive layer CPL and forming a gate metal layer on the barrier layer (e.g., see FIGS. 7A to 7C). The barrier layer may be formed of or include at least one of titanium nitride (TiN), tantalum nitride (TaN), titanium oxynitride (TiON), titanium silicon nitride (TiSiN), titanium aluminum nitride (TiAlN), tungsten carbon nitride (WCN), and/or molybdenum nitride (MoN). The gate metal layer may be formed of or include at least one of metallic materials (e.g., titanium, tantalum, tungsten, copper, and aluminum). The metal layer MEL may be formed to have a thickness ranging from 30 nm to 50 nm.

The capping layer CAL may include a silicon nitride layer. The capping layer CAL may be formed to have a thickness that ranges from 80 nm to 120 nm.

Figure 14A:
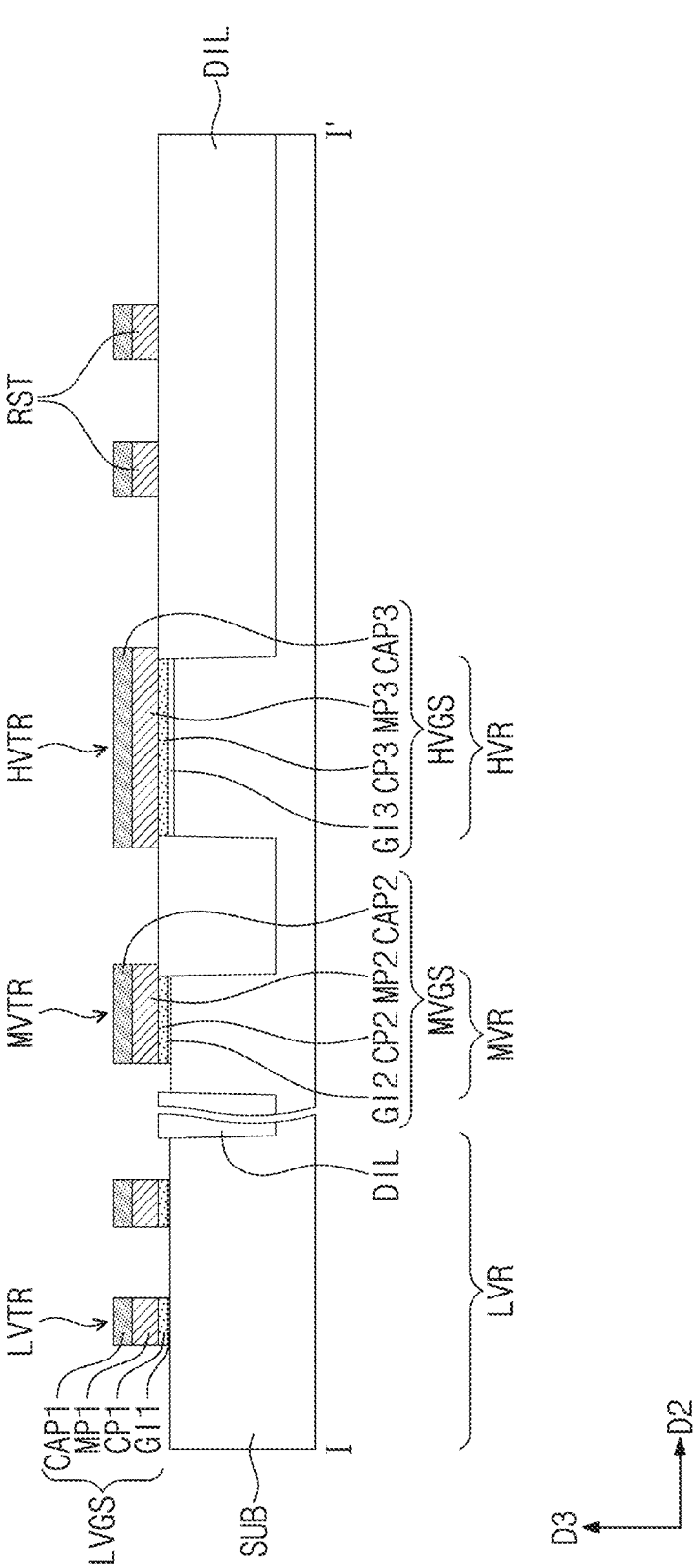
Figure 14B:
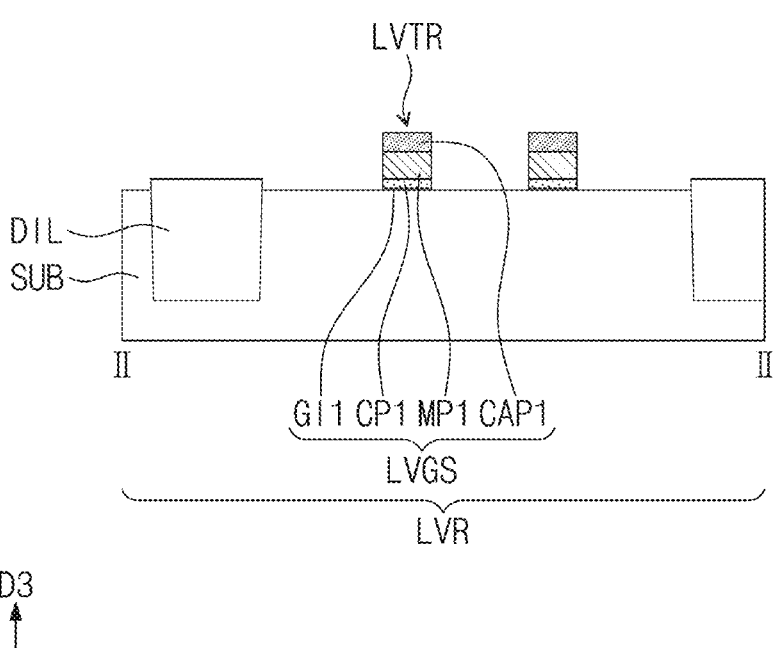

Referring to FIGS. 5, 14A, and 14B, the first to third gate structures LVGS, MVGS, and HVGS may be formed by sequentially patterning the capping layer CAL, the metal layer MEL, the conductive layer CPL, and the gate insulating layer GIL. The first to third gate structures LVGS, MVGS, and HVGS may be formed on the first to third active regions LVR, MVR, and HVR, respectively. The resistor structures RST may be formed by patterning the capping layer CAL and the metal layer MEL on the device isolation layer DIL.

The first gate structure LVGS may include the first gate insulating pattern GI1, the first conductive pattern CP1, the first metal pattern MP1, and the first capping pattern CAP1, which are sequentially stacked on the first active region LVR. The first gate structure LVGS may have a relatively small width.

The second gate structure MVGS may include the second gate insulating pattern GI2, the second conductive pattern CP2, the second metal pattern MP2, and the second capping pattern CAP2, which are sequentially stacked on the second active region MVR. The second gate structure MVGS may be formed to have a width larger than the first gate structure LVGS. The side portion SDP of the second metal pattern MP2 of the second gate structure MVGS may be formed on the device isolation layer DIL (e.g., see FIG. 7B).

The third gate structure HVGS may include the third gate insulating pattern GI3, the third conductive pattern CP3, the third metal pattern MP3, and the third capping pattern CAP3, which are sequentially stacked on the third active region HVR. The third gate structure HVGS may be formed to have a width larger than the second gate structure MVGS. The first and second side portions SDP1 and SDP2 of the third metal pattern MP3 of the third gate structure HVGS may be formed on the device isolation layer DIL (e.g., see FIG. 7C).

Figure 15A:
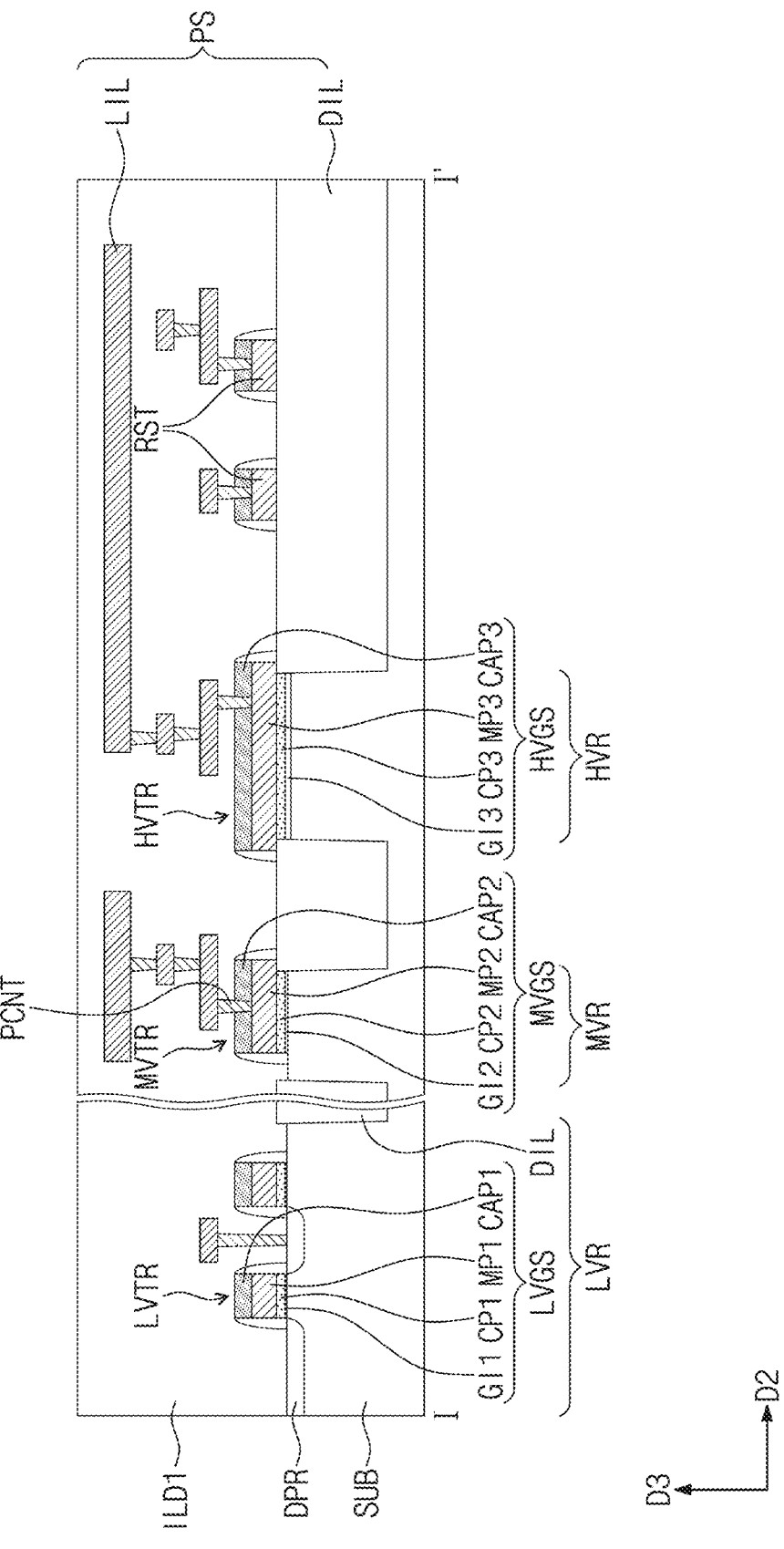
Figure 15B:
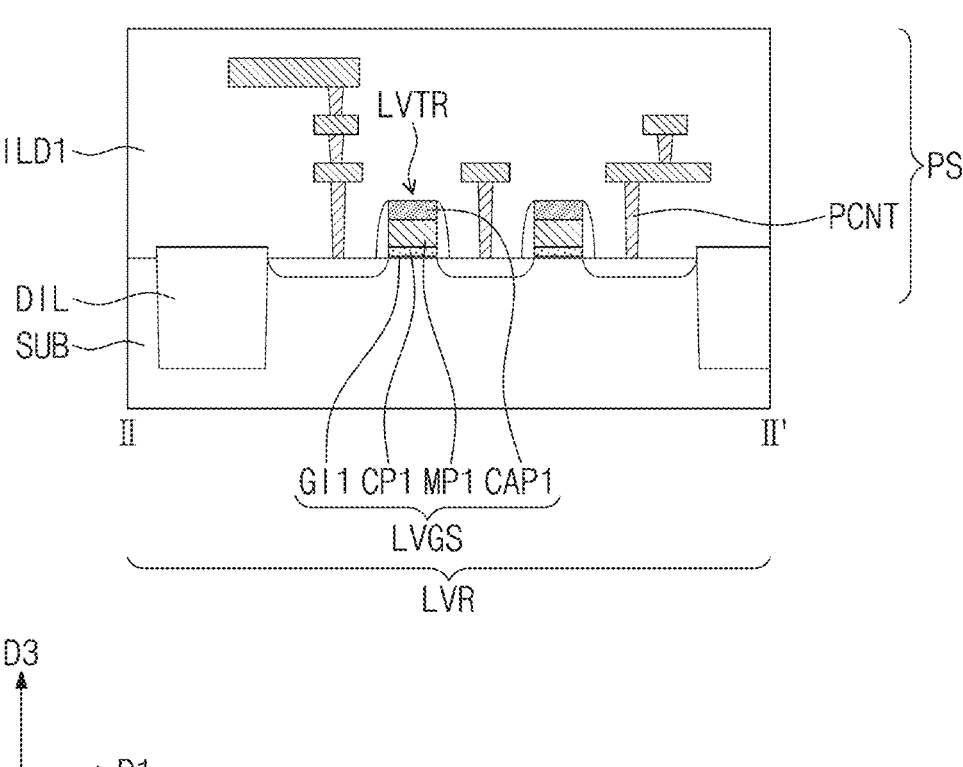

Referring to FIGS. 5, 15A, and 15B, the gate spacers may be formed on opposite side surfaces of each of the first to third gate structures LVGS, MVGS, and HVGS. An ion implantation process may be performed on the first substrate SUB1 to form the impurity regions DPR in the first to third active regions LVR, MVR, and HVR.

The lower interconnection lines LIL may be formed on the first to third gate structures LVGS, MVGS, and HVGS. The first interlayer insulating layer ILD1 may be formed to cover the first to third gate structures LVGS, MVGS, and HVGS and the lower interconnection lines LIL. Accordingly, the lower level layer PS may be formed on the first substrate SUB, and the lower level layer PS may include the peripheral transistors LVTR, MVTR, and HVTR constituting a peripheral circuit.

Figure 16A:
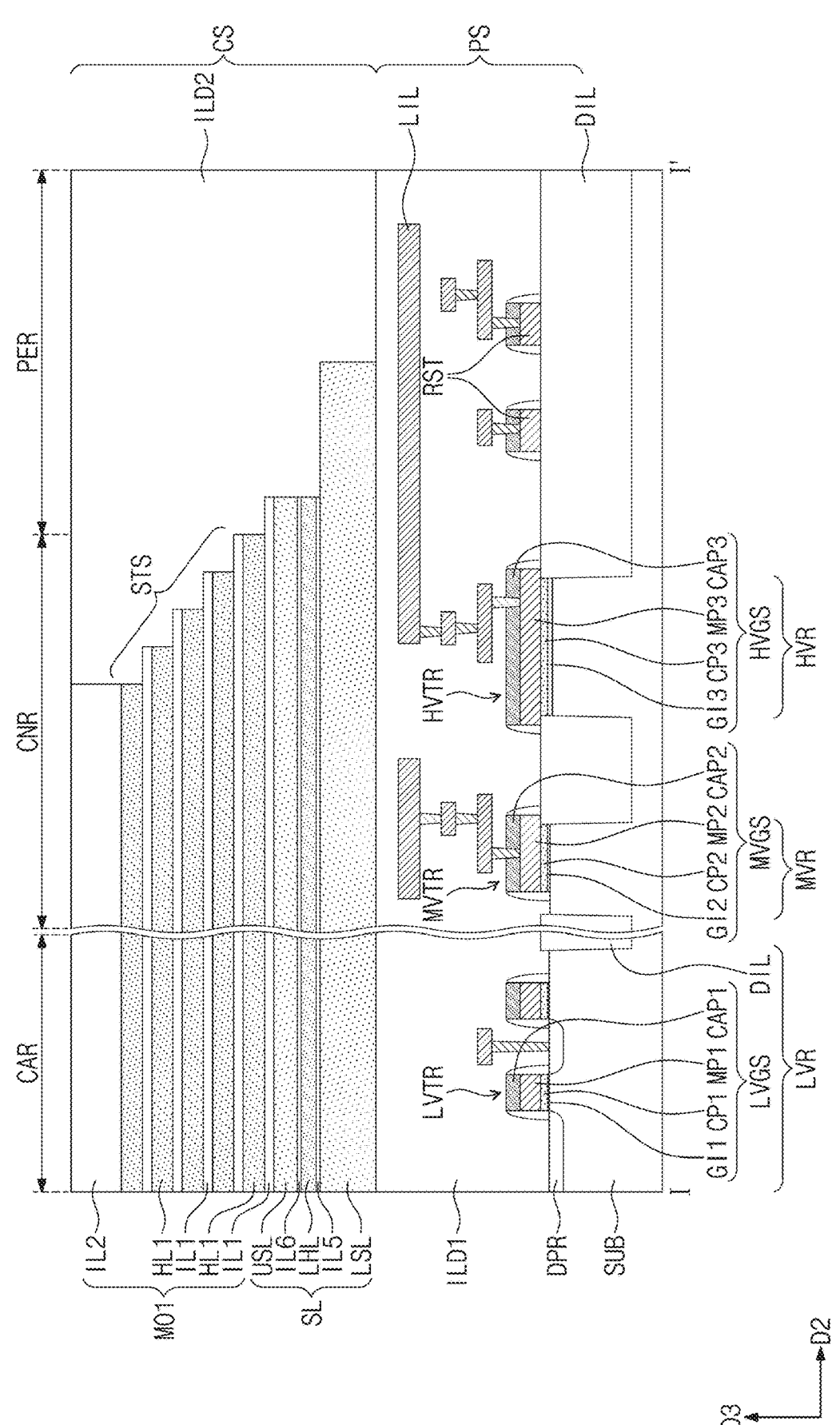
Figure 16B:
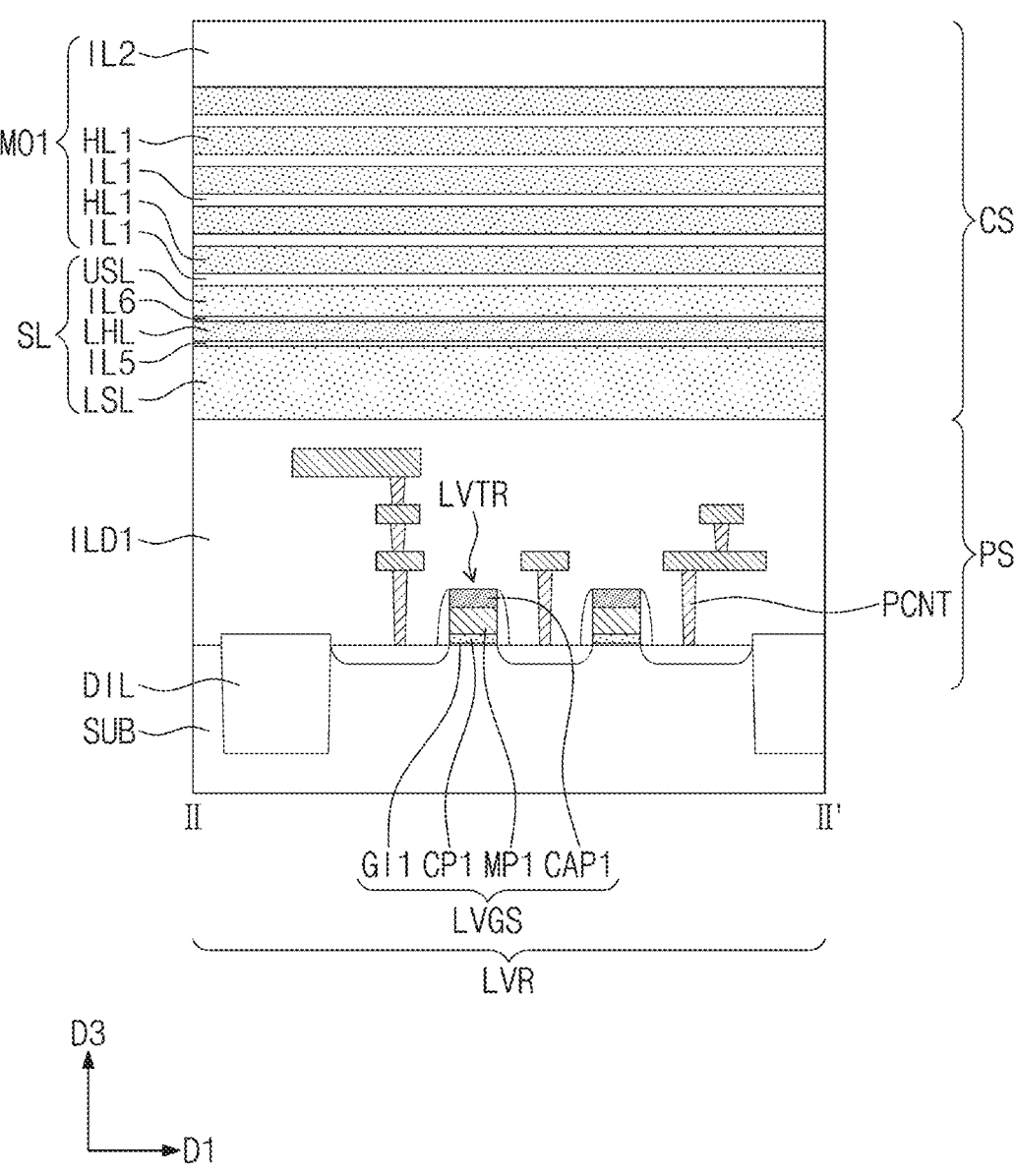

Referring to FIGS. 5, 16A, and 16B, the upper level layer CS including the cell array region CAR, the cell contact region CNR, and the peripheral region PER may be formed on the first interlayer insulating layer ILD1. In detail, the second substrate SL may be formed on the first interlayer insulating layer ILD1. The formation of the second substrate SL may include sequentially forming the lower semiconductor layer LSL, the fifth insulating layer IL5, the lower sacrificial layer LHL, the sixth insulating layer IL6, and the upper semiconductor layer USL. For example, the lower semiconductor layer LSL and the upper semiconductor layer USL may be formed of or include a semiconductor material (e.g., polysilicon). Each of the fifth and sixth insulating layers IL5 and IL6 may include a silicon oxide layer, and the lower sacrificial layer LHL may include a silicon nitride layer or a silicon oxynitride layer.

A first mold structure MO1 may be formed on the second substrate SL. In detail, the first mold structure MO1 may be formed by alternately stacking the first insulating layers IL1 and first sacrificial layers HL1 on the upper semiconductor layer USL. The second insulating layer IL2 may be formed as the uppermost layer of the first mold structure MO1.

The first insulating layers IL1, the first sacrificial layers HL1, and the second insulating layer IL2 may be deposited using a thermal chemical vapor deposition process, a plasma-enhanced chemical vapor deposition, a physical chemical vapor deposition process, and/or an atomic layer deposition (ALD) process. Each of the first and second insulating layers IL1 and IL2 may include a silicon oxide layer, and the first sacrificial layers HL1 may include a silicon nitride layer or a silicon oxynitride layer.

The staircase structure STS may be formed in the first mold structure MO1 on the cell contact region CNR. In detail, a cycle process may be performed on the first mold structure MO1 to form the staircase structure STS on the cell contact region CNR. The formation of the staircase structure STS may include forming a mask pattern (not shown) on the first mold structure MO1 and performing a cyclic patterning process using the mask pattern several times. The cyclic patterning process may include a step of etching a portion of the first mold structure MO1 using the mask pattern as an etch mask and a trimming step of reducing a size of the mask pattern.

The second interlayer insulating layer ILD2 may be formed on the first mold structure MO1. The formation of the second interlayer insulating layer ILD2 may include forming an insulating layer to cover the first mold structure MO1 and performing a planarization process on the insulating layer to expose the second insulating layer IL2.

Figure 17A:
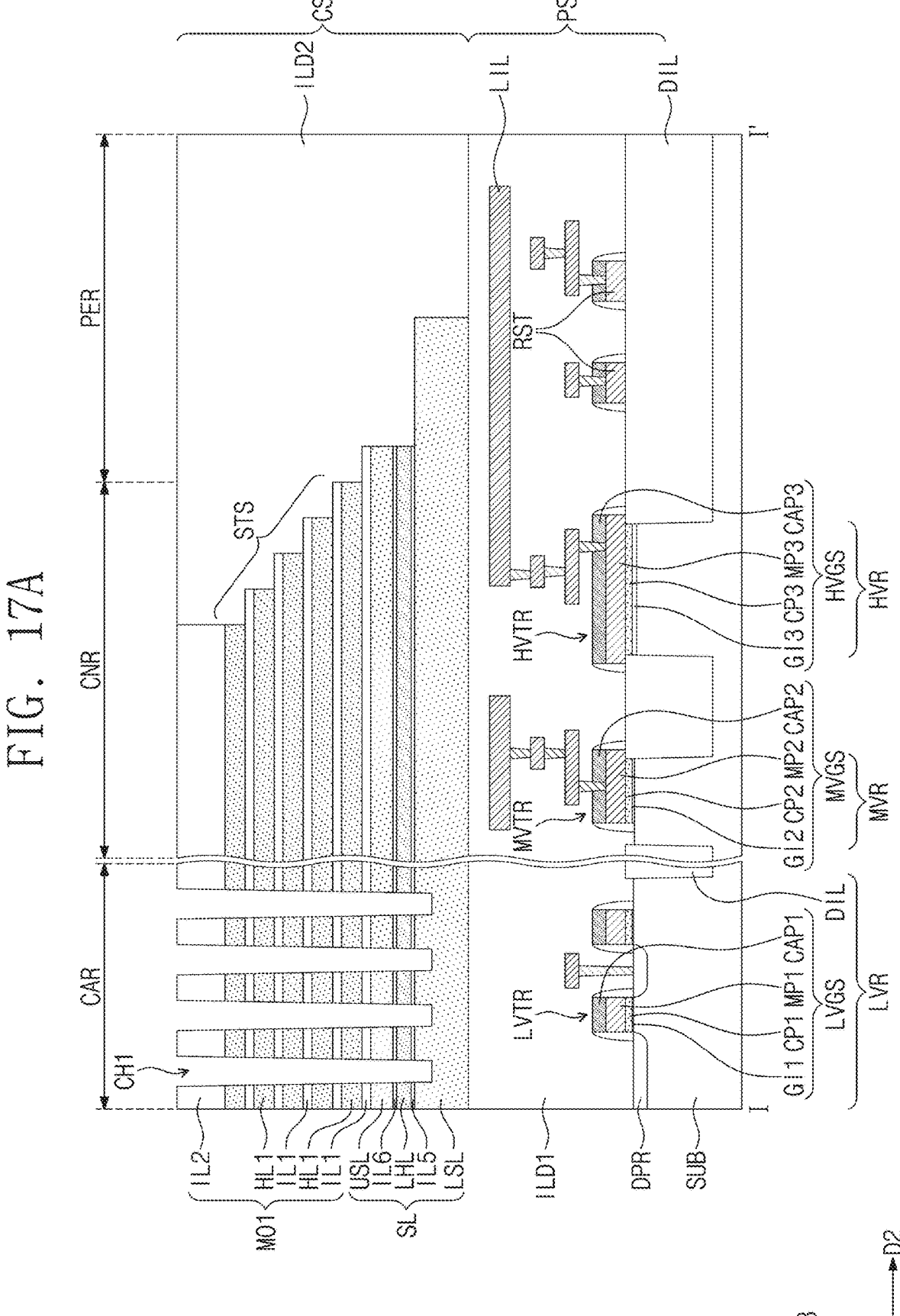
Figure 17B:
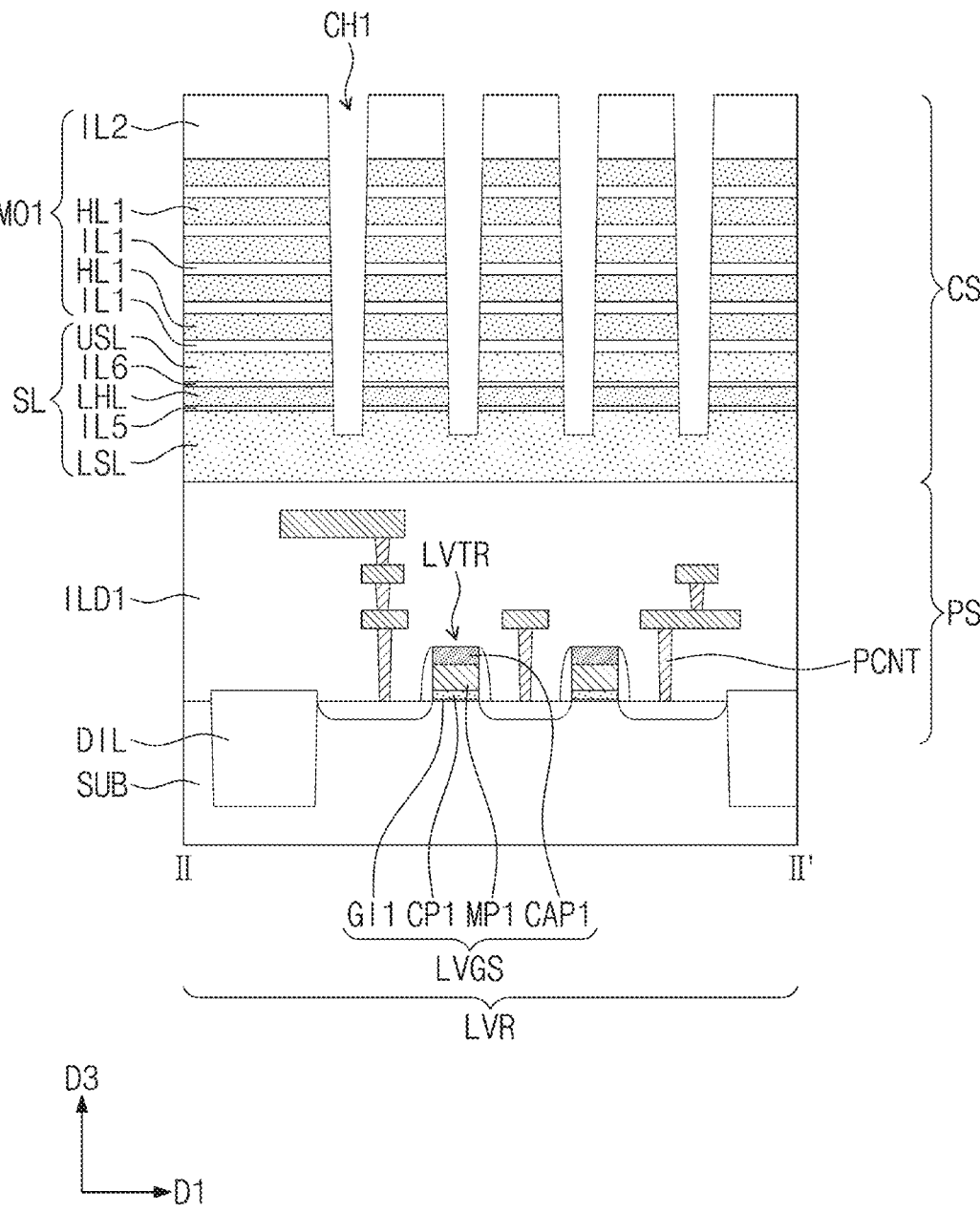

Referring to FIGS. 5, 17A, and 17B, first channel holes CH1 may be formed on the cell array region CAR to penetrate the first mold structure MO1. Each of the first channel holes CH1 may be formed to expose the lower semiconductor layer LSL.

In detail, the formation of the first channel holes CH1 may include forming a mask pattern (not shown), which has openings for the first channel holes CH1, on the first mold structure MO1 and anisotropically etching the first mold structure MO1 using the mask pattern as an etch mask. The anisotropic etching process may include a plasma etching process, a reactive ion etching (RIE) process, an inductively-coupled-plasma reactive-ion-etching (ICP-RIE) process, or an ion beam etching (IBE) process.

According to at least one example embodiment of the inventive concepts, a patterning process for forming the first channel holes CH1 may include a lithography process using extreme ultraviolet (EUV) light. In the present specification, the EUV light may have a wavelength ranging from 4 nm and 124 nm and, in particular, from 4 nm and 20 nm and may be, for example, an ultraviolet light having a wavelength of 13.5 nm. The EUV light may have an energy of 6.21 eV to 124 eV (in particular, 90 eV to 95 eV).

The EUV lithography process may include steps of exposing a photoresist layer to extreme ultraviolet (EUV) light and developing the exposed photoresist layer. As an example, the photoresist layer may be an organic photoresist layer containing an organic polymer (e.g., polyhydroxysty-rene). The organic photoresist layer may further include a photosensitive compound which can be reacted with the EUV light. The organic photoresist layer may further contain a material having high EUV absorptivity (e.g., organo-metallic materials, iodine-containing materials, and/or fluo-rine-containing materials). As another example, the photoresist layer may be an inorganic photoresist layer containing an inorganic material (e.g., tin oxide).

The photoresist layer may be formed to have a relatively small thickness. Photoresist patterns may be formed by developing the photoresist layer, which is exposed to the EUV light. When viewed in a plan view, the photoresist patterns may be formed to have a line shape extending in a specific direction, an island shape, a zigzag shape, a hon-eycomb shape, and/or a circular shape, but the at least some example embodiments of the inventive concepts are not limited to these examples.

Mask patterns may be formed by patterning at least one layer, which is disposed below the photoresist patterns, using the photoresist patterns as an etch mask. Desired patterns may be formed on a wafer by patterning a target layer using the mask patterns as an etch mask.

In the comparative example, a multi-patterning technol-ogy (MPT) using two or more photomasks is required to form fine-pitch patterns on the wafer. By contrast, in the case where the EUV lithography process according to at least one example embodiment of the inventive concepts is per-formed, it may be possible to form the first channel holes CH1 with a fine pitch by using just one photomask.

For example, in the case where the first channel holes CH1 are formed by the EUV lithography process according to the present embodiment, the minimum pitch between the first channel holes CH1 may be less than 45 nm. In other words, by using the EUV lithography process, it may be possible to precisely and finely form the first channel holes CH1, without a multi-patterning technology.

Figure 18A:
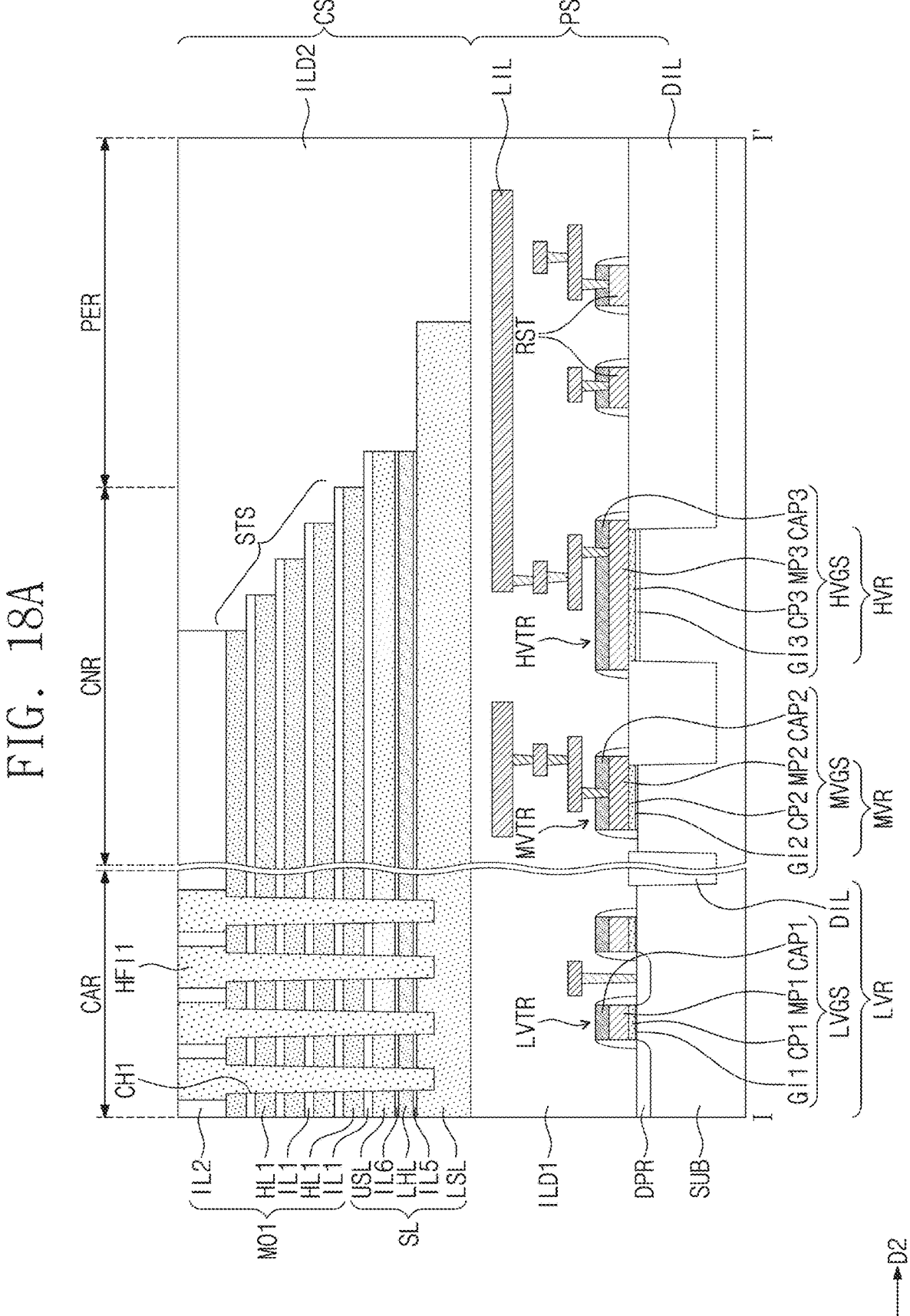
Figure 18B:
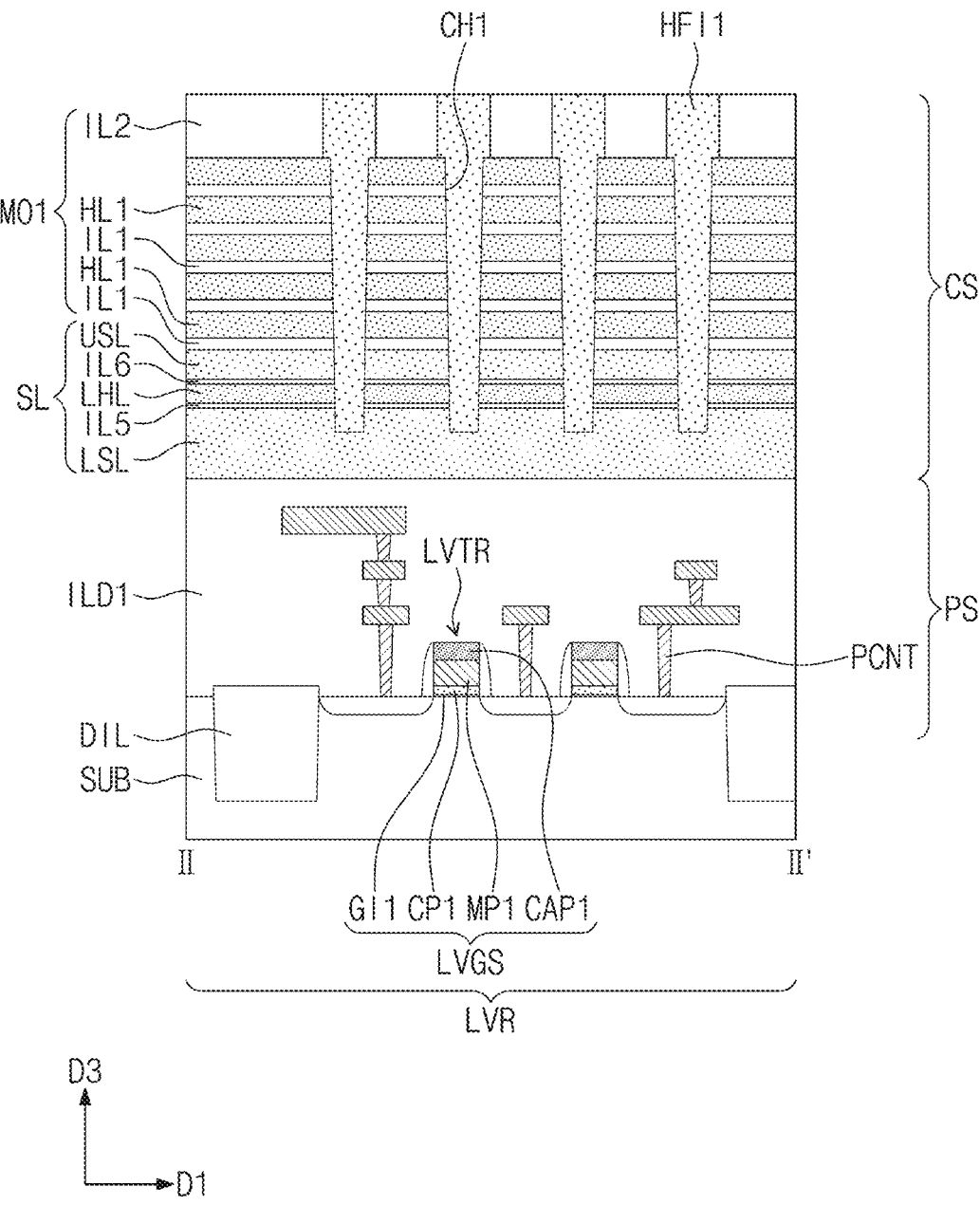

Referring to FIGS. 5, 18A, and 18B, an upper portion of each of the first channel holes CH1 may be expanded. Accordingly, a diameter of the first channel hole CH1 in the second insulating layer IL2 may be abruptly increased.

First sacrificial pillars HFI1 may be formed to fill the first channel holes CH1, respectively. In detail, the formation of the first sacrificial pillars HFI1 may include forming a first sacrificial mask layer to fill the first channel holes CH1 and planarizing the first sacrificial mask layer to expose a top surface of the second insulating layer IL2. For example, the first sacrificial mask layer may be formed of or include polysilicon.

Figure 19A:
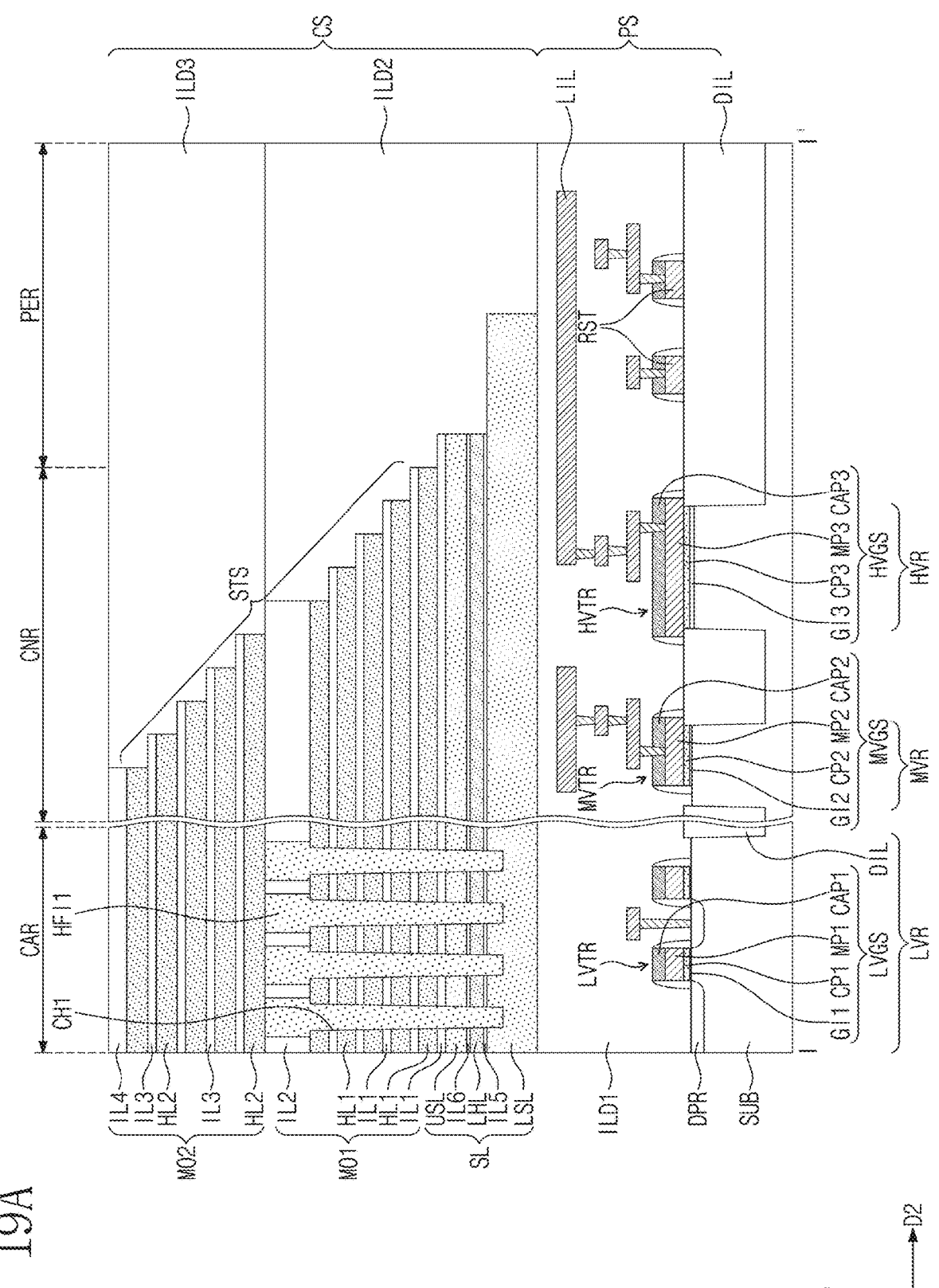
Figure 19B:
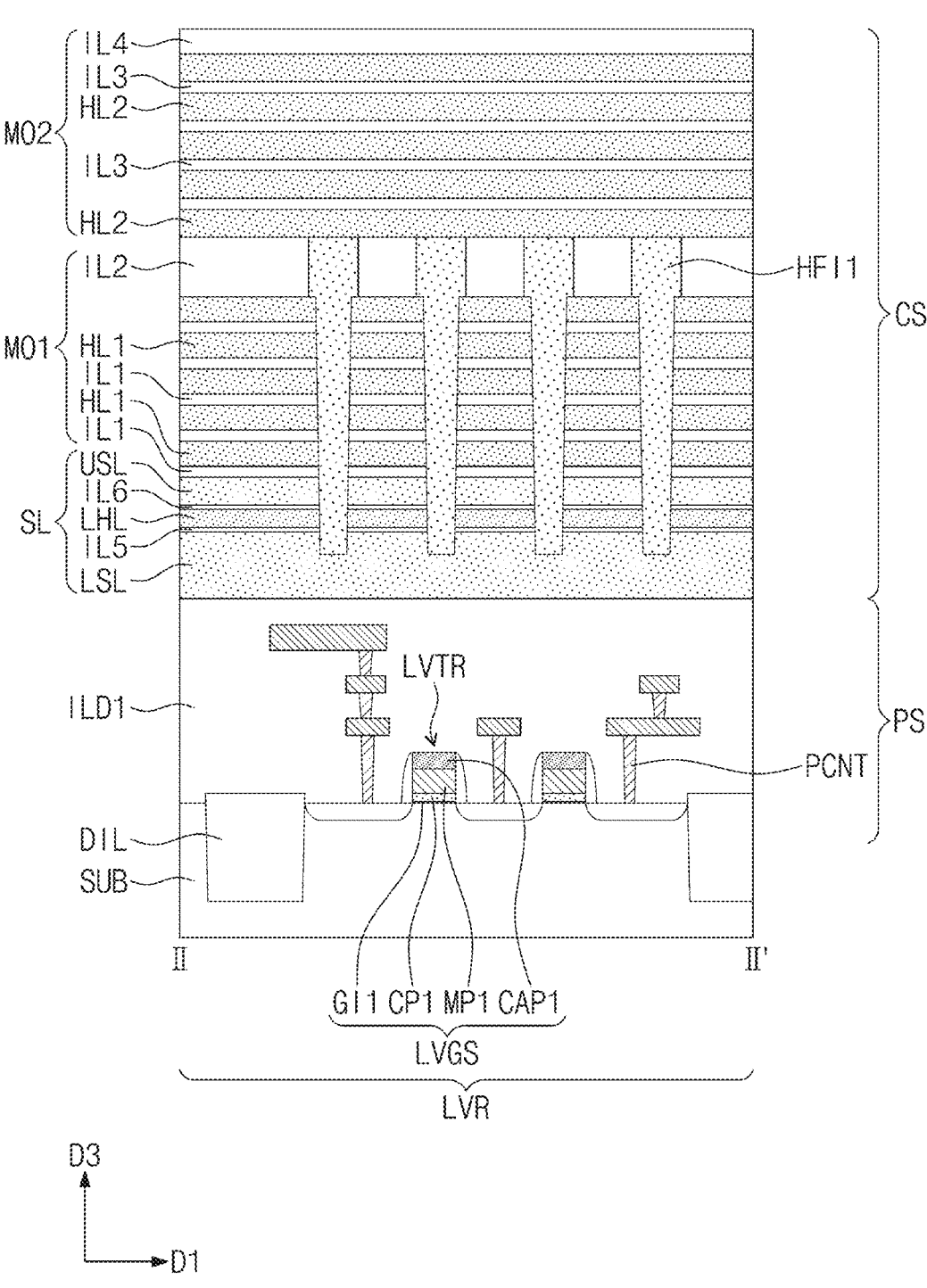

Referring to FIGS. 5, 19A, and 19B, a second mold structure MO2 may be formed on the first mold structure MO1 of the cell array region CAR. The formation of the second mold structure MO2 may include alternately stack-ing the third insulating layers IL3 and second sacrificial layers HL2 on the first mold structure MO1 and performing a cyclic process on a stack, which is composed of the third insulating layers IL3 and the second sacrificial layers HL2, to form the staircase structure STS. The cyclic process may be performed in the same manner as the process for forming the staircase structure STS of the first mold structure MO1 described above.

The second mold structure MO2 may have the staircase structure STS. The staircase structure STS of the second mold structure MO2 may be connected to the staircase structure STS of the first mold structure MO1.

The fourth insulating layer IL4 may be formed as the uppermost layer of the second mold structure MO2. Each of the third and fourth insulating layers IL3 and IL4 may include a silicon oxide layer, and the second sacrificial layers HL2 may include a silicon nitride layer or a silicon oxyni-tride layer. The second sacrificial layers HL2 may be formed of or include the same material as the first sacrificial layers HL1.

The third interlayer insulating layer ILD3 may be formed on the second mold structure MO2. The formation of the third interlayer insulating layer ILD3 may include forming an insulating layer to cover the second mold structure MO2 and performing a planarization process on the insulating layer to expose the fourth insulating layer IL4. The third interlayer insulating layer ILD3 may cover the staircase structure STS of the second mold structure MO2.

Figure 20A:
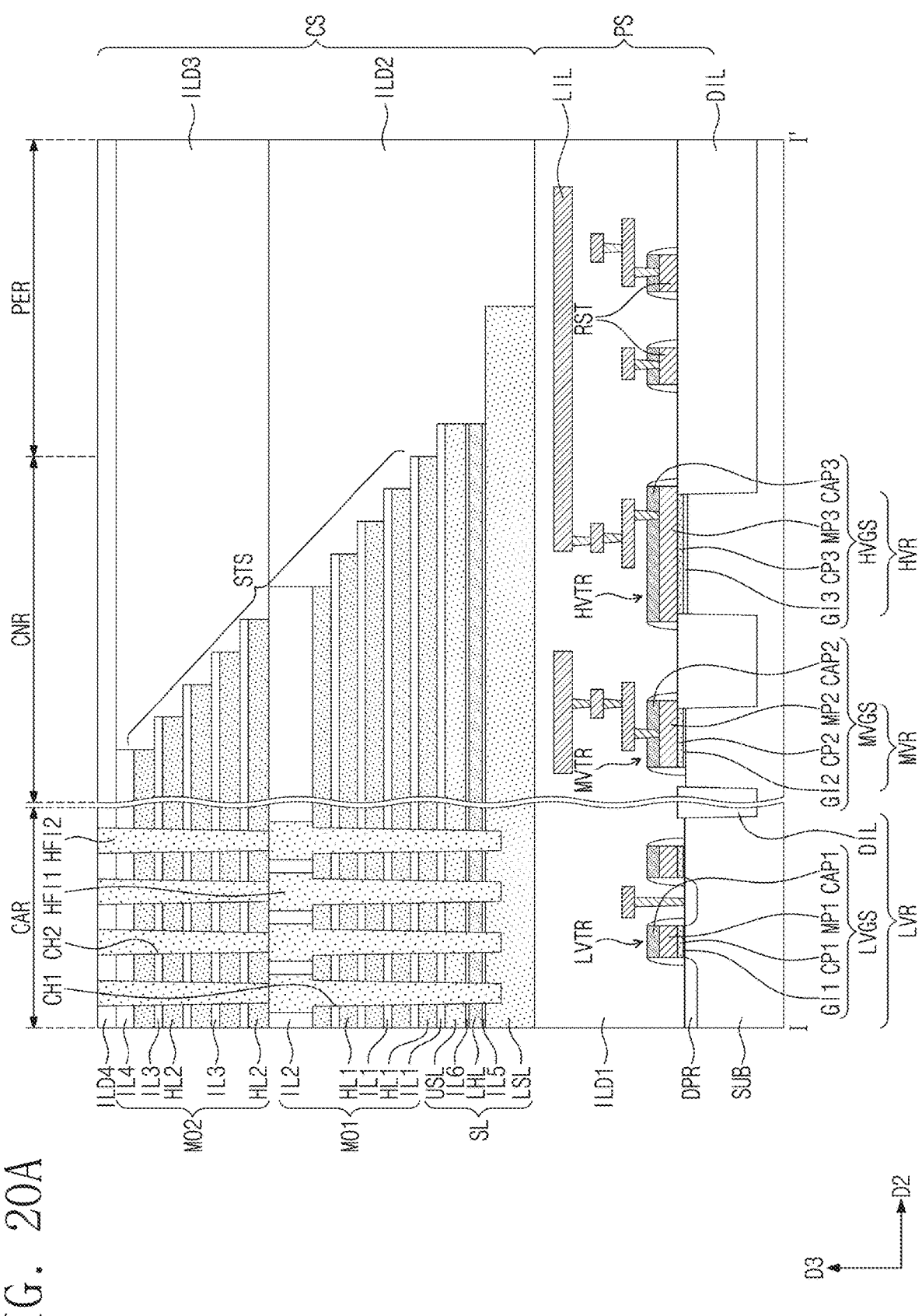
Figure 20B:
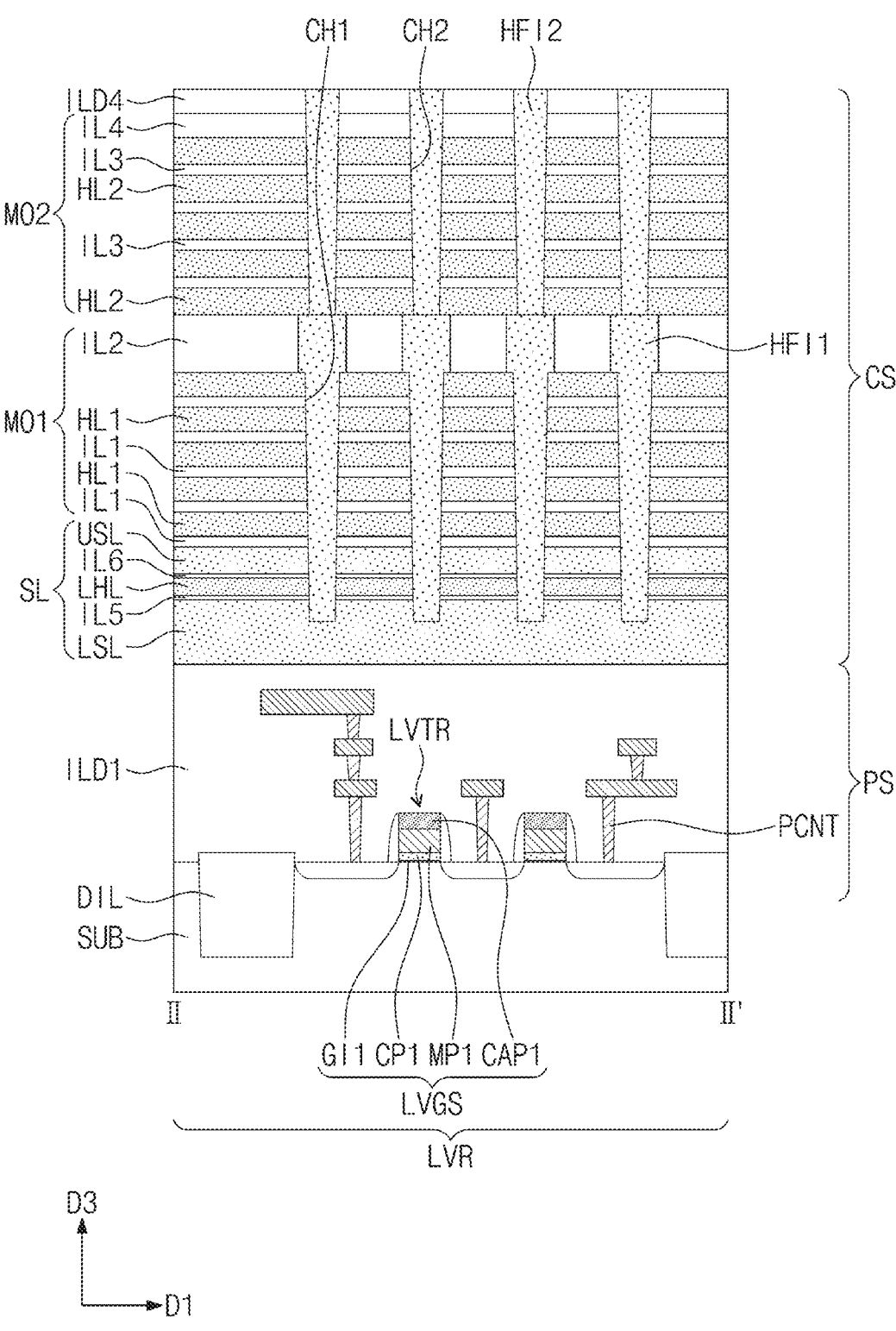

Referring to FIGS. 5, 20A, and 20B, the fourth interlayer insulating layer ILD4 may be formed on a top surface of the first substrate SUB. Second channel holes CH2 may be formed to penetrate the second mold structure MO2 of the cell array region CAR. The second channel holes CH2 may be formed to be vertically overlapped with the first sacrifi-cial pillars HFI1, respectively.

The second channel holes CH2 may be formed using a photolithography process. In detail, the formation of the second channel holes CH2 may include forming a photore-sist pattern (and a mask pattern thereunder), in which openings for the second channel holes CH2 are defined, using a photolithography process, and performing an aniso-tropic etching process using the photoresist pattern as an etch mask. Except for this, a process of forming the second channel holes CH2 may be performed in the same or substantially the same manner as that for forming the first channel holes CH1.

Second sacrificial pillars HFI2 may be formed to fill the second channel holes CH2, respectively. The second sacri-ficial pillars HFI2 may be vertically overlapped with the first sacrificial pillars HFI1, respectively. In detail, the formation of the second sacrificial pillars HFI2 may include forming a second sacrificial mask layer to fill the second channel holes CH2 and planarizing the second sacrificial mask layer to expose the top surface of the fourth interlayer insulating layer ILD4. For example, the second sacrificial mask layer may be formed of or include polysilicon. The second sacrificial pillars HFI2 may be formed of or include the same material as the first sacrificial pillars HFI1.

Figure 21A:
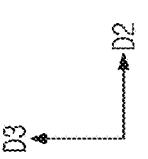
Figure 21B:
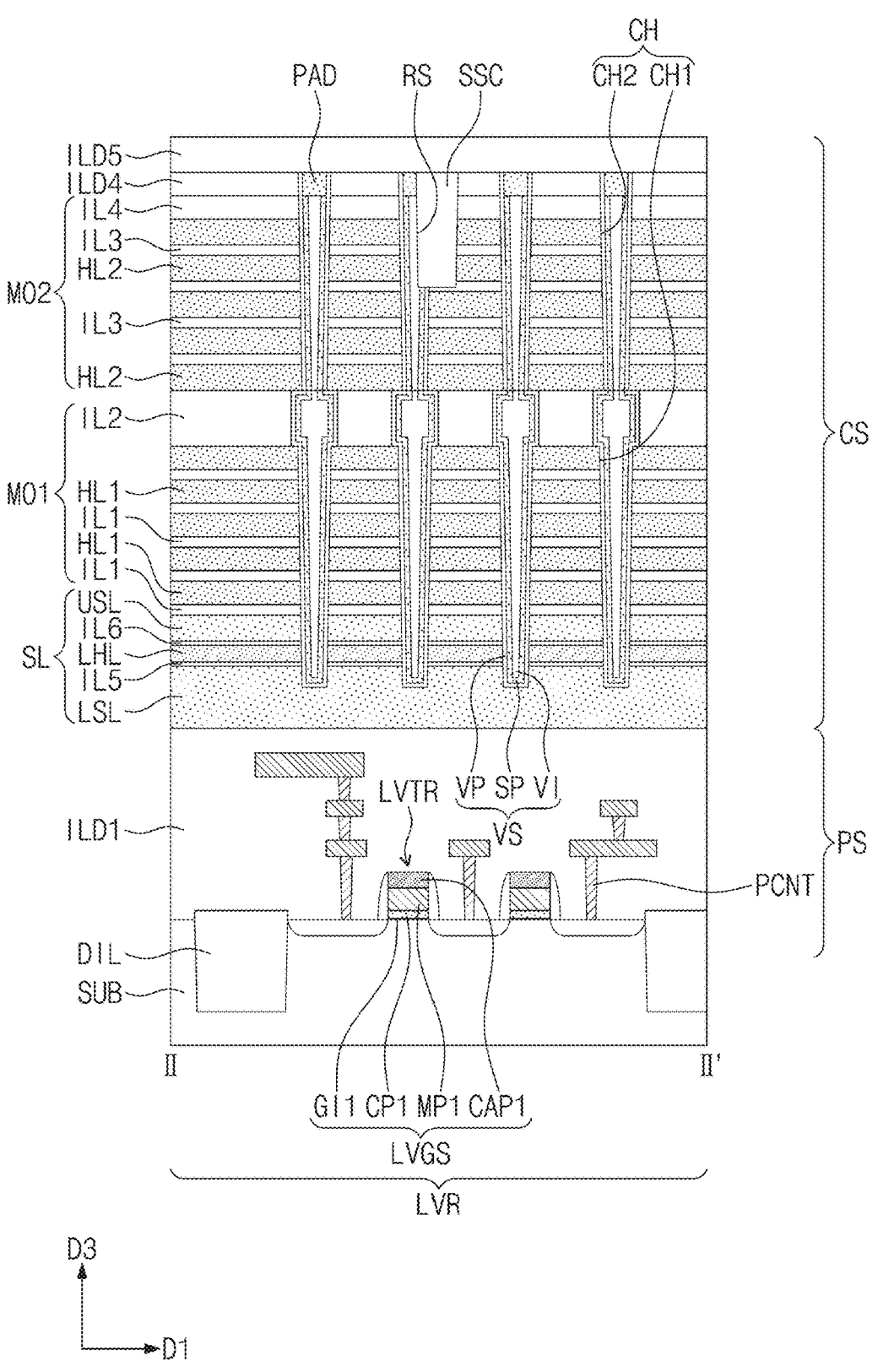

Referring to FIGS. 5, 21A, and 21B, the first and second sacrificial pillars HFI1 and HFI2 may be selectively removed from the first and second channel holes CH1 and CH2. Each pair of the first and second channel holes CH1 and CH2, from which the first and second sacrificial pillars HFI1 and HFI2 are removed, may be connected to each other to form a single channel hole CH.

The vertical channel structures VS may be formed in the channel holes CH, respectively. The formation of the vertical channel structure VS may include sequentially forming the vertical insulating pattern VP, the vertical semiconductor pattern SP, and the insulating gapfill pattern VI on an inner surface of the channel hole CH. The vertical insulating pattern VP and the vertical semiconductor pattern SP may be conformally formed. The conductive pad PAD may be formed in an upper portion of each of the vertical channel structures VS.

A recess RS defining the cutting structure SSC may be formed in an upper portion of the second mold structure MO2. The recess RS may be formed to penetrate two uppermost ones of the second sacrificial layers HL2 of the second mold structure MO2. The recess RS may be formed to partially penetrate an upper portion of the vertical channel structure VS overlapped therewith. The cutting structure SSC may be formed in the recess RS. The cutting structure SSC may include a silicon oxide layer.

The fifth interlayer insulating layer ILD5 may be formed on the fourth interlayer insulating layer ILD4 to cover the conductive pads PAD and the cutting structure SSC.

Figure 22A:
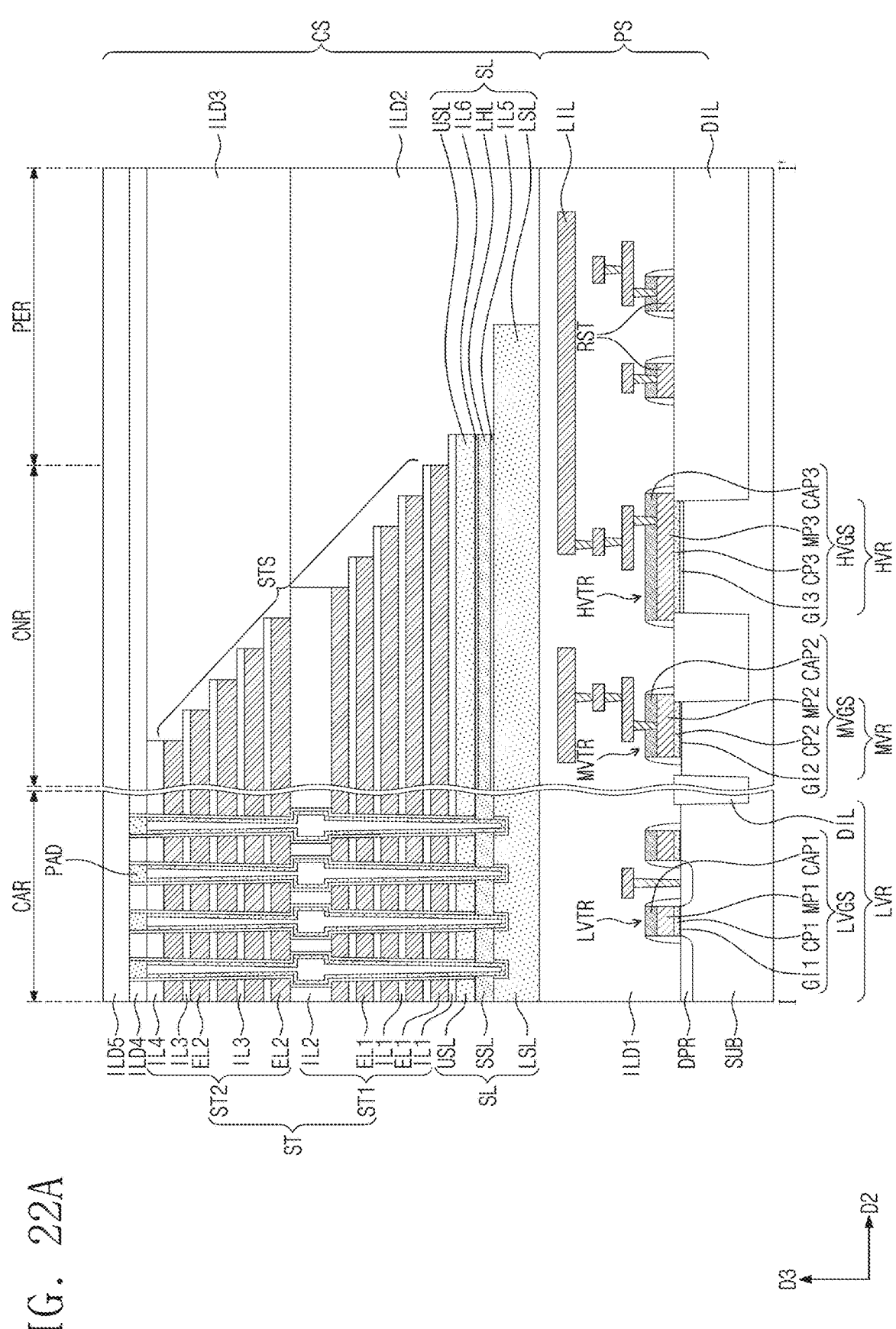
Figure 22B:
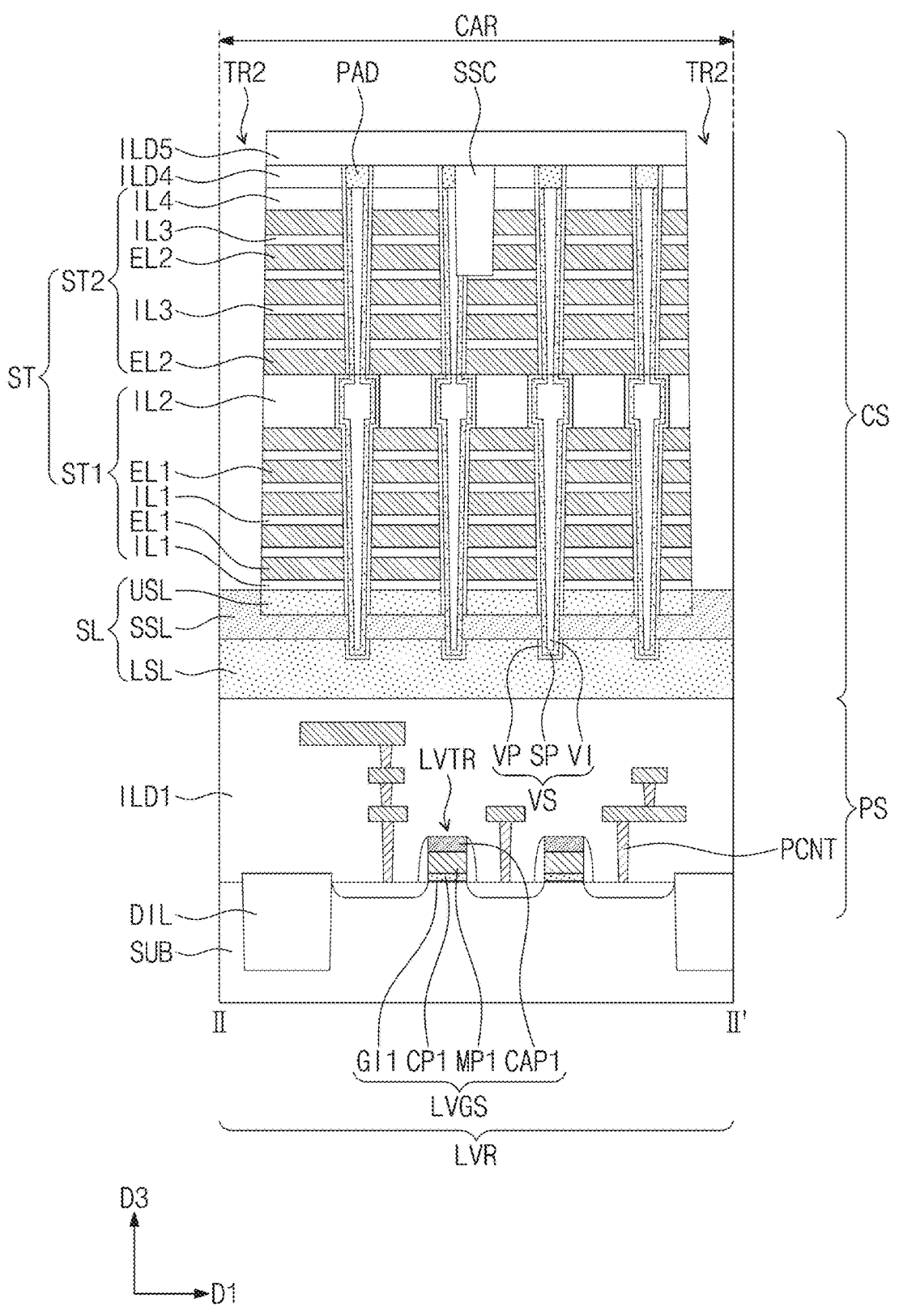

Referring to FIGS. 5, 22A, and 22B, the first and second mold structures MO1 and MO2 on the cell array region CAR may be patterned to form second trenches TR2 penetrating the first and second mold structures MO1 and MO2 on the cell array region CAR. The second trenches TR2 may define the separation structures SPS.

The second trench TR2 may be formed to expose the lower semiconductor layer LSL. The second trench TR2 may be formed to expose the side surfaces of the first and second sacrificial layers HL1 and HL2. The second trench TR2 may be formed to expose a side surface of the fifth insulating layer IL5, a side surface of the lower sacrificial layer LHL, and a side surface of the sixth insulating layer IL6.

In the cell array region CAR, the lower sacrificial layer LHL exposed by the second trenches TR2 may be replaced with the source semiconductor layer SSL. In detail, the lower sacrificial layer LHL exposed by the second trenches TR2 may be selectively removed. As a result of the removal of the lower sacrificial layer LHL, a lower portion of the vertical insulating pattern VP of each of the vertical channel structures VS may be exposed.

The exposed lower portion of the vertical insulating pattern VP may be selectively removed. Accordingly, a lower portion of the vertical semiconductor pattern SP may be exposed. The fifth insulating layer IL5 and the sixth insulating layer IL6 may be removed during removing the lower portion of the vertical insulating pattern VP.

The source semiconductor layer SSL may be formed in a space, from which the fifth insulating layer IL5, the lower sacrificial layer LHL, and the sixth insulating layer IL6 are removed. The source semiconductor layer SSL may be in direct contact with the exposed lower portion of the vertical semiconductor pattern SP. The source semiconductor layer SSL may be in direct contact with the lower semiconductor layer LSL therebelow. The source semiconductor layer SSL may be in direct contact with the upper semiconductor layer USL thereon. The lower semiconductor layer LSL, the source semiconductor layer SSL, and the upper semiconductor layer USL in the cell array region CAR may constitute the second substrate SL.

In the cell array region CAR, the cell array structure ST may be formed by replacing the first and second sacrificial layers HL1 and HL2, which are exposed by the second trenches TR2, with the first and second electrodes EL1 and EL2. In detail, the first and second sacrificial layers HL1 and HL2, which are exposed through the second trenches TR2, may be selectively removed. The first and second electrodes EL1 and EL2 may be respectively formed in empty spaces, which are formed by the removing of the first and second sacrificial layers HL1 and HL2.

Referring back to FIGS. 5, 6A, and 6B, the separation structures SPS may be formed to fill the second trenches TR2, respectively. The cell contact plugs CPLG may be formed to be connected to the staircase structure STS of the cell array structure ST. The source contact plug SPLG may be formed to be connected to the lower semiconductor layer LSL. The through via TVS may be formed to be connected to the lower interconnection line LIL of the lower level layer PS.

The bit line contact plugs BPLG may be formed to penetrate the fifth interlayer insulating layer ILD5 and to be coupled to the conductive pads PAD, respectively. At least one of the bit line contact plugs BPLG may be formed to be coupled to the conductive pad PAD in contact with the cutting structure SSC.

The bit lines BL, which are respectively connected to the bit line contact plugs BPLG, may be formed on the fifth interlayer insulating layer ILD5. The first upper interconnection lines UIL1, which are respectively connected to the cell contact plugs CPLG, may be formed on the fifth interlayer insulating layer ILD5. The second upper interconnection line UIL2 and the third upper interconnection line UIL3, which are respectively connected to the source contact plug SPLG and the through via TVS, may be formed on the fifth interlayer insulating layer ILD5.

Figure 23:
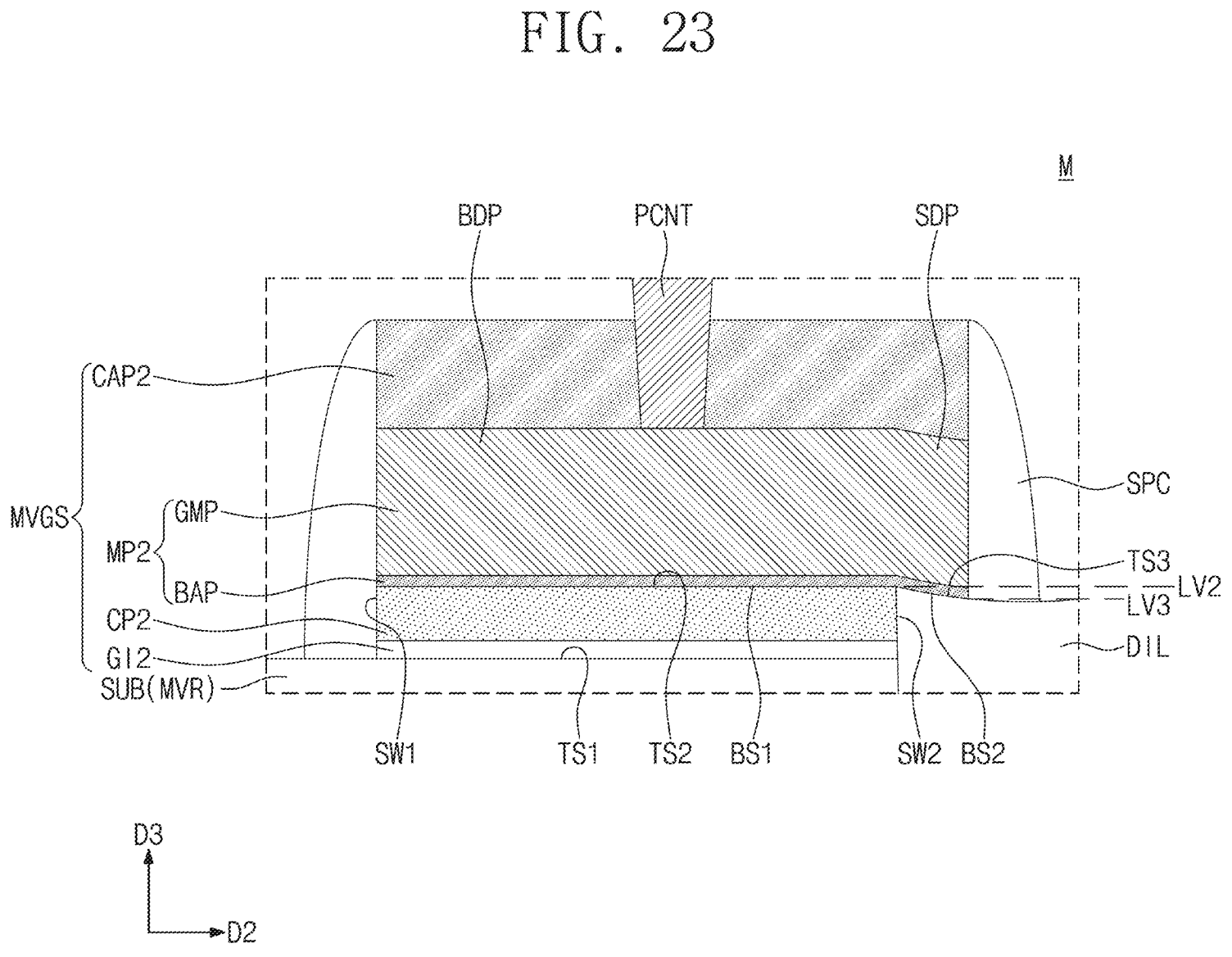
Figure 24:
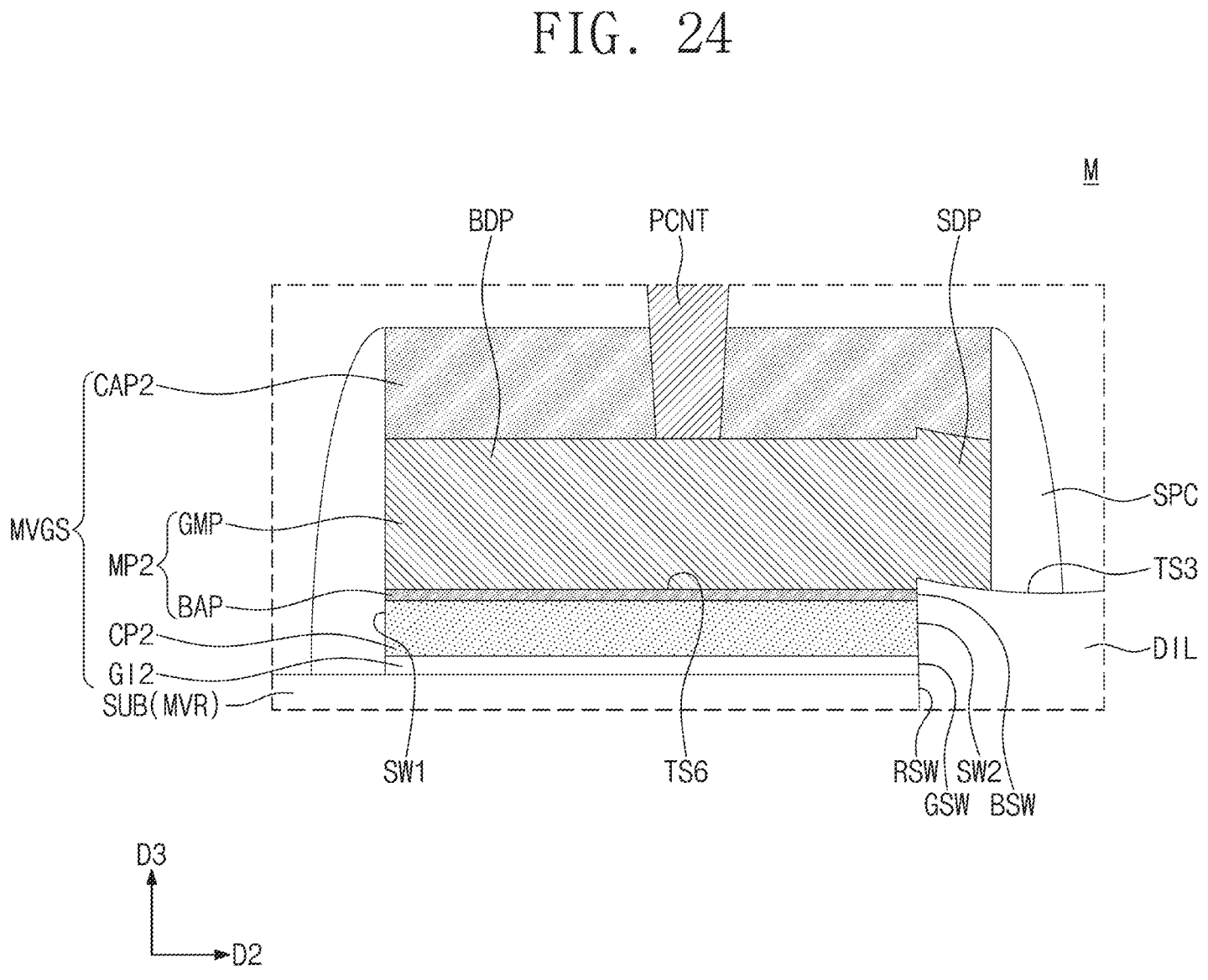
Figure 25:
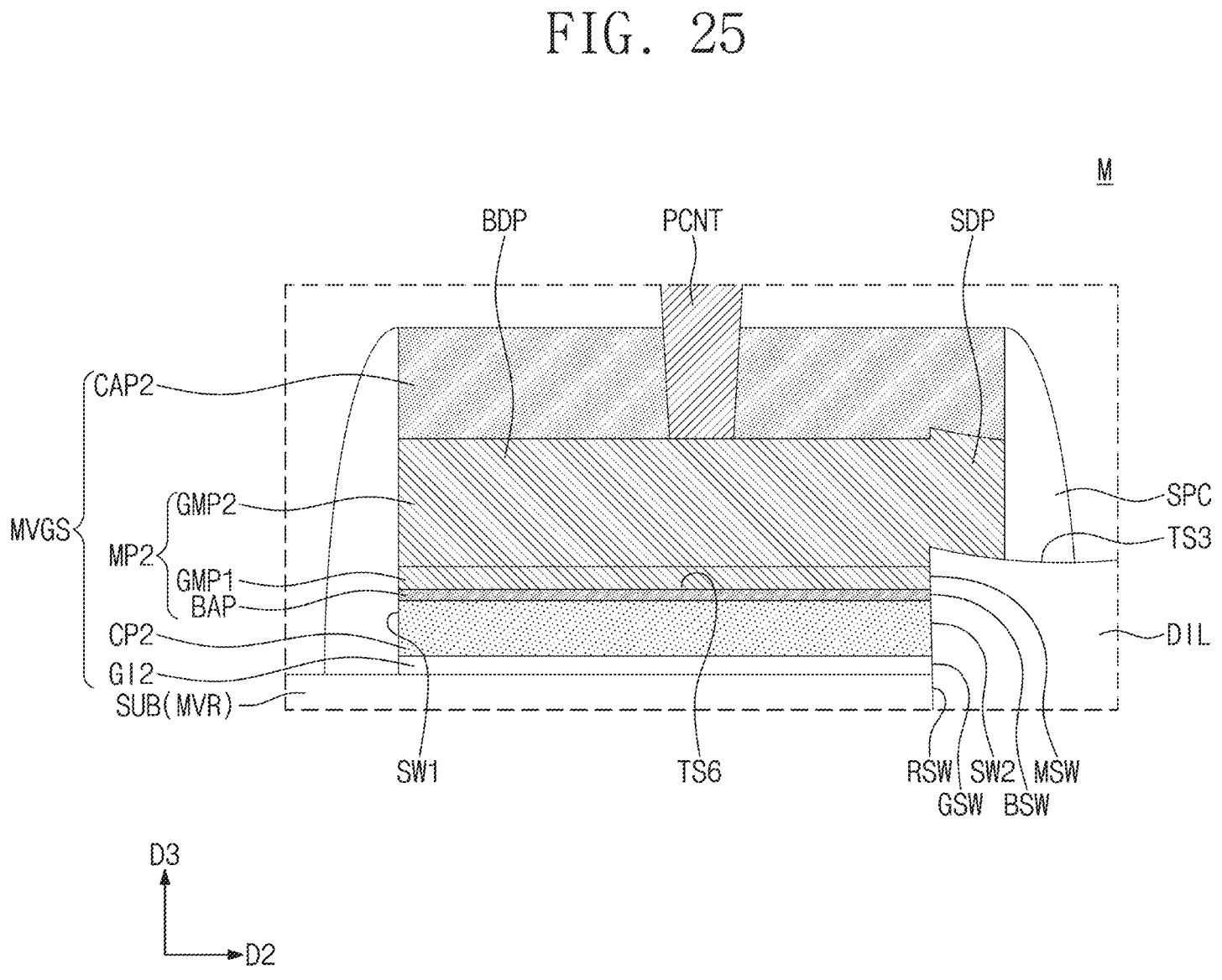

FIGS. 23 to 25 are enlarged cross-sectional views, each of which illustrates the portion 'M' of FIG. 6A and illustrates a semiconductor device according to at least one example embodiment of the inventive concepts. In the following description, an element previously described with reference to FIGS. 5, 6A, 6B, and 7A to 7C may be identified by the same reference number without repeating an overlapping description thereof.

Referring to FIG. 23, the highest point of the top surface TS3 of the device isolation layer DIL may be located at the same level (e.g., LV2) as the top surface TS2 of the second conductive pattern CP2. That is, the top surface TS3 of the device isolation layer DIL, except for the highest point of the top surface TS3, may be lower than the second level LV2.

The side portion SDP of the second metal pattern MP2 may be extended from a region on the body portion BDP to a region on the top surface TS3 of the device isolation layer DIL. In the present embodiment, there may be no height difference between the side and body portions SDP and BDP, unlike the structure shown in FIG. 7B. The bottom surface BS2 of the side portion SDP may be lower than the bottom surface BS1 of the body portion BDP. The lowest point of the bottom surface BS2 of the side portion SDP may be located at the third level LV3. The third level LV3 may be lower than the second level LV2.

According to the present embodiment, even when the lowest point of the bottom surface BS2 of the side portion SDP is lower than the top surface TS2 of the second conductive pattern CP2, the side portion SDP may be spaced apart from the second conductive pattern CP2 by the device isolation layer DIL.

Referring to FIG. 24, the top surface TS3 of the device isolation layer DIL may be higher than a top surface TS6 of the barrier pattern BAP of the second metal pattern MP2. Accordingly, a side surface BSW of the barrier pattern BAP may be covered with the device isolation layer DIL.

The side surface BSW of the barrier pattern BAP, the second side surface SW2 of the second conductive pattern CP2, the side surface GSW of the second gate insulating pattern GI2, and the side surface RSW of the second active region MVR may be aligned to each other by the device isolation layer DIL. The aligned side surfaces BSW, SW2, GSW, and RSW may be evenly connected to each other without a difference in height therebetween. The aligned side surfaces SW2, GSW, and RSW may have the same or substantially the same slope. The device isolation layer DIL may cover the aligned side surfaces SW2, GSW, and RSW.

The side portion SDP of the second metal pattern MP2 may be composed of the gate metal pattern GMP. That is, the gate metal pattern GMP of the side portion SDP may be in direct contact with the top surface TS3 of the device isolation layer DIL.

Referring to FIG. 25, the second metal pattern MP2 may include the barrier pattern BAP, a first gate metal pattern GMP1 on the barrier pattern BAP, and a second gate metal pattern GMP2 on the first gate metal pattern GMP1.

In an embodiment, the first and second gate metal patterns GMP1 and GMP2 may be formed of or include the same metallic material. In an embodiment, the first and second gate metal patterns GMP1 and GMP2 may be formed of or include different metallic materials from each other.

The top surface TS3 of the device isolation layer DIL may be higher than a top surface TS7 of the first gate metal pattern GMP1. Accordingly, a side surface MSW of the first gate metal pattern GMP1 and the side surface BSW of the barrier pattern BAP may be covered with the device isolation layer DIL.

The side portion SDP of the second metal pattern MP2 may be composed of the second gate metal pattern GMP2. That is, the second gate metal pattern GMP2 of the side portion SDP may be in direct contact with the top surface TS3 of the device isolation layer DIL.

An example of the second gate structure MVGS have been described with reference to FIGS. 23 to 25. The third gate structure HVGS may be configured to have the same or substantially the same features as the second gate structure MVGS described with reference to FIGS. 23 to 25.

According to at least one example embodiment of the inventive concepts, a conductive pattern (e.g., doped polysilicon) constituting a gate of a peripheral transistor may have a relatively small thickness. Accordingly, it may be possible to reduce a parasitic capacitance between the conductive pattern and a contact plug adjacent thereto and thereby to realize a peripheral transistor with improved electric characteristics.

According to at least one example embodiment of the inventive concepts, the conductive pattern may be protected by an upwardly-protruding portion of a device isolation layer. Accordingly, it may be possible to prevent a process defect (e.g., damage of the conductive pattern) from occurring during a process of forming a metal pattern on the conductive pattern. Accordingly, the reliability of the peripheral transistor may be improved.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A semiconductor device, comprising:
a lower level layer including a peripheral circuit; and
an upper level layer provided on the lower level layer, the upper level layer including a vertically-extended memory cell string,
wherein the lower level layer comprises:
a first substrate;
a device isolation layer defining a first active region of the first substrate; and
a first gate structure including a first gate insulating pattern, a first conductive pattern, a first metal pattern, and a first capping pattern, which are sequentially stacked on the first active region,
wherein the first conductive pattern includes a doped semiconductor material,
wherein the device isolation layer covers a first side surface of the first conductive pattern,
wherein the first metal pattern comprises:
a first body portion on the first conductive pattern; and
a first side portion on the device isolation layer covering the first side surface, and
wherein the first side portion is spaced apart from the first side surface of the first conductive pattern with the device isolation layer interposed therebetween.

2. The semiconductor device of claim 1, wherein a level of a highest point of a top surface of the device isolation layer is equal to or higher than a level of a top surface of the first conductive pattern.

3. The semiconductor device of claim 1, wherein a thickness of the first conductive pattern is smaller than a thickness of the first metal pattern.

4. The semiconductor device of claim 1,
wherein the first metal pattern comprises:
a barrier pattern; and
a gate metal pattern on the barrier pattern, and
wherein the barrier pattern of the first side portion is in direct contact with a top surface of the device isolation layer.

5. The semiconductor device of claim 1, wherein a level of a lowest point of a bottom surface of the first side portion is higher than a level of a bottom surface of the first body portion.

6. The semiconductor device of claim 1, wherein the first side surface of the first conductive pattern, a side surface of the first gate insulating pattern, and a side surface of the first active region are aligned to each other by the device isolation layer.

7. The semiconductor device of claim 1,
wherein the first body portion is vertically overlapped with the first conductive pattern, and
wherein the first side portion is vertically overlapped with the device isolation layer.

8. The semiconductor device of claim 1,
wherein the lower level layer further includes a second gate structure including a second gate insulating pattern, a second conductive pattern, a second metal pattern, and a second capping pattern, which are sequentially stacked on a second active region of the first substrate, wherein a thickness of the second gate insulating pattern is larger than a thickness of the first gate insulating pattern, wherein the second metal pattern comprises:

a body portion on the second conductive pattern; and a pair of second side portions respectively provided at both sides of the body portion, and wherein each of the pair of second side portions is vertically overlapped with the device isolation layer.

9. The semiconductor device of claim 1, wherein the upper level layer comprises:

a second substrate on the lower level layer;

a cell array structure including a plurality of electrodes, which are stacked on the second substrate and are spaced apart from each other;

a vertical channel structure provided to penetrate the cell array structure and connected to the second substrate; and a bit line provided on the cell array structure and connected to the vertical channel structure.

10. The semiconductor device of claim 9, wherein the vertical channel structure comprises:

a vertical semiconductor pattern connected to the second substrate; and a vertical insulating pattern between the plurality of electrodes and the vertical semiconductor pattern, and wherein the vertical insulating pattern comprises a charge storing layer.

11. A semiconductor device, comprising:

a lower level layer including a peripheral circuit; and an upper level layer provided on the lower level layer, the upper level layer including a three-dimensional NAND flash memory cell structure, wherein the lower level layer comprises:

a substrate including an active region;

a gate insulating pattern on the active region;

a semiconductor pattern on the gate insulating pattern;

a metal pattern on the semiconductor pattern; and a device isolation layer covering a first side surface of the semiconductor pattern, a second side surface of the gate insulating pattern, and a third side surface of the active region and aligning the first side surface, the second side surface, and the third side surface to each other, wherein a level of a highest point of a top surface of the device isolation layer is equal to or higher than a level of a top surface of the semiconductor pattern, and wherein the metal pattern includes a side portion which is provided on and vertically overlapped with the device isolation layer.

12. The semiconductor device of claim 11, wherein a thickness of the semiconductor pattern is smaller than a thickness of the metal pattern, and wherein the thickness of the semiconductor pattern ranges from 20 nm to 30 nm.

13. The semiconductor device of claim 11, wherein a level of a lowest point of a bottom surface of the side portion is lower than a level of the top surface of the semiconductor pattern.

14. The semiconductor device of claim 11, wherein the metal pattern includes a barrier pattern and a gate metal pattern on the barrier pattern, and wherein the level of the highest point of the top surface of the device isolation layer is equal to or higher than a level of a top surface of the barrier pattern.

15. The semiconductor device of claim 11, wherein the metal pattern includes a barrier pattern, a first gate metal pattern on the barrier pattern, and a second gate metal pattern on the first gate metal pattern, and wherein the level of the highest point of the top surface of the device isolation layer is equal to or higher than a level of a top surface of the first gate metal pattern.

16. An electronic system, comprising:

a semiconductor device including an input/output pad electrically connected to peripheral circuits; and a controller electrically connected to the semiconductor device through the input/output pad and configured to control the semiconductor device, wherein the semiconductor device comprises:

a lower level layer including the peripheral circuits; and an upper level layer provided on the lower level layer, the upper level layer including a three-dimensional NAND flash memory cell structure, wherein the lower level layer comprises:

a substrate;

a device isolation layer defining a first active region and a second active region of the substrate;

a first peripheral transistor and a second peripheral transistor provided on the first active region and the second active region, respectively; and interconnection lines provided on and electrically connected to the first peripheral transistor and the second peripheral transistor, wherein the first peripheral transistor includes a first gate insulating pattern, a first semiconductor pattern, and a first metal pattern, which are sequentially stacked on the first active region, wherein the second peripheral transistor includes a second gate insulating pattern, a second semiconductor pattern, and a second metal pattern, which are sequentially stacked on the second active region, wherein a thickness of the second gate insulating pattern is larger than a thickness of the first gate insulating pattern, wherein the first metal pattern is spaced apart from the device isolation layer, wherein the second metal pattern comprises a side portion that is in contact with a top surface of the device isolation layer, and wherein the side portion is spaced apart from the second semiconductor pattern with the device isolation layer interposed therebetween.

17. The electronic system of claim 16, wherein the lower level layer further includes a resistor structure on the device isolation layer, and the resistor structure is located at the same level as the second metal pattern and is in contact with the top surface of the device isolation layer.

18. The electronic system of claim 16, wherein the device isolation layer covers a side surface of the second semiconductor pattern.

19. The electronic system of claim 18, wherein a level of a highest point of the top surface of the device isolation layer is equal to or higher than a level of a top surface of the second semiconductor pattern.

20. The electronic system of claim 16, wherein a thickness of the first semiconductor pattern is smaller than a thickness of the first metal pattern, and wherein a thickness of the second semiconductor pattern is smaller than a thickness of the second metal pattern.

\* \* \* \* \*